US008735256B1

(12) United States Patent
Sugg

(10) Patent No.: US 8,735,256 B1
(45) Date of Patent: May 27, 2014

(54) CURRENT-CONFINED HETEROJUNCTION BIPOLAR TRANSISTOR

(75) Inventor: Alan Sugg, Naperville, IL (US)

(73) Assignee: Vega Wave Systems, Inc., West Chicago, IL (US)

(*) Notice: Subject to any disclaimer, the term of this patent is extended or adjusted under 35 U.S.C. 154(b) by 0 days.

(21) Appl. No.: 13/367,188

(22) Filed: Feb. 6, 2012

Related U.S. Application Data

(62) Division of application No. 12/344,481, filed on Dec. 27, 2008, now Pat. No. 8,120,147.

(60) Provisional application No. 61/017,114, filed on Dec. 27, 2007.

(51) Int. Cl.
*H01L 21/8222* (2006.01)
*H01L 29/737* (2006.01)

(52) U.S. Cl.
USPC ............................................ 438/317; 257/198

(58) Field of Classification Search
USPC ..................... 257/98, 198, 560; 438/317, 338
See application file for complete search history.

(56) References Cited

U.S. PATENT DOCUMENTS

| 5,726,462 | A  | * | 3/1998  | Spahn et al. ..................... 257/76  |
| 6,198,853 | B1 | * | 3/2001  | Yamada ............................ 385/2   |
| 6,891,202 | B2 | * | 5/2005  | Kish et al. ...................... 257/96  |
| 7,115,918 | B2 | * | 10/2006 | Shen et al. ..................... 257/198  |

* cited by examiner

*Primary Examiner* — Calvin Lee
(74) *Attorney, Agent, or Firm* — Peter K. Trzyna, Esq.

(57) ABSTRACT

A process, machine, manufacture, composition of matter, and improvement thereof, and method of making and method of using the same, as well as necessary intermediates, generally relating to the field of semiconductor devices, the structure of transistors, and the structure of compound semiconductor heterojunction bipolar transistors.

11 Claims, 45 Drawing Sheets

Mask 1 – Emitter Mesa
Mask 2 – E/B Metal
Mask 3 – Base Mesa
Mask 4 – Collector Metal
Mask 5 – Collector Mesa
Mask 6 - BCB
Mask 7- Vias
Mask 8 – Large Metal

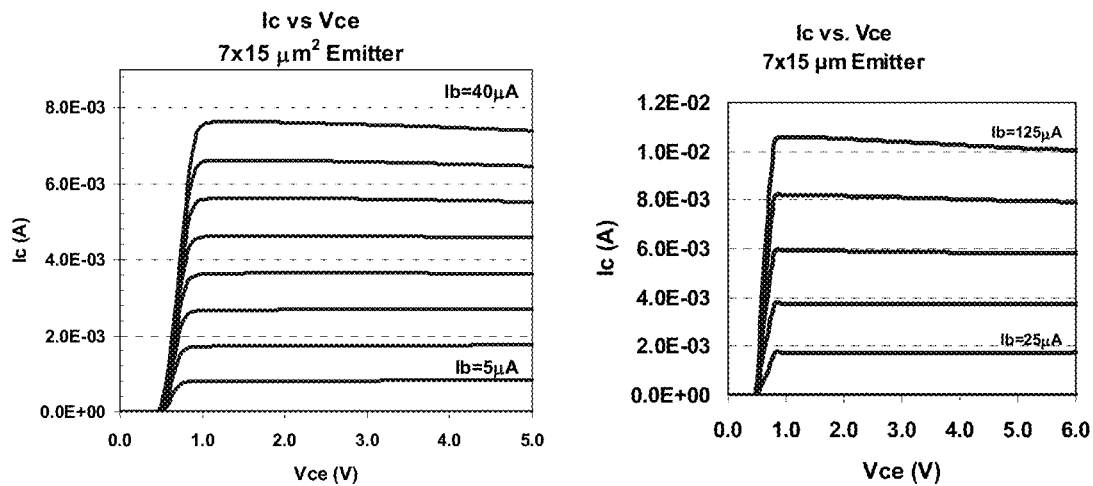
Figure 11 (A)
Figure 11 (B)
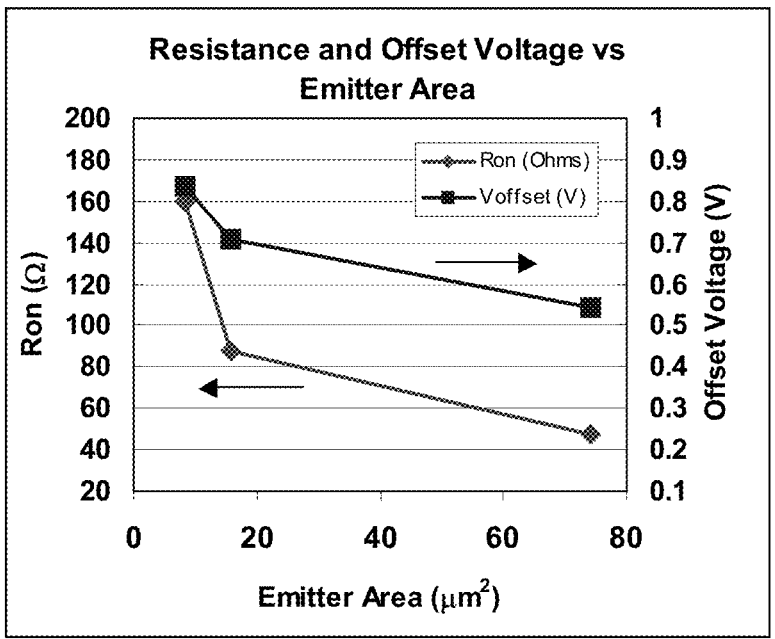
Figure 12

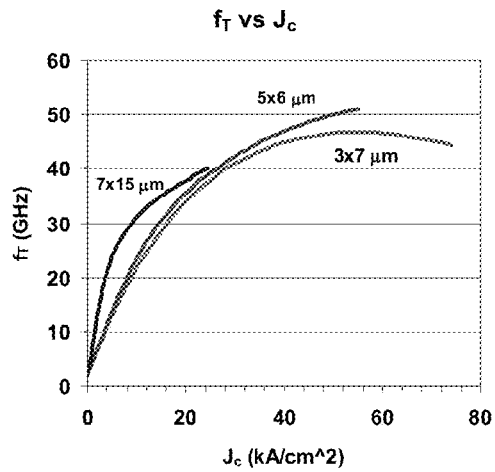
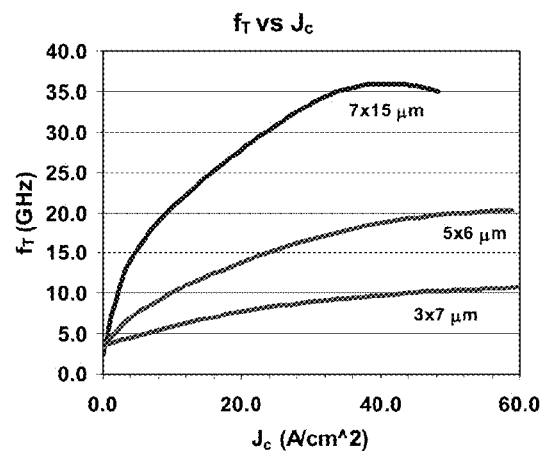
Figure 13 (A)
Figure 13 (B)
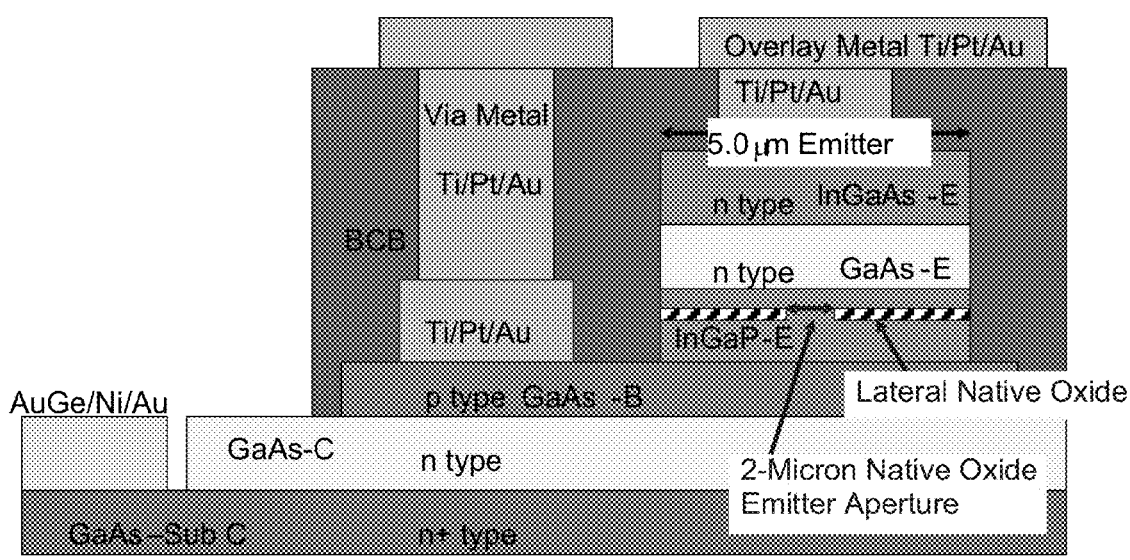
Figure 14

Mask 1 – Emitter Mesa
Mask 2 – E/B Metal
Mask 3 – Base Mesa
Mask 4 – Collector Metal
Mask 5 – Collector Mesa
Mask 6 – BCB
Mask 7 – Vias
Mask 8 – Overlay Metal

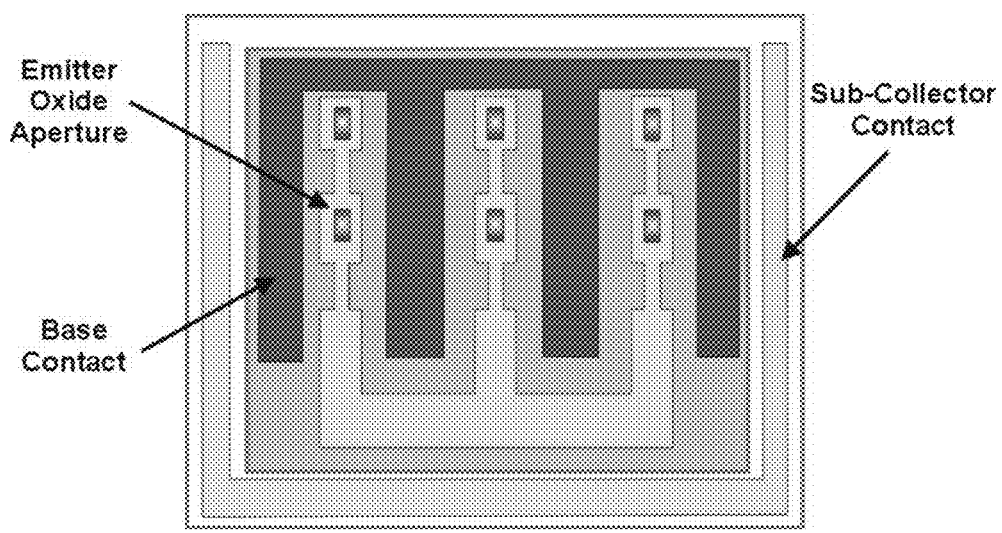
Figure 26
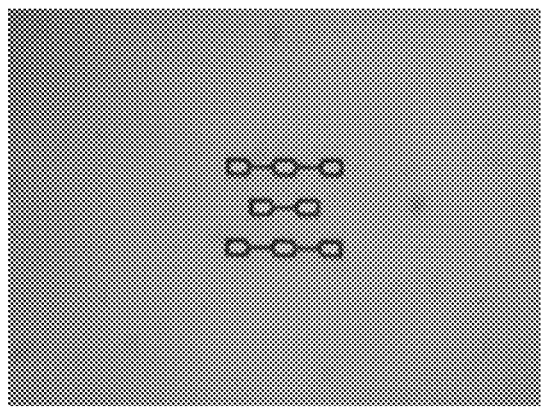
Figure 27 (A)
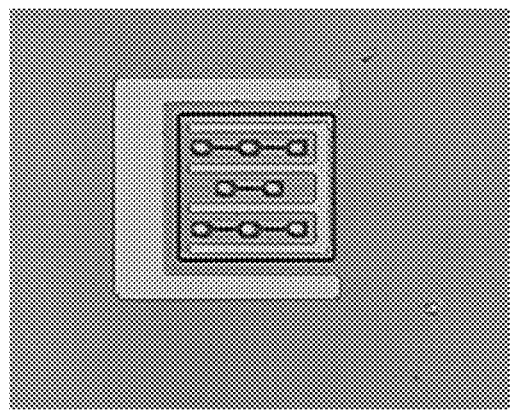
Figure 27 (B)

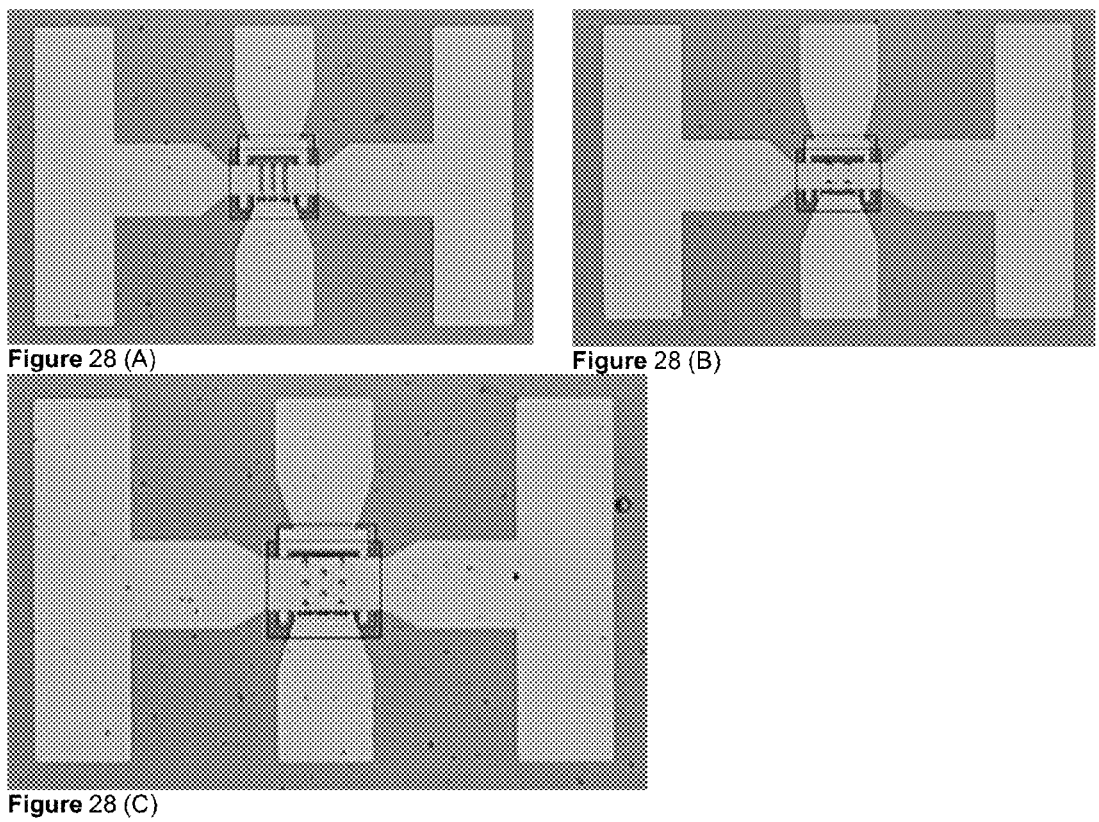
Figure 28 (A)
Figure 28 (B)
Figure 28 (C)
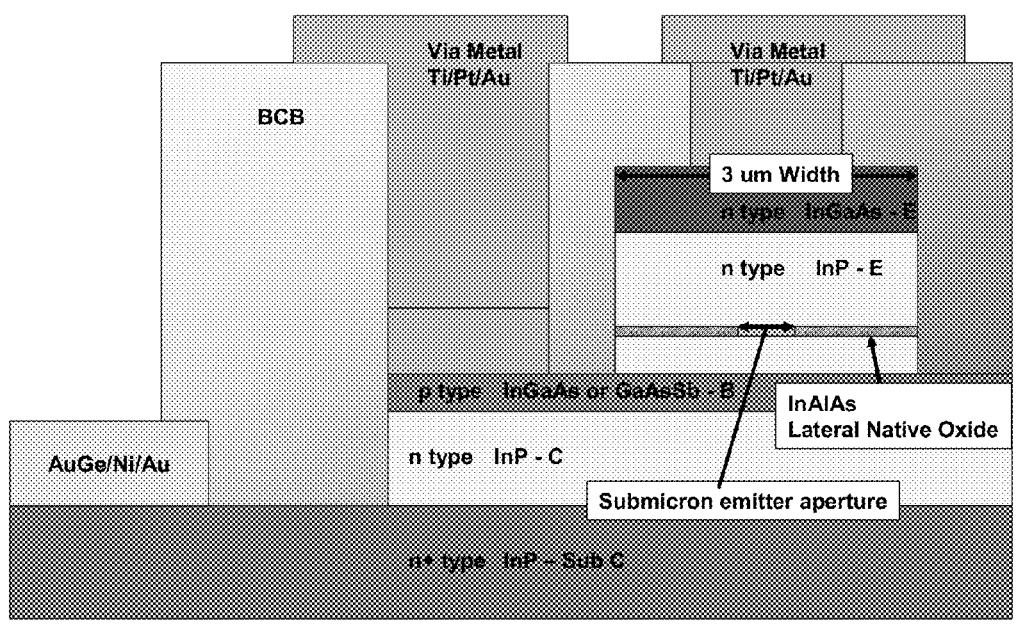
Figure 29

Mask 1 – Emitter Mesa
Mask 2 – E/B Metal
Mask 3 – Base Mesa
Mask 4 – Collector Metal
Mask 5 – Collector Mesa
Mask 6 – BCB
Mask 7 – Vias
Mask 8 – Large Metal Mask 1 – Emitter Mesa Mask 2 – E/B Metal Mask 3 – Base Mesa Mask 4 – Collector Metal Mask 5 – Collector Mesa Mask 6 - BCB Mask 7- Vias Mask 8 – Large Metal

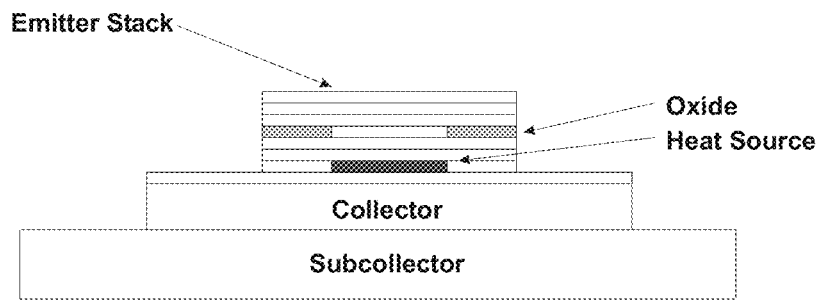
Figure 40 (A)
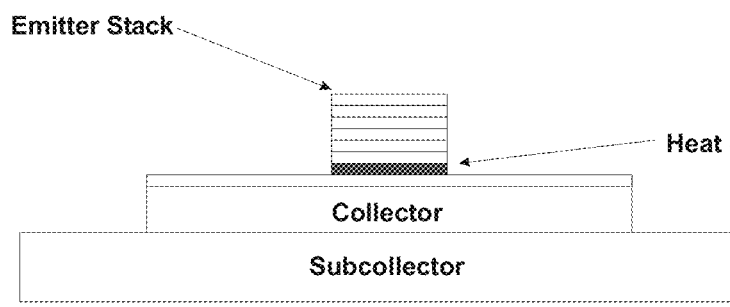
Figure 40 (B)
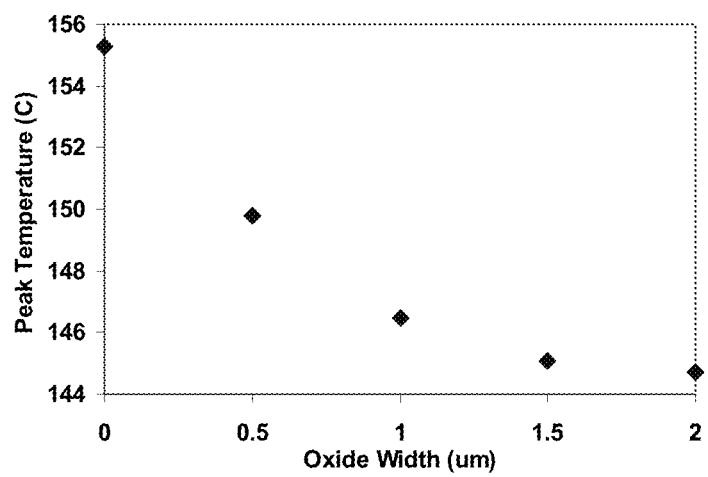
Figure 41

| Layer # | Material | x | Thickness (A) | $N_D$ (cm$^{-3}$) | Dopant |
|---|---|---|---|---|---|
| 10 | n-In$_x$Ga$_{1-x}$As | 0.5 | 500 | >2.00E+19 | Te |
| 9 | n-In$_x$Ga$_{1-x}$As | 0 to 0.5 | 500 | >1.00E+19 | Te |
| 8 | n-GaAs | | 1500 | 4.00E+18 | Si |
| 7 | n-Al$_x$Ga$_{1-x}$As | 0.35 to 0 | 200 | 3.00E+17 | Si |
| 6 | n-Al$_x$Ga$_{1-x}$As | 0.35 | 650 | 3.00E+17 | Si |
| 5 | n-Al$_x$Ga$_{1-x}$As | 0 to 0.35 | 150 | 3.00E+17 | Si |
| 4 | p-GaAs | | 700 | 4.00E+19 | C |
| 3 | n-GaAs | | 5000 | 1.00E+16 | Si |
| 2 | n-GaAs | | 7000 | 4.00E+18 | Si |
| 1 | GaAs | | 500 | | none |

| Layer # | Material | x | Thickness (A) | $N_D$ $(cm^{-3})$ | Dopant |
|---|---|---|---|---|---|
| 11 | n-In$_x$Ga$_{1-x}$As | 0.5 | 500 | >2.00E+19 | Te |
| 10 | n-In$_x$Ga$_{1-x}$As | 0 to 0.5 | 500 | >1.00E+19 | Te |
| 9 | n-GaAs | | 1500 | 4.00E+18 | Si |
| 8 | n-Al$_x$Ga$_{1-x}$As | 0.2 | 150 | 5.00E+18 | Si |
| 7 | n-Al$_x$Ga$_{1-x}$As | 0.95 | 200 | 5.00E+18 | Si |
| 6 | n-Al$_x$Ga$_{1-x}$As | 0.35 | 800 | 3.00E+17 | Si |
| 5 | n-Al$_x$Ga$_{1-x}$As | 0 to 0.35 | 150 | 3.00E+17 | Si |
| 4 | p-GaAs | | 700 | 4.00E+19 | C |
| 3 | n-GaAs | | 5000 | 1.00E+16 | Si |
| 2 | n-GaAs | | 7000 | 4.00E+18 | Si |
| 1 | GaAs | | 500 | | none |

Figure 69

| Layer # | Material | x | Thickness (A) | $N_D$ $(cm^{-3})$ | Dopant | Grade |
|---|---|---|---|---|---|---|
| 11 | n-In$_x$Ga$_{1-x}$As | 0 to 0.5 | 1000 | >1.00E+19 | Te | |
| 10 | n-GaAs | | 500 | 4.00E+18 | Si | |
| 9 | n-Al$_x$Ga$_{1-x}$As | 0.6-0 | 150 | 5.00E+17 | Si | graded |
| 8 | n-Al$_x$Ga$_{1-x}$As | 0.6 | 500 | 5.00E+17 | Si | |
| 7 | n-Al$_x$Ga$_{1-x}$As | 0-0.6 | 150 | 5.00E+17 | Si | graded |
| 6 | n-GaAs | | 800 | 4.00E+18 | Si | |
| 5 | n-In$_x$Ga$_{1-x}$P | 0.49 | 450 | 3.00E+17 | Si | |
| 4 | p-GaAs | | 700 | 4.00E+19 | C | |
| 3 | n-GaAs | | 4500 | 8.00E+15 | Si | |
| 2 | n-GaAs | | 7000 | 4.00E+18 | Si | |
| 1 | GaAs | | 500 | | None | |

Figure 70

| Layer | Mtl | Thickness (A) | Doping Type | Level (/cm^3) | Description/Comments | |
|---|---|---|---|---|---|---|
| 11 | InGaAs | 500 | n | 2.00E+19 | Emitter contact, x=0.5 | Te |
| 10 | InGaAs | 500 | n | 1.00E+19 | x=0.5->.0 | Te |
| 9 | GaAs | 500 | n | 4.00E+18 | | Si |
| 8 | AlGaAs | 500 | n | 2.00E+18 | Grade | Si |
| 7 | AlGaAs | 1000 | n | 1.00E+18 | x=0.35 | Si |
| 6 | AlGaAs | 500 | n | 2.00E+18 | Grade | Si |
| 5 | GaAs | 250 | n | 8.00E+17 | | Si |
| 4 | InGaP | 450 | n | 3.00E+17 | | Si |
| 3 | GaAs | 700 | p | 4.00E+19 | Base | C |
| 2 | GaAs | 4000 | n | 1.00E+16 | | Si |
| 1 | GaAs | 7000 | n | 4.00E+18 | Subcollecter | Si |
| | GaAs | | S.I. | | Substrate | |

Figure 70 (A)

| Layer # | Material | X | Thickness (A) | $N_D$ $(cm^{-3})$ | Dopant |
|---|---|---|---|---|---|
| 11 | n-InxGa1-xAs | 0.53 | 1000 | 1E+19 | Te |
| 10 | n-InxGa1-xAs | 0.53 | 200 | 5.00E+18 | Si |
| 9 | n-InAlGaAs | Grade 2 | 200 | 5.00E+18 | Si |
| 8 | n-InxAl1-xAs | 0.52 | 1000 | 5.00E+18 | Si |
| 7 | n-InAlGaAs | Grade 1 | 200 | 5.00E+18 | Si |
| 6 | n-InxGa1-xAs | 0.53 | 200 | 3.00E+17 | Si |
| 5 | n-InP | | 800 | 3.00E+17 | Si |
| 4 | p-GaAsxSb1-x | 0.51 | 700 | 4.00E+19 | C |
| 3 | n-InP | | 4000 | 1.00E+16 | Si |
| 2 | n-InxGa1-xAs | 0.53 | 7000 | 5.00E+18 | Si |
| 1 | InP | | 200 | - | |

Figure 71

| Mask Level | Process Type |
|---|---|
| Mask I: Emitter mesa | Controllable wet etch to the Base layer. Oxidize. |
| Mask II: Emitter/Base Metal | Ti/Pt/Au Metallization |
| Mask III: Base Mesa | Slow, controllable wet etch down to SubCollector |
| Mask IV: Collector Metal | AuGe/Ni/Au Metallization, Alloy contact |
| Mask V: Collector Mesa | Faster wet etch down to Substrate (for isolation) |
| Mask VI: BCB Mesa | Dry etch BCB |
| Mask VII: Contact Vias | Dry etch BCB |
| Mask VIII: Overlay Metal | Ti/Pt/Au Metallization |

Figure 72

| Name | Section | Material | x | Thermal Conductivity (W/umK) | Thickness (μm) | No. slices | Inner Radius (μm) | Outer Radius (μm) | Comments |
|---|---|---|---|---|---|---|---|---|---|
| contact | | n-InxGa1-xAs | 0 to .5 | 6.20E-06 | 0.1 | 1 | 0 | 3 | |
| buffer | | n-GaAs | | 4.41E-05 | 0.05 | 1 | 0 | 3 | |
| grade | | n-AlxGa1-xAs | 0.35-0 | 1.68E-05 | 0.05 | 1 | 0 | 3 | |
| AlGaAs | | n-AlxGa1-xAs | 0.35 | 1.25E-05 | 0.1 | 1 | 0 | 2 | |
| oxide | Emitter | AlxOy | | 1.30E-06 | 0.1 | 1 | 2 | 3 | annular oxide area |
| grade | | n-AlxGa1-xAs | 0-0.35 | 1.68E-05 | 0.05 | 1 | 0 | 3 | |
| buffer | | n-GaAs | | 4.41E-05 | 0.08 | 1 | 0 | 3 | |
| heat source | | n-InxGa1-xP | 0.49 | 5.20E-06 | 0.045 | 1 | 0 | 2 | cylindrical heat source |
| emitter | | n-InxGa1-xP | 0.49 | 5.20E-06 | 0.045 | 1 | 2 | 3 | |
| base | Base/ | p-GaAs | | 4.41E-05 | 0.07 | 1 | 0 | 5.5 | |
| collector | Collector | n-GaAs | | 4.41E-05 | 0.5 | 5 | 0 | 5.5 | |
| subcollector | Subcollector | n-GaAs | | 4.41E-05 | 0.7 | 5 | 0 | 16.5 | |
| substrate | Substrate | GaAs | 0 | 4.41E-05 | 300 | 76 | | | slice thickess increases further away from transistor |

Figure 73

CURRENT-CONFINED HETEROJUNCTION BIPOLAR TRANSISTOR

I. STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of: National Science Foundation Grant entitled: "SBIR/STTR Phase I: Native-Oxide-Defined AlGaAs Heterojunction Bipolar Transistors" Grant number: 0320345; and Missile Defense Agency Contract: W9113M-05-P-0095 entitled: "LOW-COST, HIGH-POWER TRANSMIT/RECEIVE MODULES FOR X-BAND RADARS".

II. CROSS-REFERENCE TO RELATED APPLICATIONS

This application claims priority from, and incorporates by reference, U.S. Patent Application Ser. No. 61/017,114, filed on Dec. 27, 2007, naming as inventor Alan Sugg, and titled "Current-confined Heterojunction Bipolar Transistor."

III. BACKGROUND OF THE INVENTION

Technical Field

A process, machine, manufacture, composition of matter, and improvement thereof, and method of making and method of using the same, as well as necessary intermediates, generally relating to the field of semiconductor devices, the structure of transistors, and the structure of compound semiconductor heterojunction bipolar transistors.

IV. SUMMARY OF THE INVENTION

Illustratively, one of the many embodiments herein can be summarized as follows. A heterojunction bipolar transistor comprising: at least one emitter comprising one or more physically separate regions, each of the emitter regions comprising one or more compound layers including at least one semiconductor layer and at least one electrical contact; the at least one emitter comprises at least one layer of an aluminum-bearing composition with any combination of arsenic or phosphorus or nitrogen, where at least part of the emitter aluminum-bearing composition layer is a current blocking oxide layer; at least one base comprising one or more physically separate regions proximal to the emitter region or regions, where each of the base regions comprises one or more semiconductor layers and at least one electrical contact; at least one collector comprising one or more physically separate regions proximal to the base region or regions and the emitter region or regions, where each collector region comprises compound layers, and where each of the collector regions comprise at least one or more semiconductor layers and at least one electrical contact; the at least one collector comprises at least one layer of an aluminum-bearing composition with any combination of arsenic or phosphorus or nitrogen, where at least part of the collector aluminum-bearing composition layer is a current blocking oxide layer; and the physically separate regions form a linear or two dimensional regularly or irregularly spaced array.

V. BRIEF DESCRIPTION OF THE DRAWINGS

FIG. 1 illustrates an embodiment.
FIG. 2 illustrates an embodiment.
FIG. 3 illustrates an embodiment.
FIG. 4A illustrates an RF oxide-defined HBT. The emitter mesa dimension is 7×15 μm.
FIG. 4B illustrates a scanning electron microscope (SEM) image of a native-oxide-defined HBT showing the BCB planarization, emitter oxide aperture and base. The lateral emitter oxide is 0.75 μm.
FIG. 5 illustrates the SEM micrographs of lateral oxidation calibrations of the emitter structure. The lateral oxidation rate can be ~180 Å/min at 390° C. (90 min) for a 1.62 μm. Submicron emitter geometries can use high-yield, large-scale (>3 μm) photolithography.
FIG. 6 illustrates an embodiment.
FIG. 7 illustrates an embodiment.
FIG. 8 illustrates an embodiment.
FIG. 9 illustrates an embodiment.
FIG. 10 illustrates a maximum DC gain versus emitter dimensions for an oxide-defined HBT and a reference HBT. Note that the oxide-defined HBT exhibits more than double the gain of the reference device, and remains essentially constant. In contrast, the Reference Device exhibits a marked decrease in maximum DC gain. The Reference Device is identical to the Oxide Device except for the additional layers used for oxidation.
FIG. 11A illustrates the $I_C$ vs $V_{CE}$ characteristics of a 7×15 emitter oxide HBT. With the exception of the large offset current mentioned previously, the devices can exhibit excellent transistor behavior. The base current step size is 5 μA.
FIG. 11B illustrates the $I_C$ vs $V_{CE}$ characteristics of a 7×15 reference HBT. With the exception of the large offset current mentioned previously, the devices can exhibit excellent transistor behavior. The oxide extent in these devices is 0.75 μm, leaving an emitter aperture of 5.5×13.5 μm. The base current step size is 25 μA.
FIG. 12 illustrates an embodiment.
FIG. 13A and FIG. 13 B collectively illustrate a cutoff frequency, $f_T$ vs collector current density, $J_C$ for several emitter sizes of reference and oxide-defined HBTs. The cutoff frequency is lower for smaller emitter geometries. One possible cause is increased emitter resistivity due to a low growth temperature of the $Al_{0.95}Ga_{0.05}As$ tunnel barrier/oxidizing layer.
FIG. 14 illustrates a schematic cross-section of GaAs/AlGaAs HBT with a III-V oxide emitter aperture. The lateral oxide scales the emitter from a large (>2 μm) dimension to a smaller (potentially sub-micron) dimension. The emitter aperture can be designed to enhance high-power (>50 W) HBT amplifier performance.
FIG. 15 illustrates an embodiment.
FIG. 16 illustrates an embodiment.
FIG. 17 illustrates an embodiment.
FIG. 18 illustrates an embodiment.
FIG. 19 illustrates an embodiment.
FIG. 20 illustrates an embodiment.
FIG. 21 illustrates an embodiment.
FIG. 22 illustrates an embodiment.
FIG. 23 illustrates an embodiment.
FIG. 24 illustrates a SEM cross section of a native-oxide-defined AlGaAs heterostructure bipolar transistor. One can use a manufacturable lithographic dimension for the emitter aperture and then reduce the effective emitter width through lateral oxidation, thus scaling the device to a smaller effective dimension.
FIG. 25A illustrates a DC gain versus collector current density for a native-oxide defined AlGaAs HBT and a reference AlGaAs HBT. The reference device is substantially identical to the oxide defined HBT with the exception of the oxide aperture.

FIG. 25B illustrates a maximum DC gain versus emitter dimensions for an oxide-defined HBT and a reference HBT.

FIG. 26 illustrates an overview of a segmented-oxide-emitter HBT. Each emitter finger is varied in width over the length of the finger. In a single oxidation, the emitter in the narrow sections is completely blocked by the later oxide, while the wider sections of the emitter fingers are allowed to conduct current.

FIG. 27A illustrates optical micrographs showing an oxide-defined HBT after oxidation at 500° C., 127 minutes.

FIG. 27B illustrates optical micrographs showing an oxide-defined HBT post emitter-base-collector metallization. The emitter 'dots' are 3×4 $\mu m^2$; The legs between emitter apertures are 6 long and 1.5 $\mu m$ wide. The lateral oxide extends ~0.85 $\mu m$ from each side, eliminating the current flow through the connecting emitter legs.

FIG. 28A, and FIG. 28B and FIG. 28C collectively illustrate an embodiment.

FIG. 29 illustrates an InP HBT with InAlAs native oxide aperture. Submicron emitter geometries for high-speed devices can be achieved with high-yield because previous generation (>3 um) lithography can be used. This development enables previous generation yields with next generation performance.

FIG. 30 illustrates an embodiment.

FIG. 31A and FIG. 31B collectively illustrate an embodiment.

FIG. 34A and FIG. 34B collectively illustrate an oxidized at 485° C. for 180 min. with 1 sccm $O_2$. Elevated temperature allowed the lateral oxide to penetrate quite deeply, but delamination of the cap layer also occurred. Sample oxidized at 450° C. for 90 min. with 1 sccm $O_2$ produced a 6600 Å deep oxide.

FIG. 35A and FIG. 35B collectively illustrate an embodiment.

Figure 36:
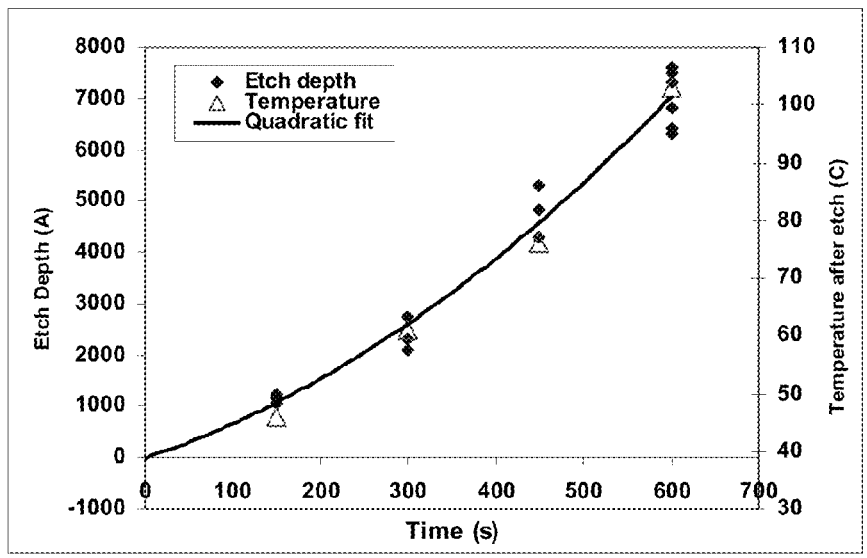

FIG. 36 illustrates an embodiment.

Figure 37:
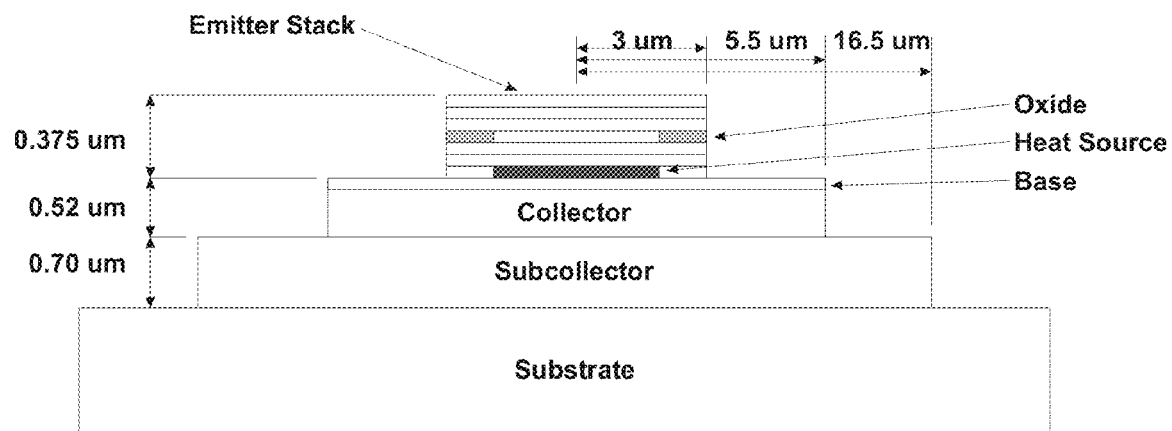

FIG. 37 illustrates an embodiment.

Figure 38:
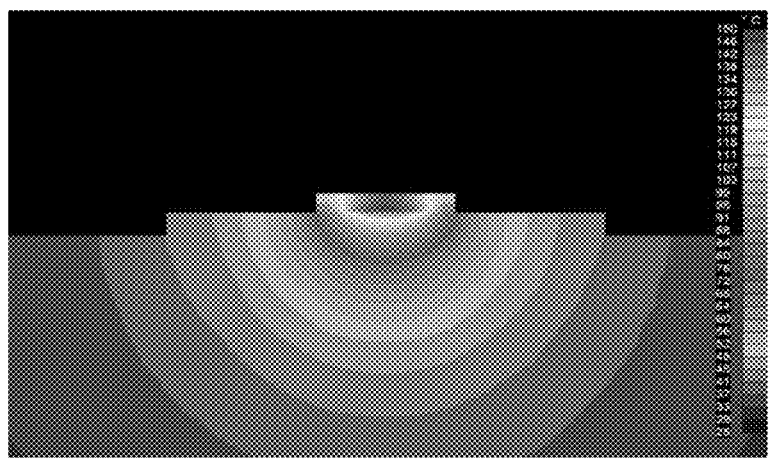

FIG. 38 illustrates an embodiment.

Figure 39:
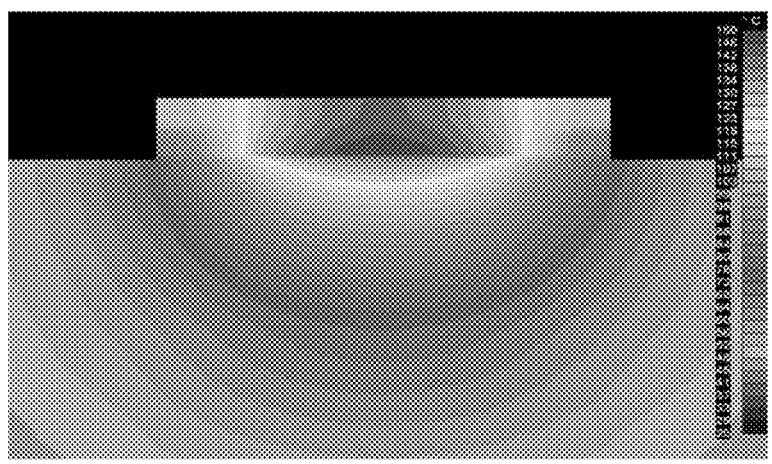
Figure 45:
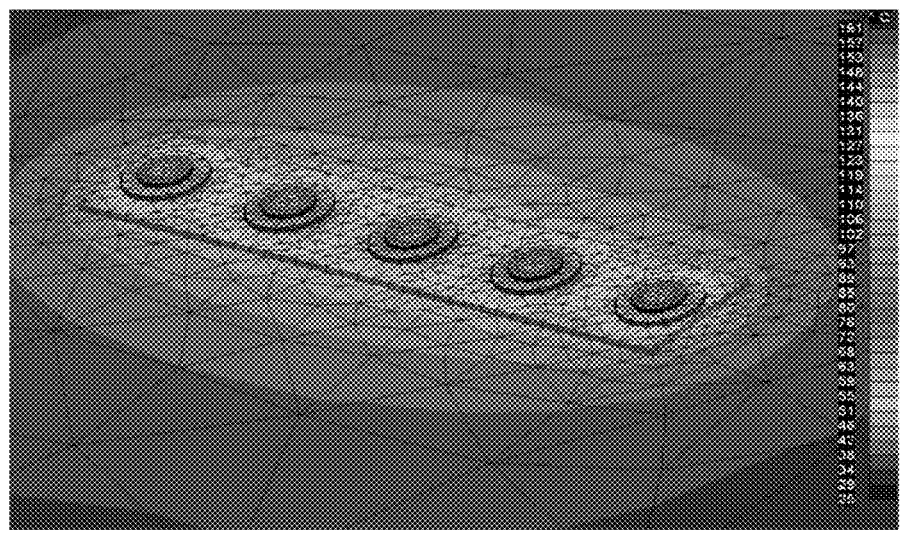

FIG. 39 illustrates a close up of the emitter section of the dot shown in FIG. 45. Note the abrupt changes in the temperature contours where there are large changes in thermal conductivity, e.g., at the bottom of the emitter and at the top of the oxide layer.

FIG. 40A and FIG. 40B collectively illustrate an embodiment.

Figure 42:
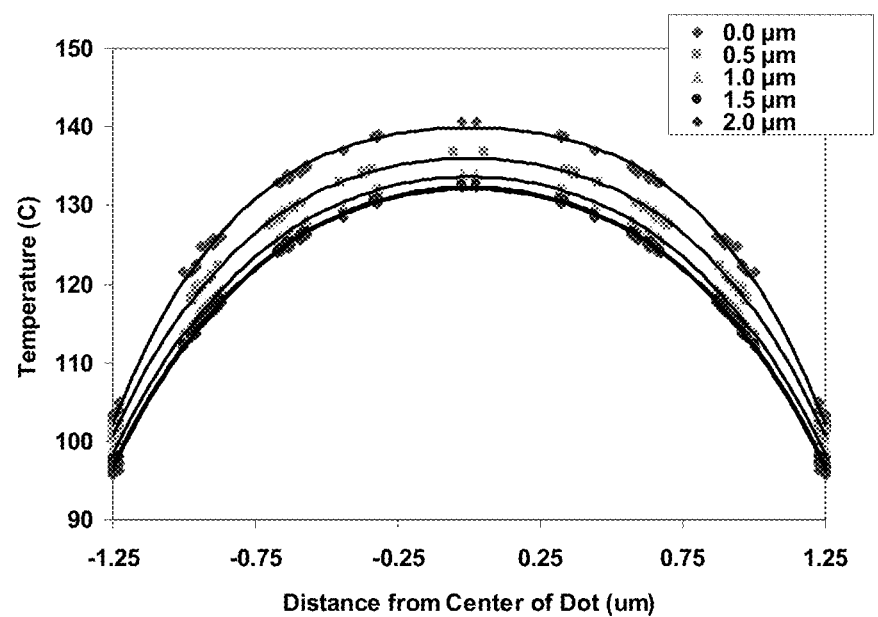
Figure 43:
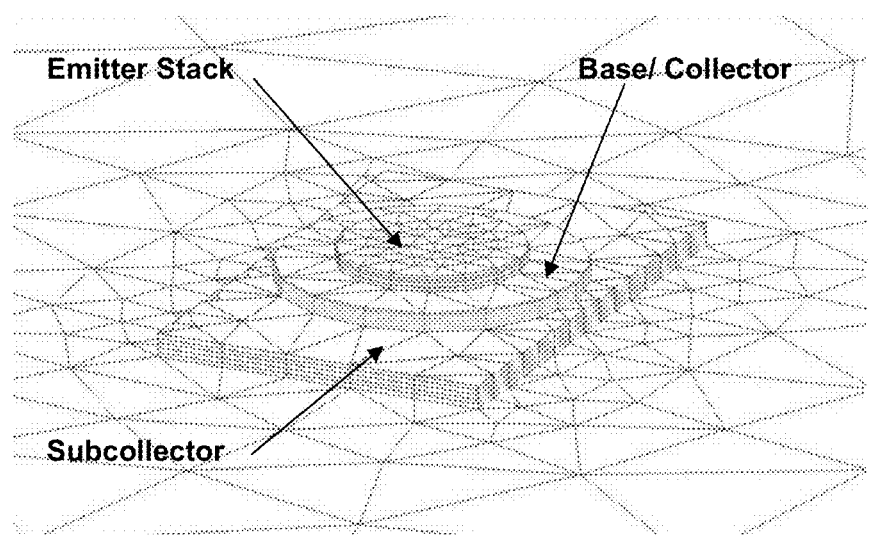
Figure 44:
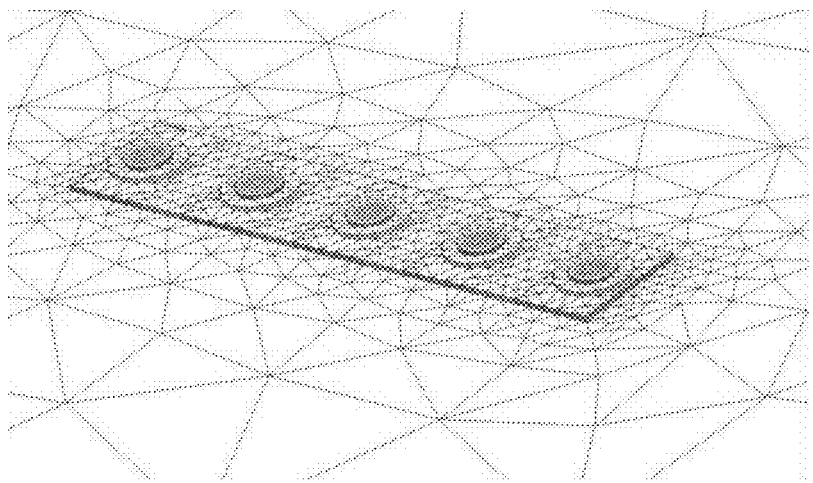
Figure 46:
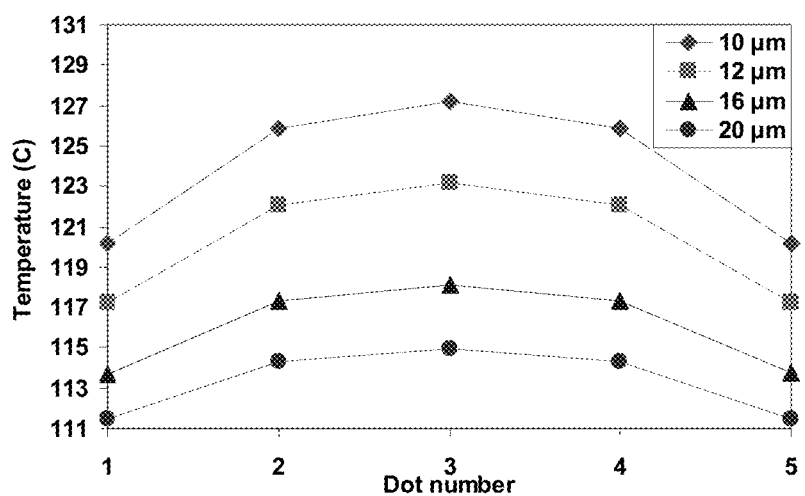
Figure 47:
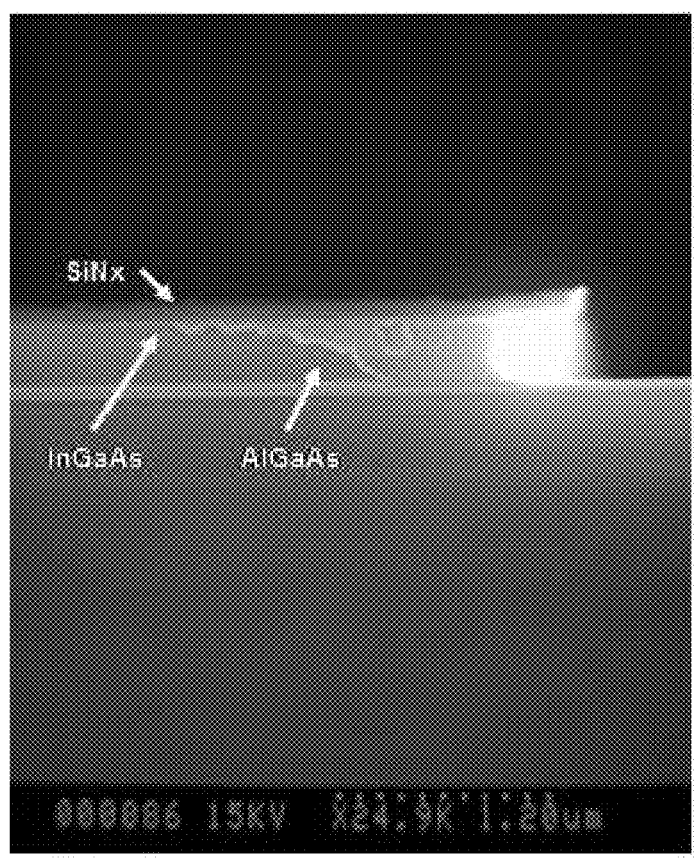
Figure 48:
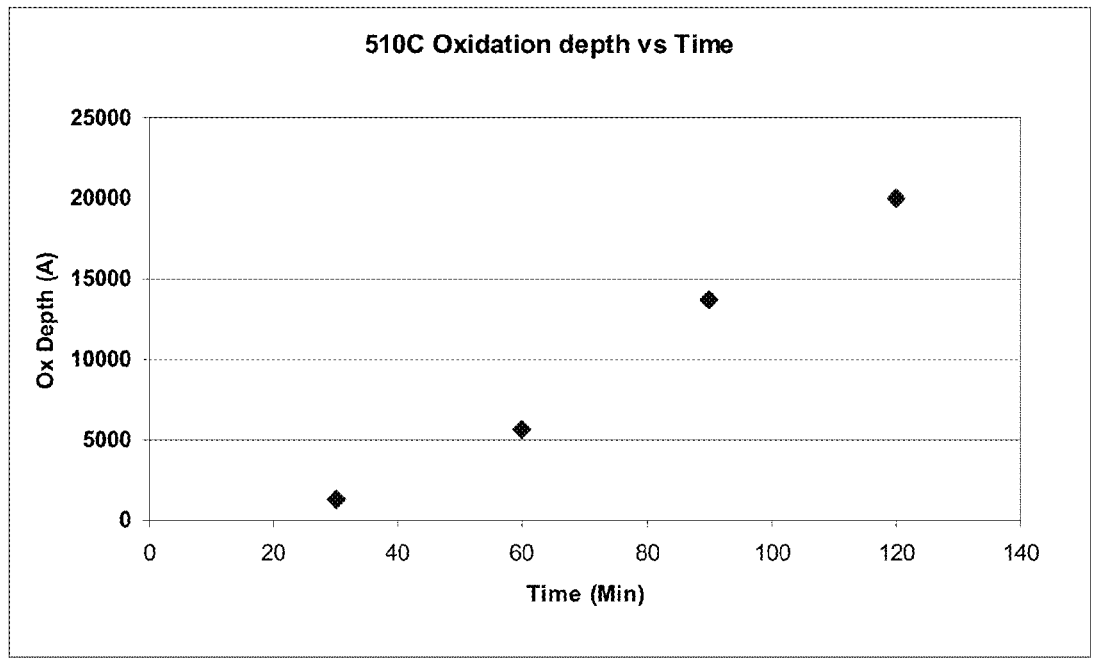
Figure 49:
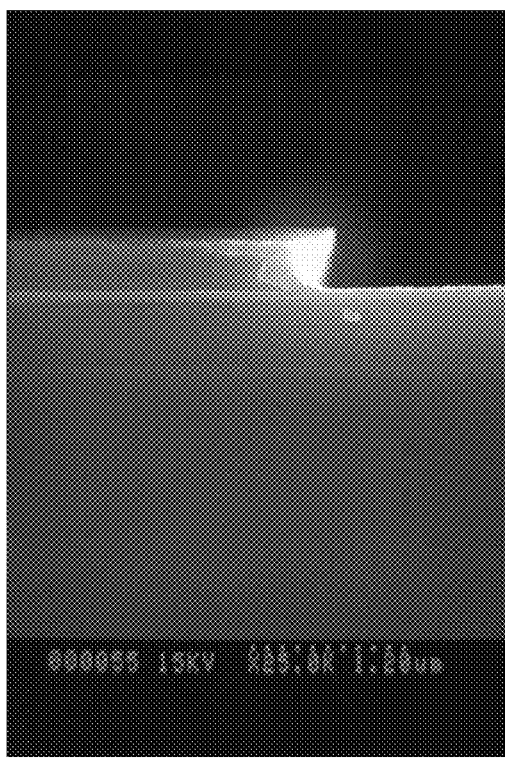
Figure 49:
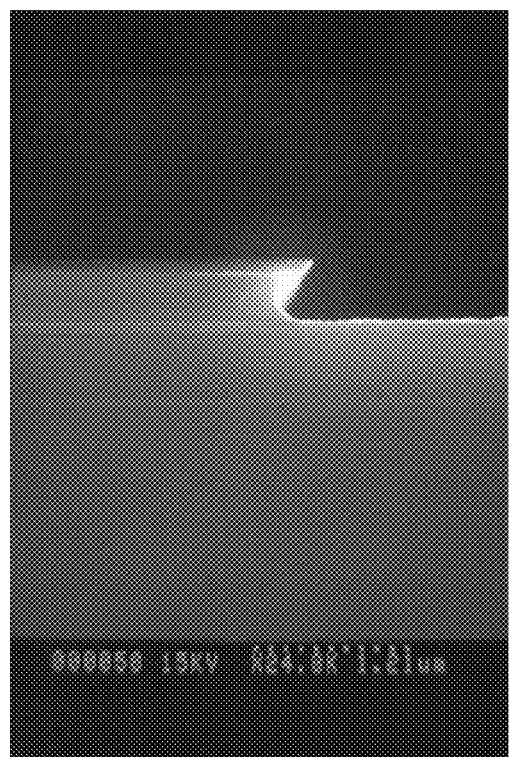
Figure 50:
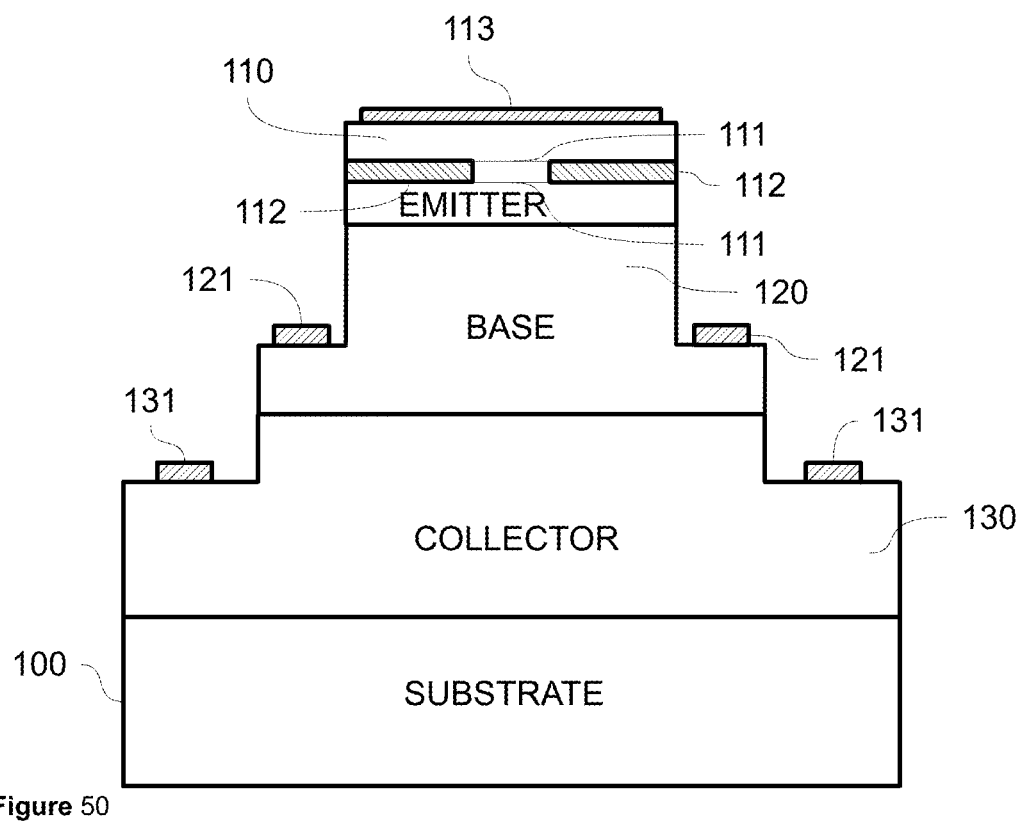
Figure 51:
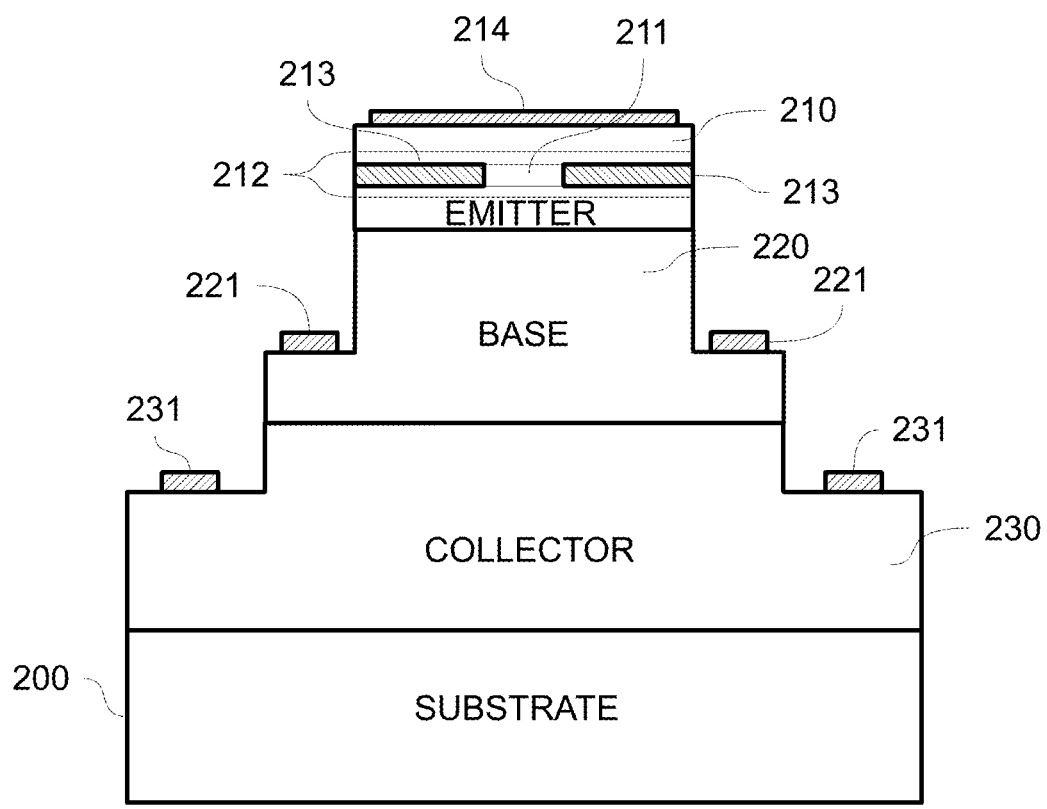
Figure 52:
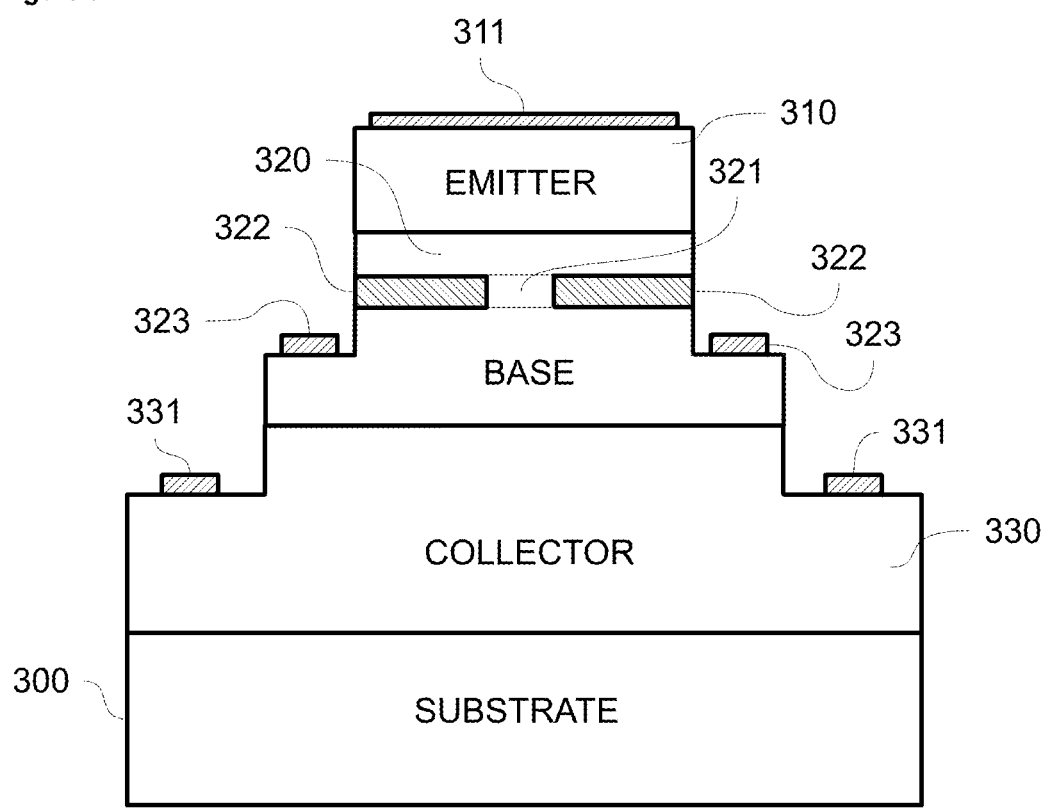
Figure 53:
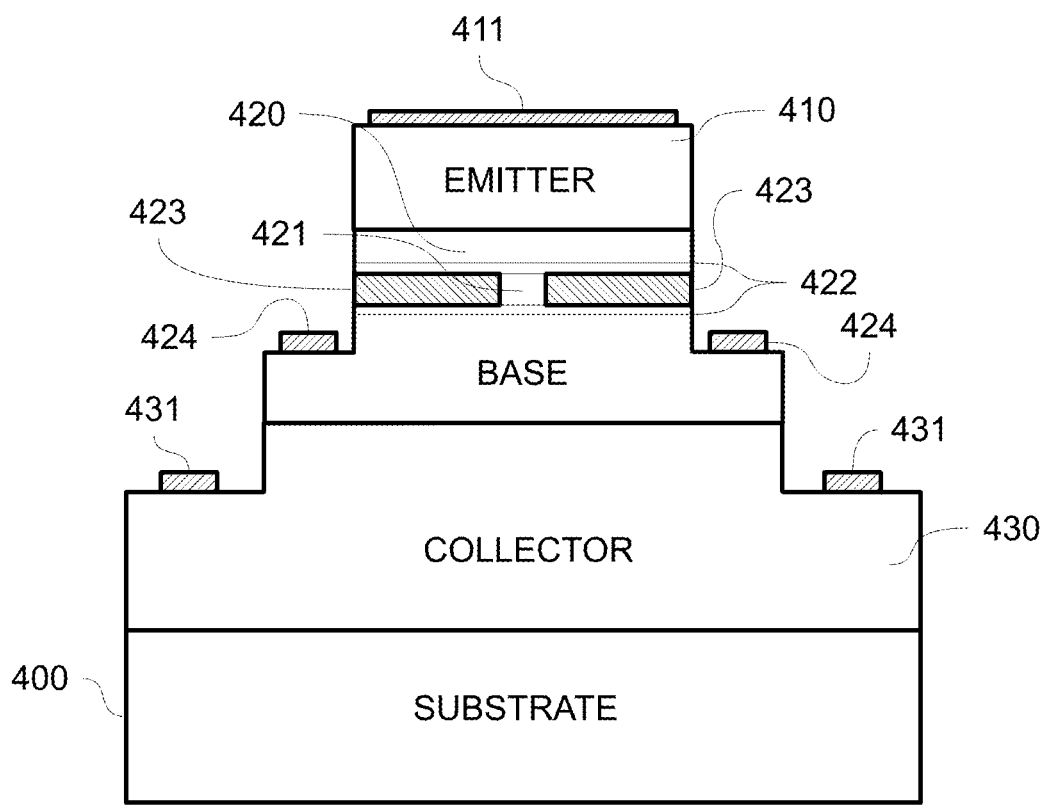
Figure 54:
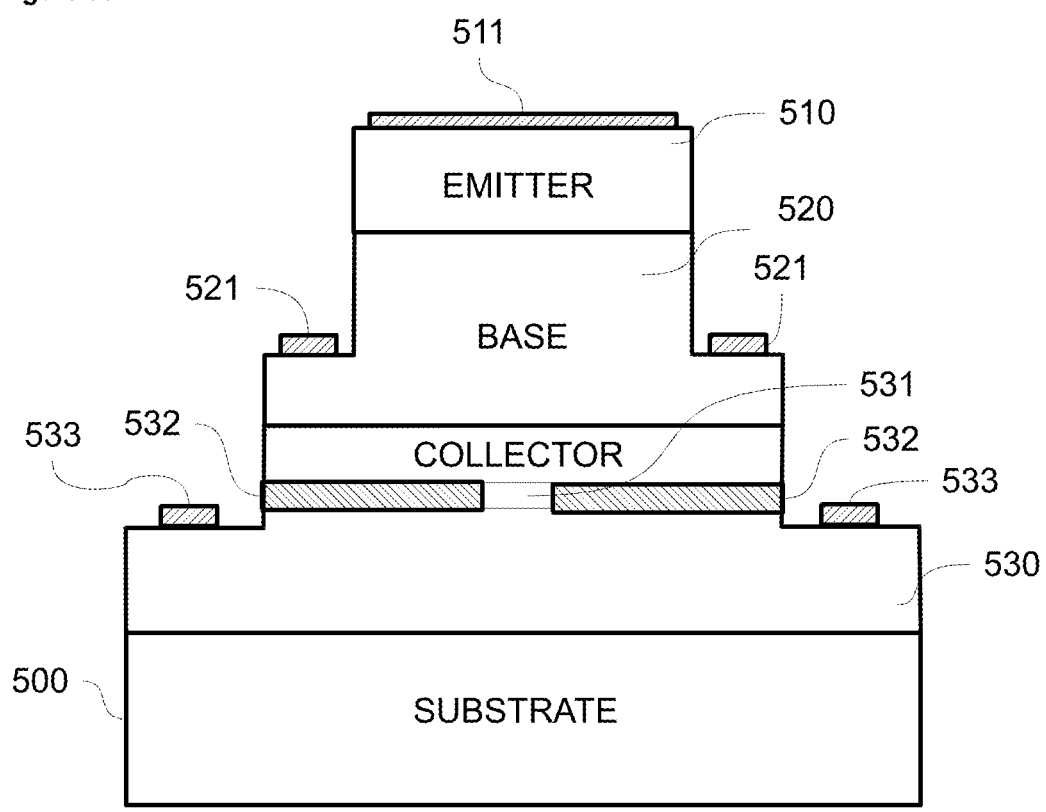
Figure 55:
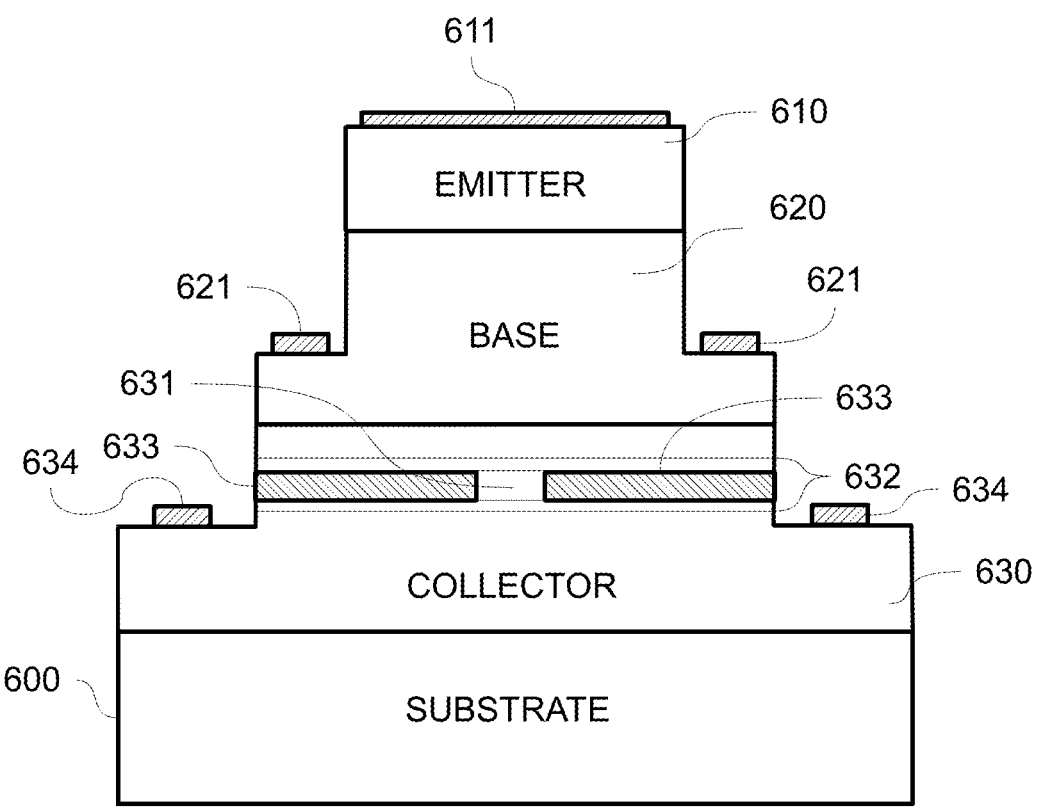
Figure 56:
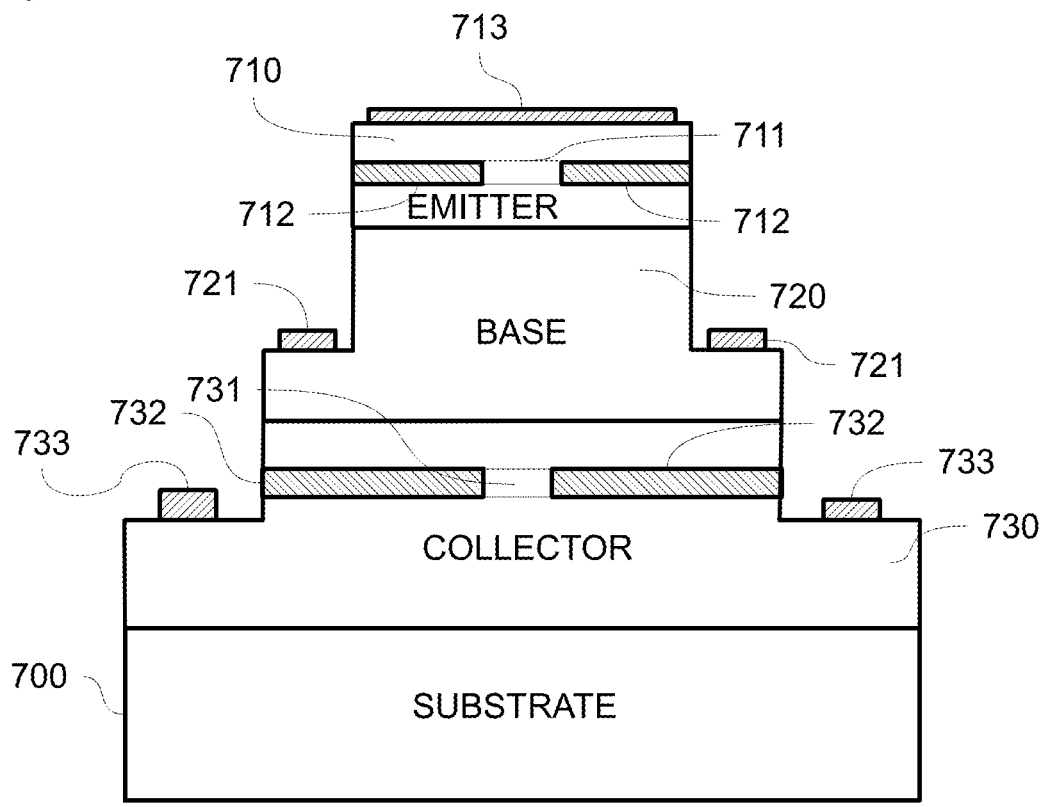
Figure 57:
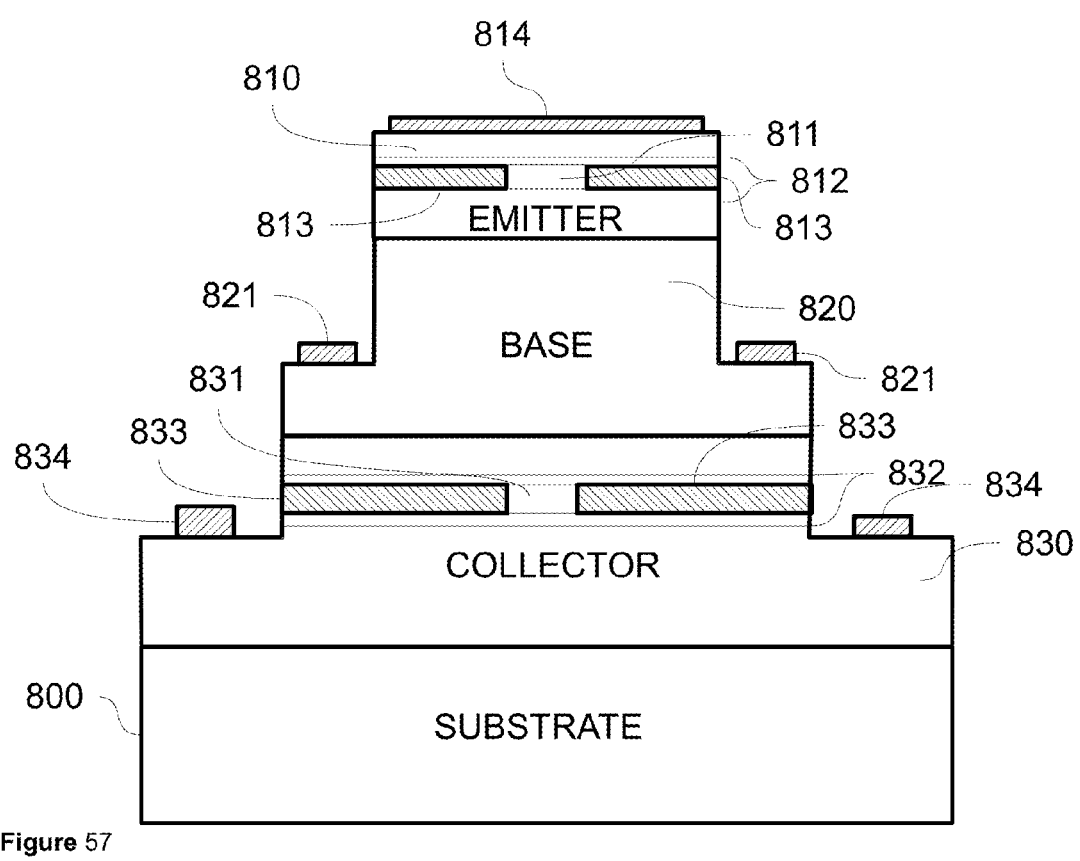
Figure 58:
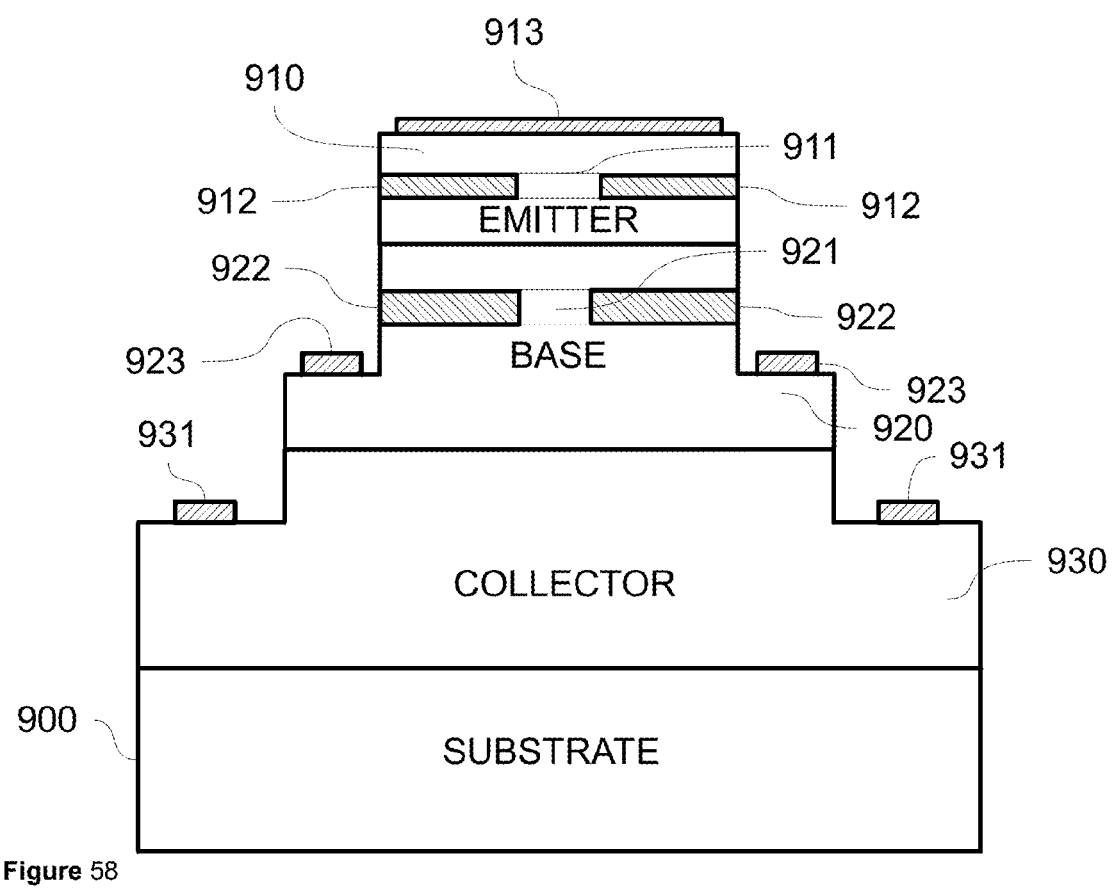
Figure 59:
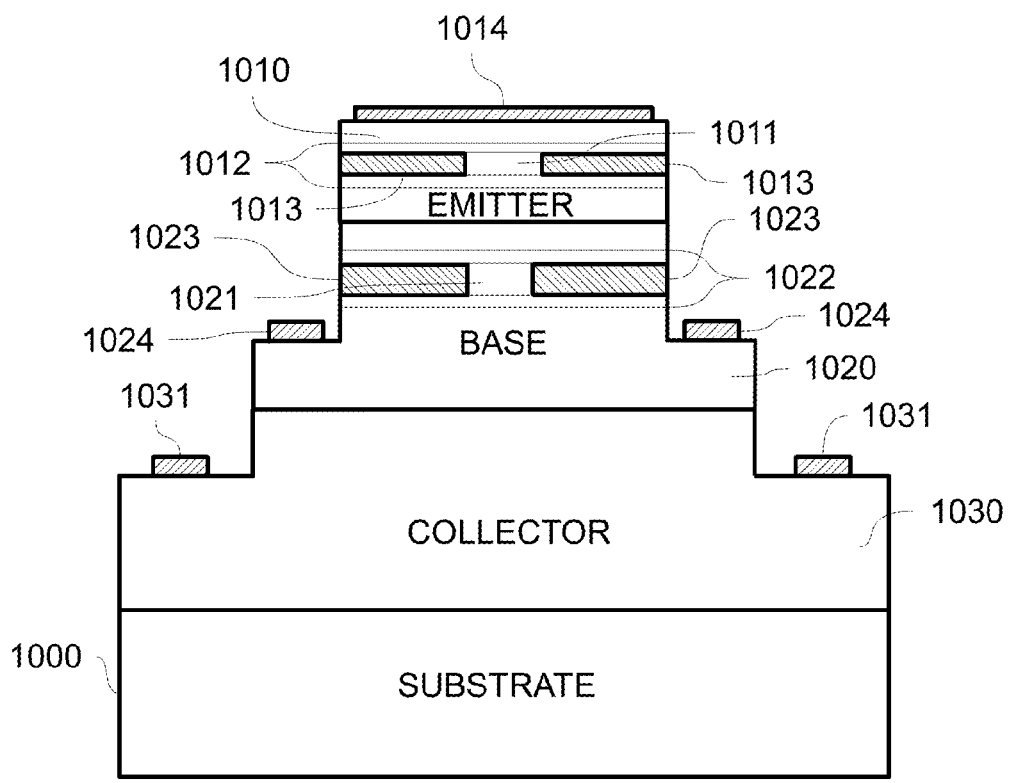
Figure 60:
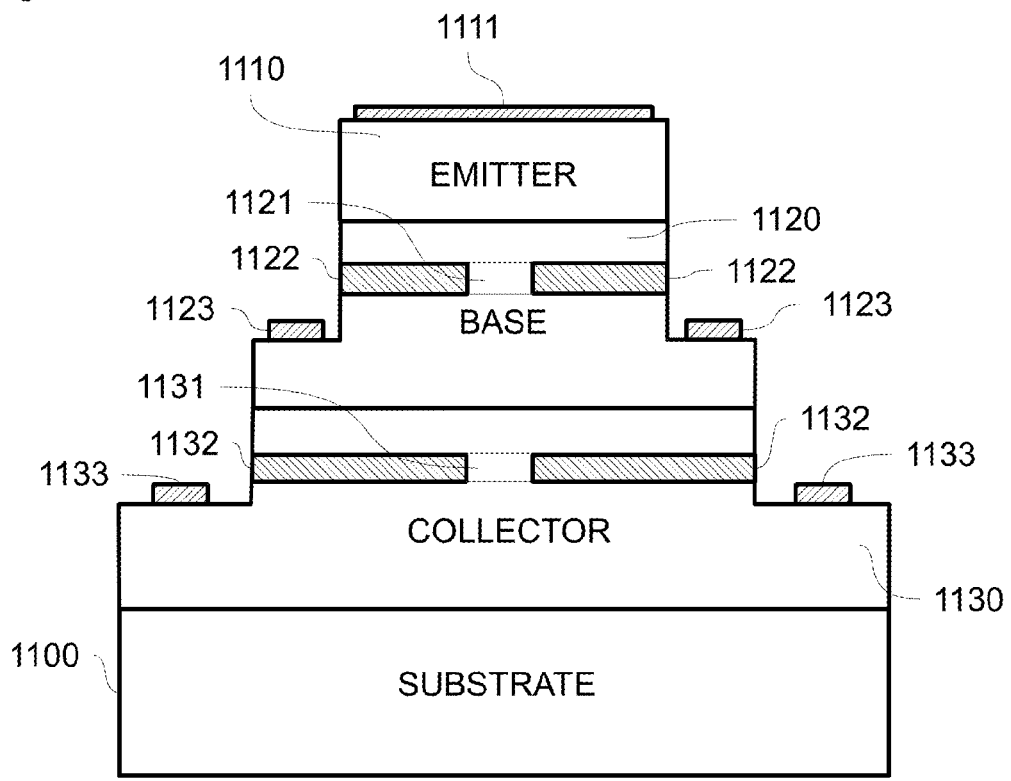
Figure 61:
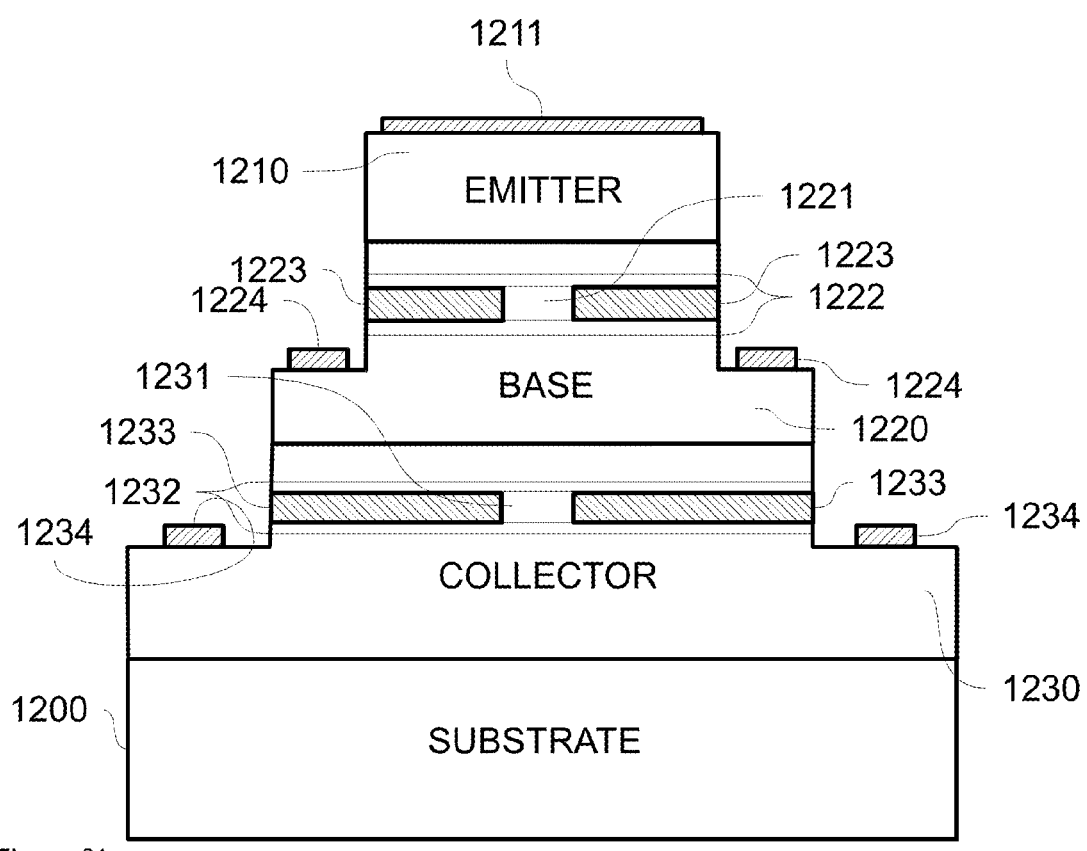
Figure 62:
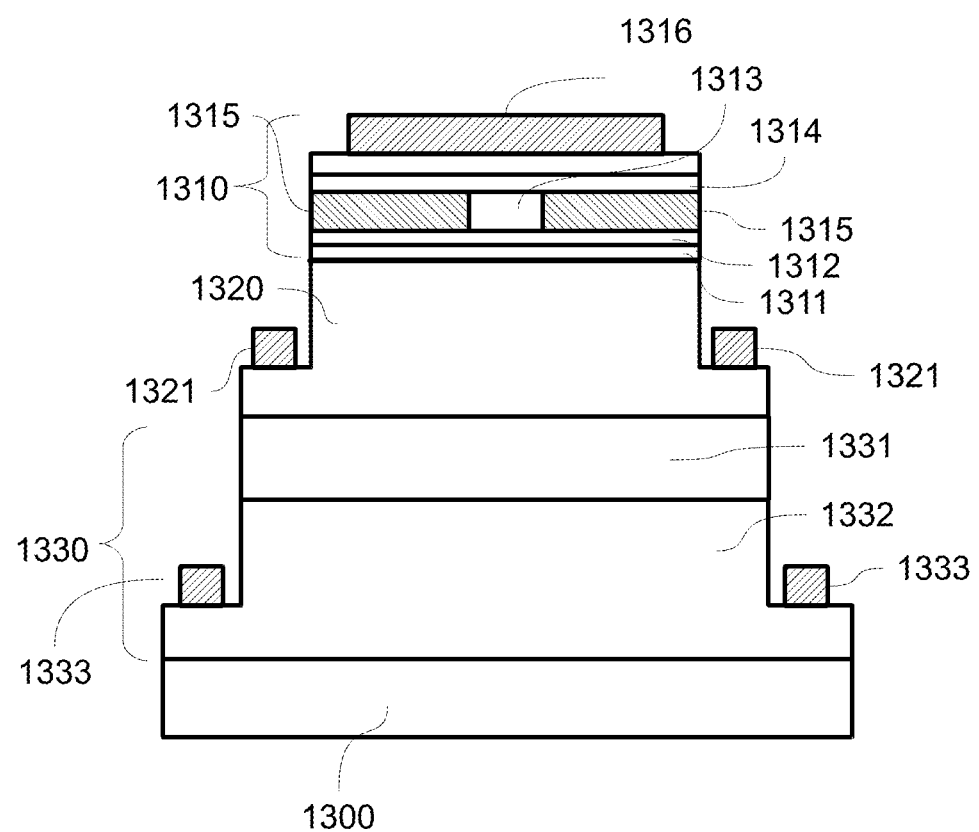
Figure 63:
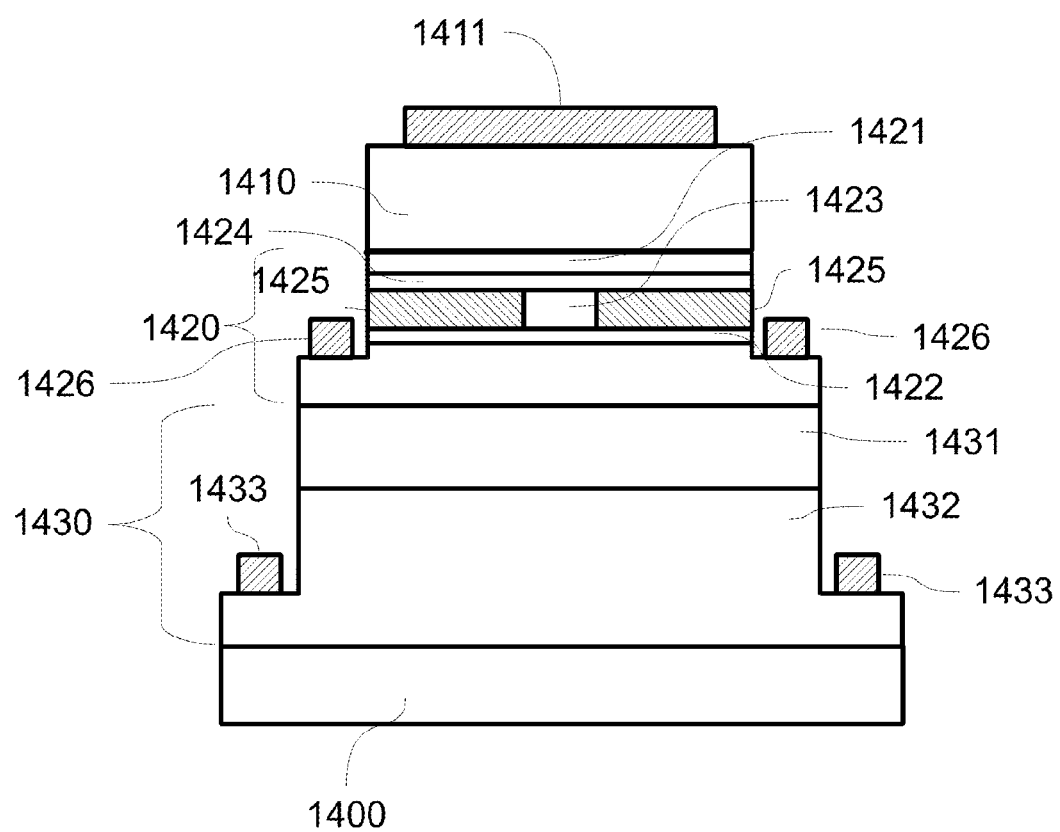
Figure 64:
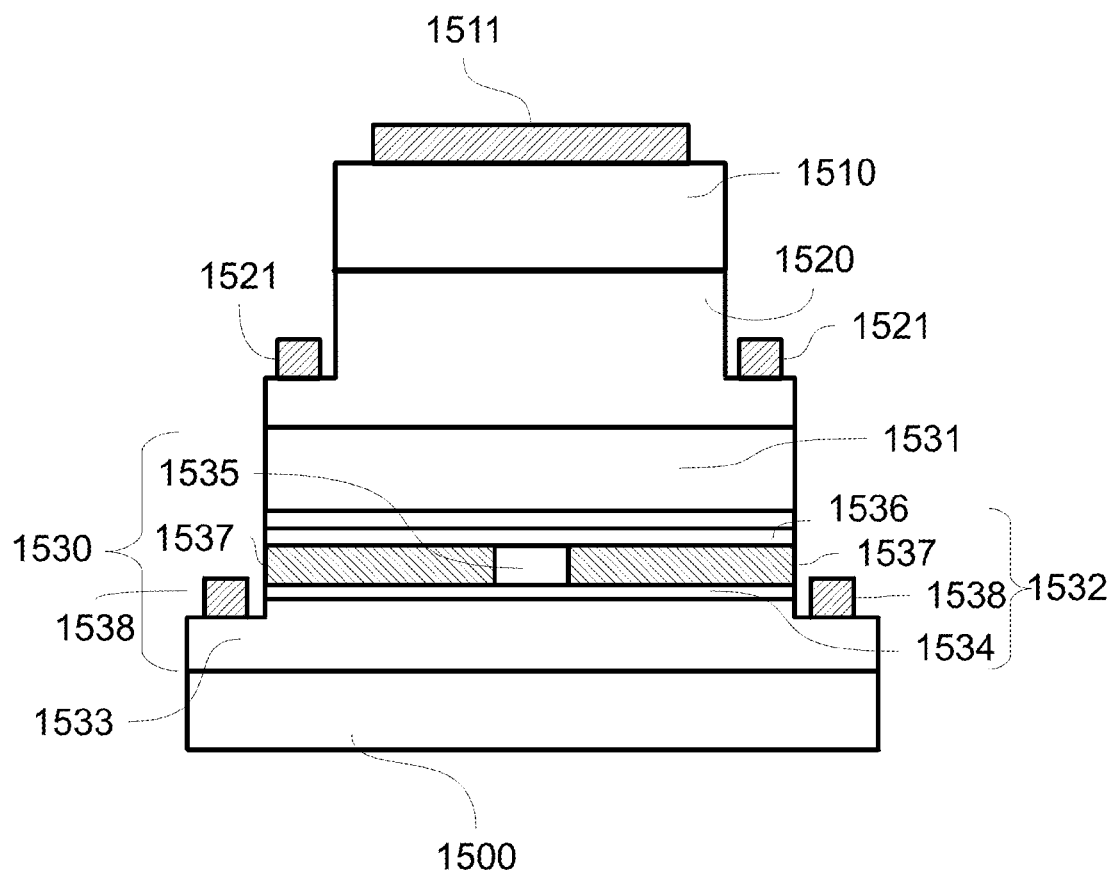
Figure 65:
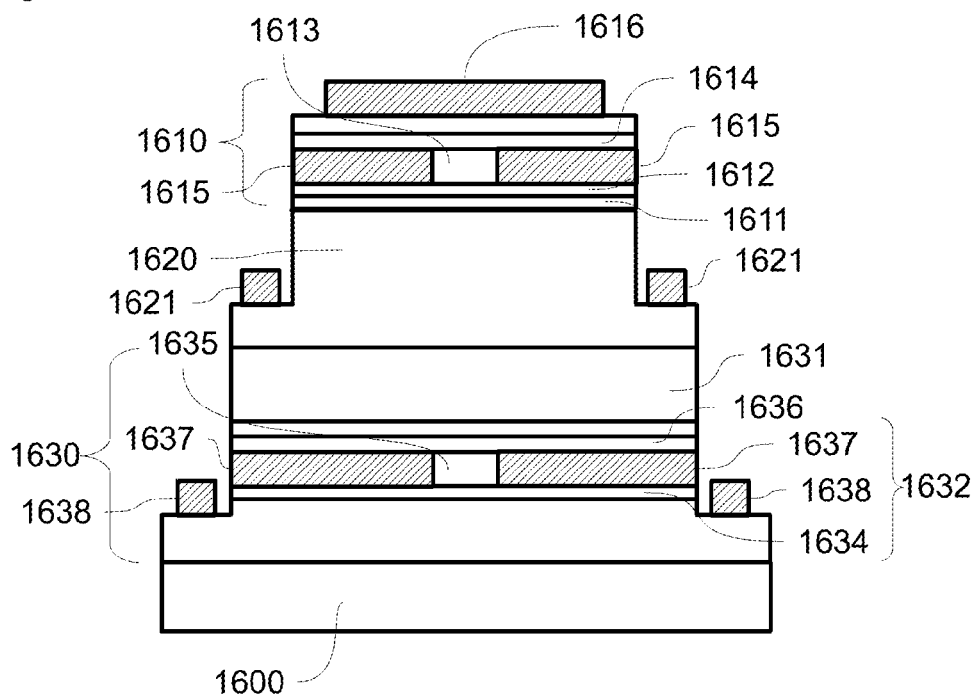
Figure 66:
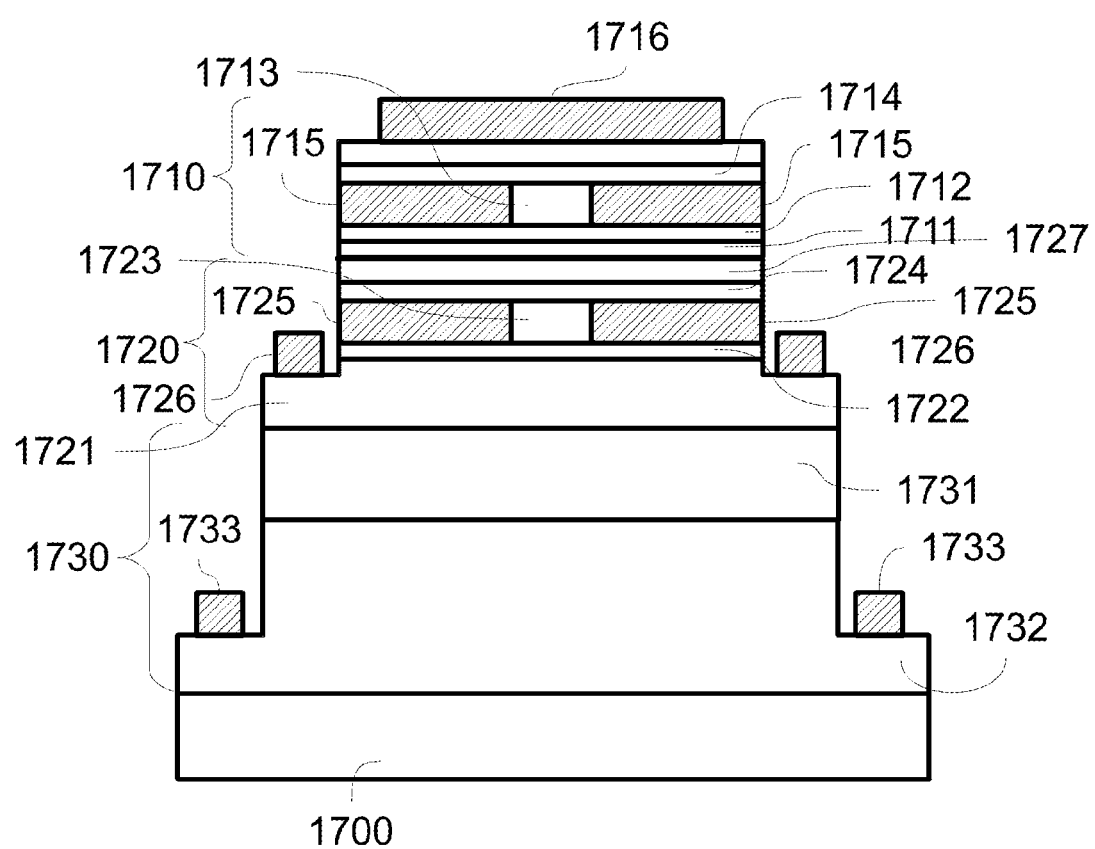
Figures 67, 68:
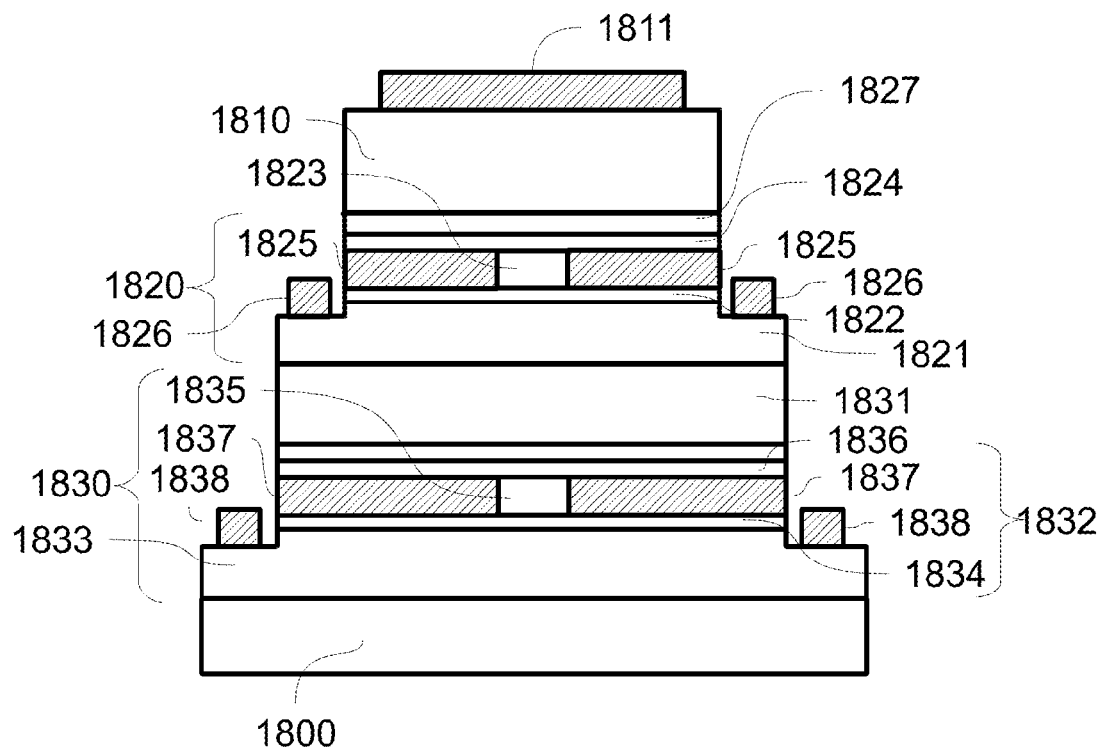
Figure 74:
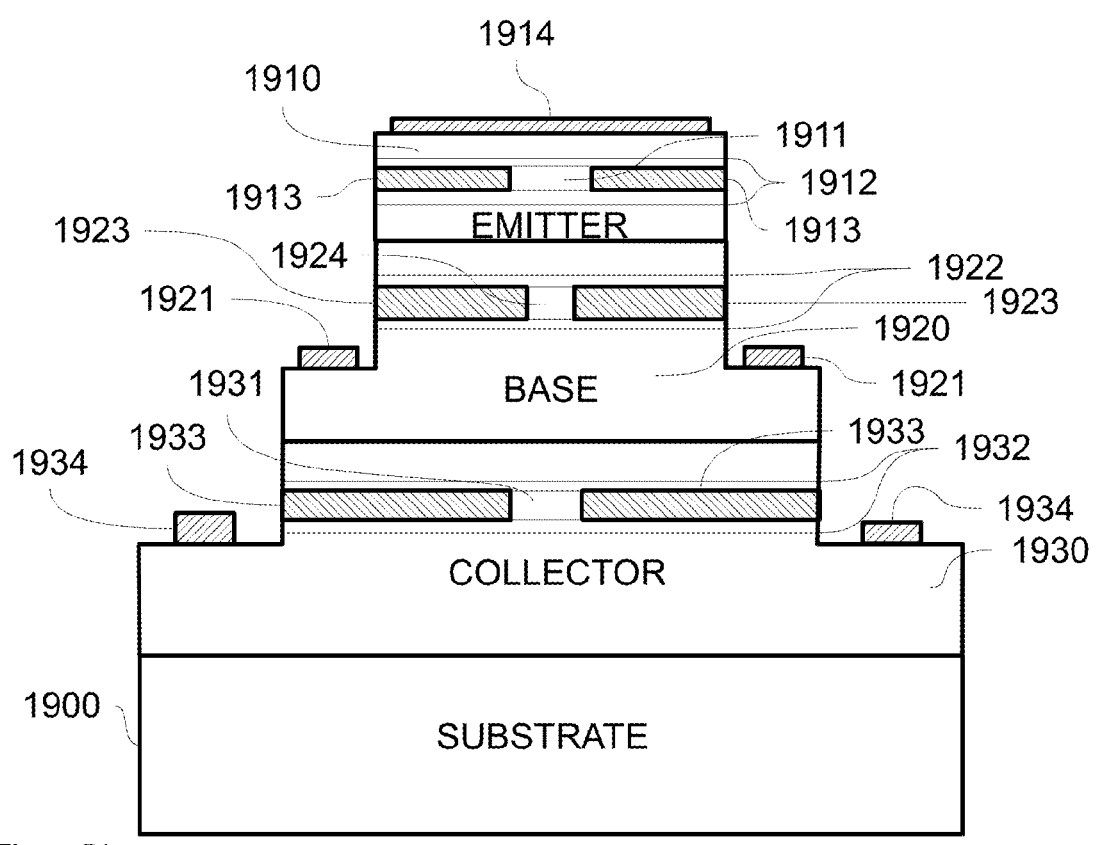
Figure 75:
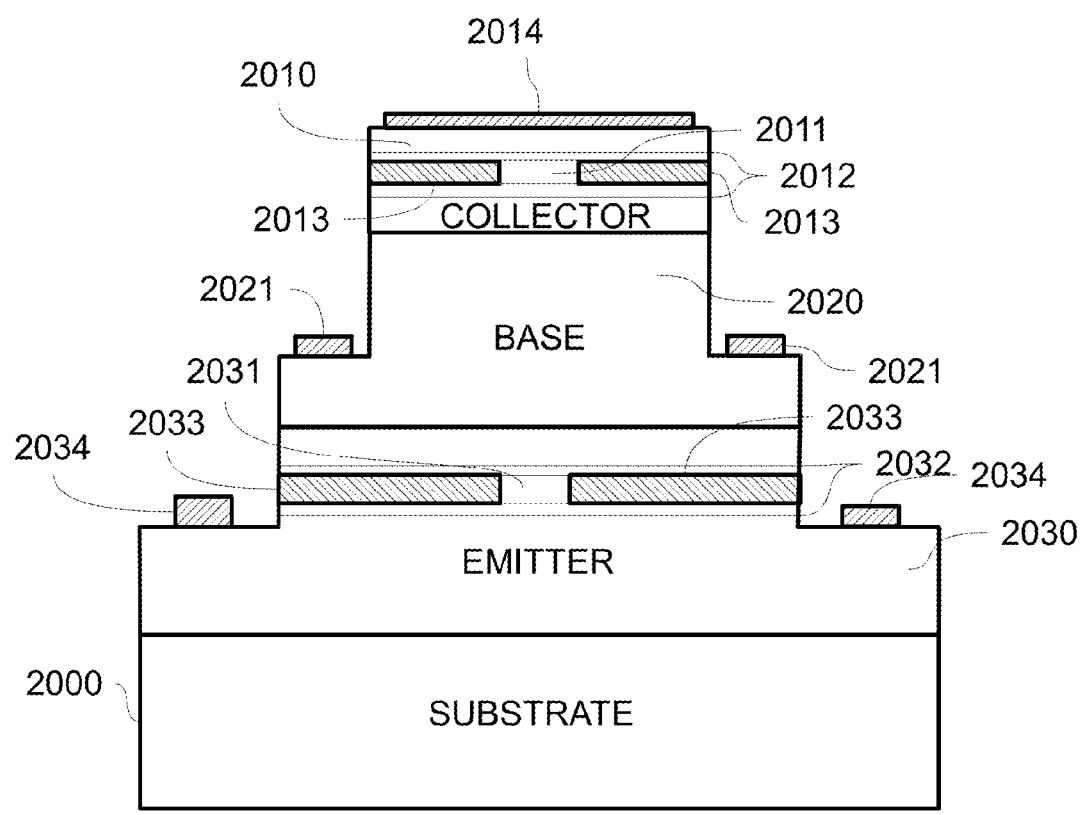

FIG. 41 illustrates an embodiment.
FIG. 42 illustrates an embodiment.
FIG. 43 illustrates an embodiment.
FIG. 44 illustrates an embodiment.
FIG. 45 illustrates an embodiment.
FIG. 46 illustrates an embodiment.
FIG. 47 illustrates an embodiment.
FIG. 48 illustrates an embodiment.
FIG. 49A and FIG. 49B collectively illustrate an embodiment.
FIG. 50 illustrates an embodiment.
FIG. 51 illustrates an embodiment.
FIG. 52 illustrates an embodiment.
FIG. 53 illustrates an embodiment.
FIG. 54 illustrates an embodiment.
FIG. 55 illustrates an embodiment.
FIG. 56 illustrates an embodiment.
FIG. 57 illustrates an embodiment.
FIG. 58 illustrates an embodiment.
FIG. 59 illustrates an embodiment.
FIG. 60 illustrates an embodiment.
FIG. 61 illustrates an embodiment.
FIG. 62 illustrates an embodiment.
FIG. 63 illustrates an embodiment.
FIG. 64 illustrates an embodiment.
FIG. 65 illustrates an embodiment.
FIG. 66 illustrates an embodiment.
FIG. 67 illustrates an embodiment.
FIG. 68 illustrates an embodiment.
FIG. 69 illustrates an embodiment.
FIG. 70 illustrates an embodiment.
FIG. 70A illustrates an embodiment.
FIG. 71 illustrates an embodiment.
FIG. 72 illustrates an embodiment.
FIG. 73 illustrates an embodiment.
FIG. 74 illustrates an embodiment.
FIG. 75 illustrates an embodiment.

VI. DETAILED DESCRIPTION OF A PREFERRED EMBODIMENT

Illustratively, there can be an apparatus comprising, consisting essentially of, or consisting of (depending on application preference), a heterojunction bipolar transistor characterized by current blocking layers. The current flow is restricted, blocked, or confined in the emitter or collector or both by a current blocking layer. The layer can be defined by one of several methods, for example, by selectively etching a layer to partially remove it, or by selectively converting the layer to an insulating material, or by converting the layer to an alternate doping type, or the like.

This patent application incorporates by reference U.S. Pat. No. 5,262,360 entitled "AlGaAs native oxide" issued Nov. 16, 1993, U.S. Pat. No. 5,373,522 entitled "Semiconductor devices with aluminum oxide regions" issued Dec. 13, 1994, U.S. Pat. No. 5,567,980 entitled "Native oxide of aluminum-bearing Group III-V semiconductor" issued Oct. 22, 1996, U.S. Pat. No. 5,696,023 entitled "Method for making aluminum gallium arsenide semiconductor device with native oxide layer" issued Dec. 19, 1997, U.S. Pat. No. 5,581,571 entitled "Semiconductor devices and methods" issued Dec. 3, 1996. The teachings of these United States patents are applicable hereto in that the processing methods of one or more of these United States patents can be used to fabricate a transistor as described herein, altering the processing method as may be desired based on the disclosure herein and particulars of the application desired. Similarly, incorporated by reference is U.S. Pat. No. 6,141,870 (McDermott et al.) entitled "Method for making electrical device" and is applicable herein to illustrate a circuit board, and one or more transistors herein can be mounted on such a circuit board. A transistor embodiment as disclosed herein can be used in integrated circuits, and as discrete components on PC boards. Representatively, a transistor as illustrated herein can be powered for use in a power amplifier, such as that conventionally known but adapted to accommodate the particular heterojunction bipolar transistor on a circuit board in an embodiment as provided herein. Consider applications too in a communications system, such as cellular telephone, which can use one or more, and in such an application. Depending on the desired configuration, the heterojunction bipolar transistor on a circuit board can be a part that uses virtually all the power when one talks on the cellular telephone. A transistor as used herein can also be used in a base station (cellular telephone towers), wireless LAN, radar system, satellite commnications systems, etc. Applications of a transistor as disclosed herein can include vitrually any system that has radio frequency (wireless) transmission. Applications, depending on the use desired for a transistor embodiment herein, can be directed to an application on the circuit level or on the system level.

Figure 1:
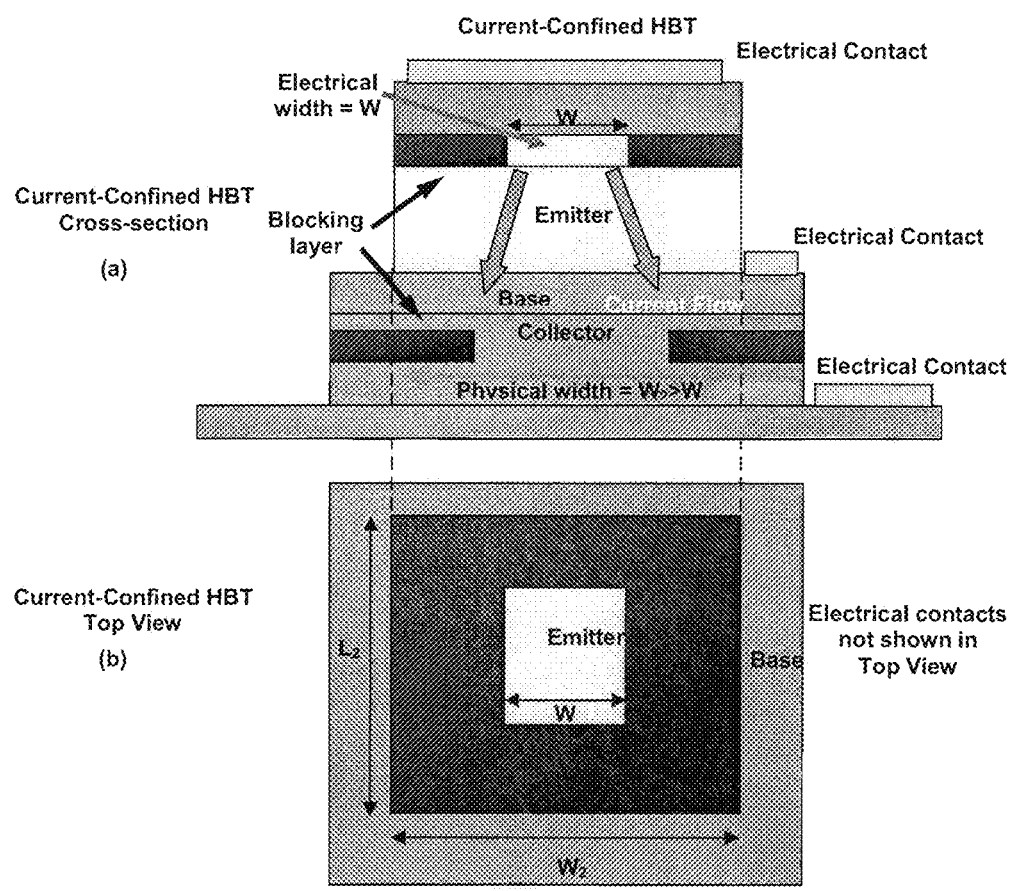

Consider now more particularly the embodiment herein regarding current-confined Heterojunction Bipolar Transistors, noting that the discussion herein is to be viewed as a prophetic teaching. A current-confined heterojunction bipolar transistor can be comprised as a conventional heterojunction transistor, with conventional methods of making and using, but with notable differences: consider the additional feature of a current restricting or blocking layer inserted in either the emitter, the collector, or both emitter and collector. The layer can be produced by using any number of different techniques. One embodiment is illustrated in FIG. 1 for the emitter and collector. The current blocking layer is comprised of an Al-bearing native oxide of a compound semiconductor and has the effect of confining the current away from the edge of the etched mesa.

Device Fabrication Using Native Oxidation

Processing steps for an oxide-based device can be as follows: The emitter, base and collector mesas are defined using wet or dry etches. The emitter oxidation process can begin with a photolithographic patterning and dry etching of $SiN_x$ followed by wet or dry etching to define the mesa. An outline of processing steps for the wet-etched emitter mesa definition of an oxide-defined device is provided below:

1. Surface preparation and clean.
2. Plasma enhanced chemical vapor deposition (PECVD) of $SiN_x$.
3. Photolithography for mesa definition.
4. Plasma etch $SiN_x$.
5. Photoresist removal.
6. Wet etch (9:3:120, $H_3PO_4$:$H_2O_2$:$H_2O$) of InGaAs cap and mesa definition.
7. Oxidation of exposed AlGaAs.
8. Dry etch to remove $SiN_x$
9. Lift-off of Cr—Au or Ti—Pt—Au metallization for contact definition.

The remainder of the process steps can be typical of standard heterojunction bipolar transistors. For illustrative purposes, embodiments of the device structure are described further below.

One embodiment can use native oxide in the AlGaAs—GaAs material system.

Figure 2:
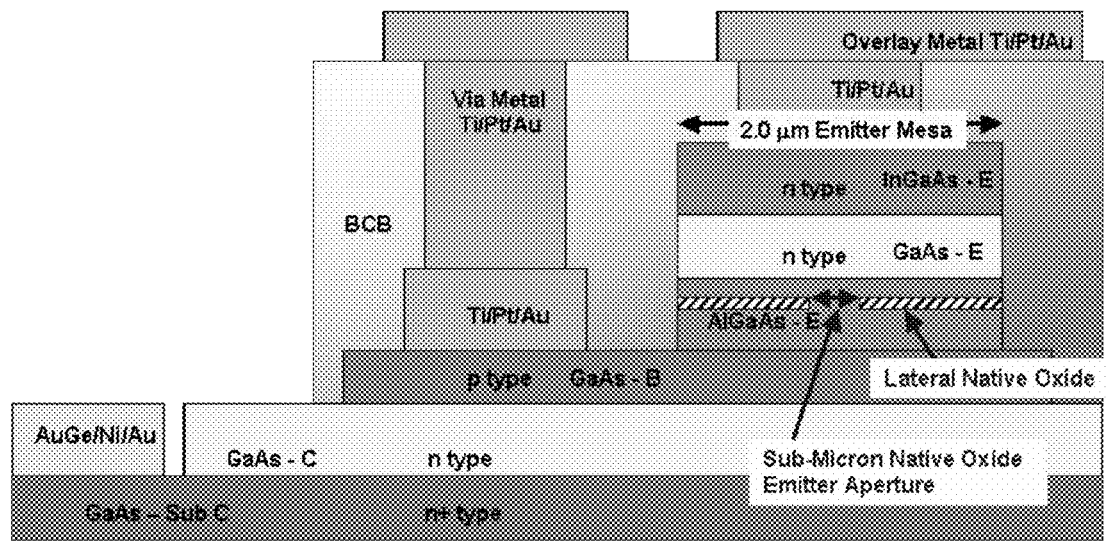

A drawing is shown in FIG. 2.

A native-oxide HBT has increased gain relative to a reference HBT structure without oxidation, particularly as the emitter dimension is scaled down. The DC gain of the reference structure, which was identical to the oxide device with the exception of the native oxide layer, can be 72 for a 5×6 emitter. In contrast, the DC gain can be 205 for the native-oxide-defined HBT with a 0.75 μm confining oxide and the same emitter dimensions, a factor of nearly 3 greater than the unoxidized structure. Another embodiment is directed to double heterostructure bipolar transistors and native-oxide defined InGaP HBTs, such that power amplifiers can be designed and fabricated using native oxide technology.

Consider the following to meet performance goals:
Base doping and thickness
Collector doping and thickness
Oxide layer thickness, composition, and position in the emitter.

Each of these involves trade-offs in device performance. Thinner base layers improve the gain of the device but the base sheet resistance increases as a result, implying higher doping levels. Thicker collectors result in longer collector transit times and slower devices, but with higher breakdown voltages. The emitter oxidation layer has a series of trade-offs. First, the device can have a high enough Al composition to oxidize in a reasonable time. Second, a high Al composition increases the resistance of the emitter, suggesting a thin, heavily doped tunnel barrier, yet the tunnel barrier should be thick enough to achieve a reasonable oxidation rate.

With regard to suitable epitaxial structures that would meet these design conditions, consider (for example) a base sheet resistance of 240 Ohm-sq, a 700 Å thick C-doped ($4\times10^{19}$/$cm^3$) base, and a collector thickness and doping level of 5000 Å and $1\times10^{16}$/$cm^3$, respectively. In general the base thickness and doping targeted a gain of 100, with a collector thickness that targeted a $BV_{CBO}$>15V and an $f_T$>50 GHz. The AlGaAs oxidation layer was designed with a thickness of 20 nm and an Al composition of x=0.95. In addition, the layer can be heavily doped ($5\times10^{18}$/$cm^3$) in order to assist in tunneling and reduce the overall emitter resistance. Several designs are possible regarding placing the oxidation layer at different positions in the emitter, e.g., one close to the base layer, another at the top of the emitter, etc.

Epitaxial Wafer Growth

The structures of the devices are shown in FIGS. 68-69. The structure can be grown by epitaxial crystal growth techniques such as metal organic chemical vapor deposition or molecular beam epitaxy, for example. The materials of the epitaxial structure may be comprised of elements from columns three and five of the periodic table of elements (III-V compound semiconductors) and may be comprised of binary compound semiconductors such as GaAs, GaP, GaN, GaSb, AlN, AlAs, InP, or similar materials, ternary compound semiconductor alloys such as AlGaAs, InGaP, GaAsSb, InGaAs, InAlAs, AlGaN, or similar materials, quaternary compound semiconductor alloys such as AlGaAsP, AlInGaP, InGaAsP, AlGaAsSb, AlGaInN, or similar materials, or quintinary compound semiconductor alloys such as InAlGaAsN, InAlGaAsP, InAlGaPN, AlGaAsPSb, or similar materials.

Graded AlGaAs layers of 150 Å were placed between $p^+$ GaAs base and n-AlGaAs emitter layers in order to minimize the conduction band offset between emitter and base junction interface. The conduction band offset could also form electron barriers between $n^+$ GaAs contacts and n-AlGaAs emitters. Graded 200 Å n-AlGaAs can be inserted between contact and emitter layers for Structure 1 and Structure 2. Highly doped n-type 20% AlGaAs ($5\times10^{18}$/$cm^3$) is used for Structure 2 in order to reduce the conduction band spike between contact and emitter layers. These graded layers resulted in $V_{BE}$ of 1.09V (@1.78 A/$cm^2$) for all three structures.

Mask Design and Device Fabrication

Figure 3:
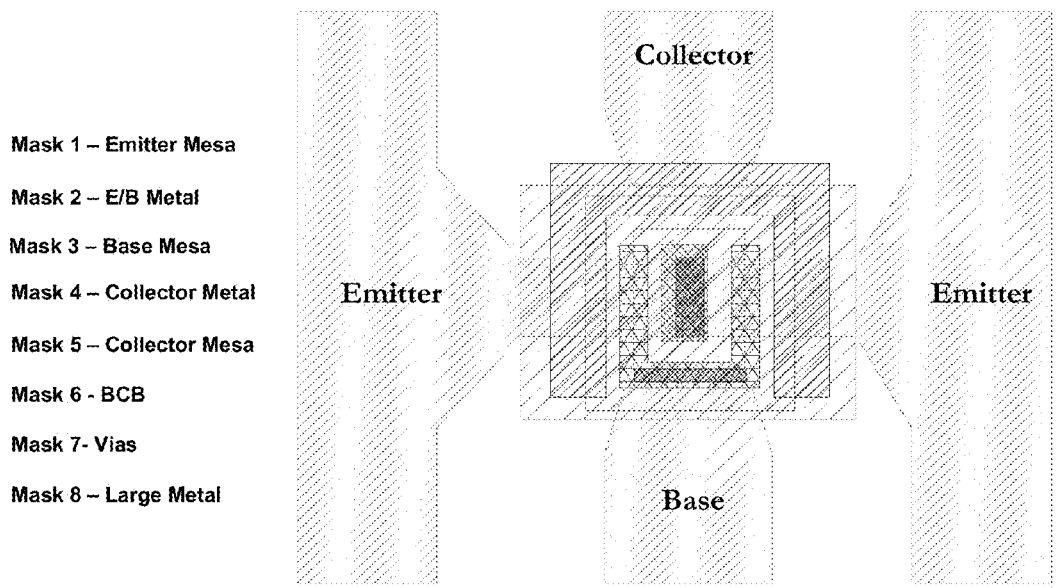

A native-oxide defined HBT process can use 8 mask levels as shown in FIG. 3 below. The process is based upon wet-etched mesas for the emitter, base, and subcollector isolation. The mask layout includes transmission line measurement (TLM) test structures for evaluating specific contact resistance, an array of large-area DC devices for material evaluation, and RF devices for high-frequency testing, as well as short- and open-circuit contact pads for determining RF parasitics and for extracting high-speed HBT performance.

An outline of the typical process levels is shown below:
Mask 1—Emitter Mesa Definition and Oxidation
Mask 2—Emitter/Base Metal Lift-Off (Cr/Au)
Mask 3—Base Mesa Definition
Mask 4—Collector Metal Lift-Off (Ge/Au/Ni/Au)
Mask 5—Collector Mesa Definition
Mask 6—BCB passivation Mask 7—Etch Vias
Mask 8—Overlay Metals (Cr/Au)

Figure 4:
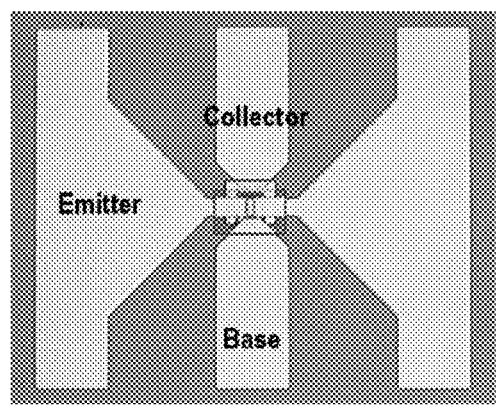
Figure 4:
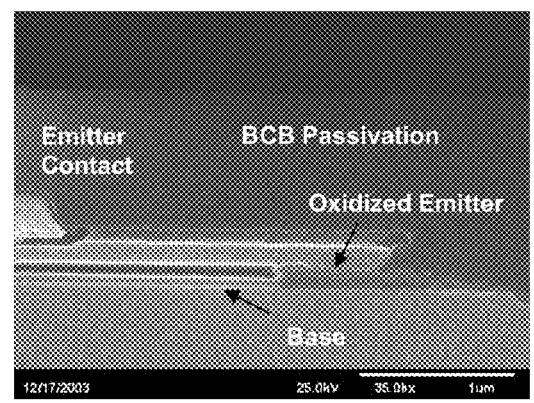

A photomicrograph of an RF oxide-defined HBT is shown in FIG. 4 below.

Oxide Calibration

Figure 5:
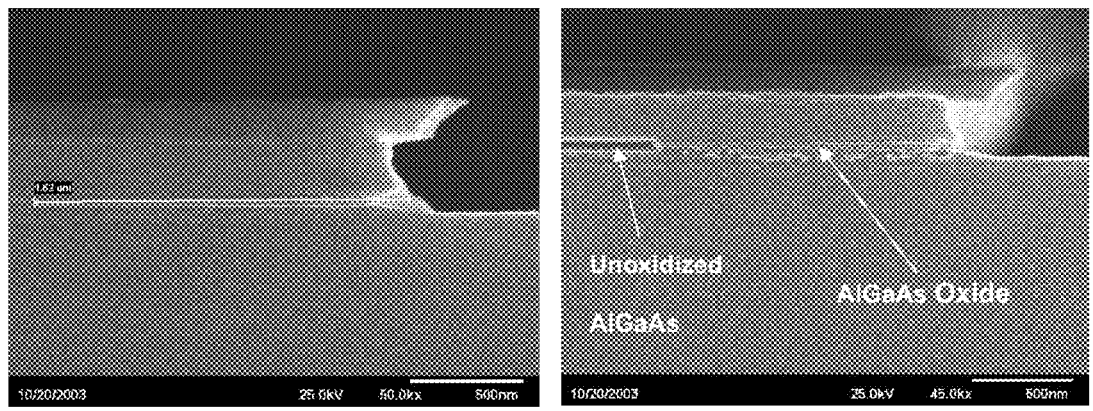

The oxidations can be calibrated on HBT structures. The oxidation for the devices reported can be performed at 390° C. for 50 minutes which can result in a 0.75 µm lateral oxide thickness. FIG. 5 shows a scanning electron microscope (SEM) cross-section of an oxidized emitter pursuant hereto.

Figure 6:
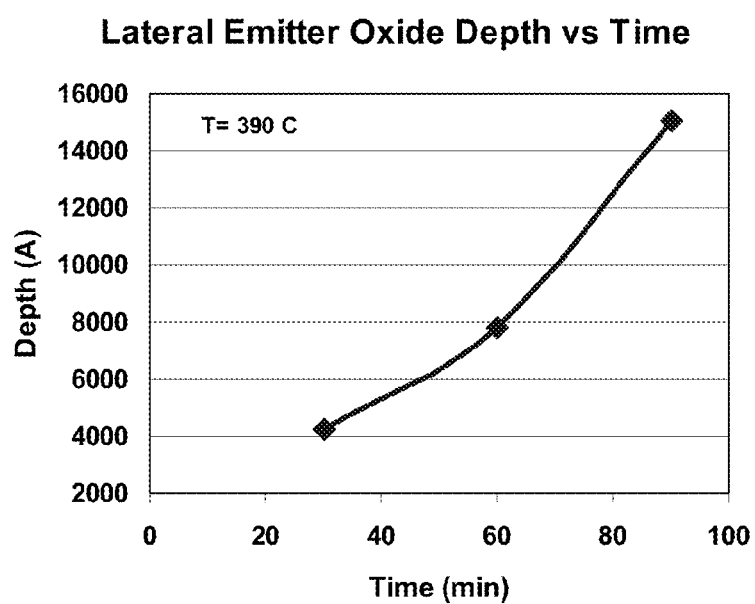

FIG. 6 below shows the oxide calibration data. The lateral oxidation rates for T=390° C. are such that submicron emitter geometries can be achieved using large-scale photolithography. This can be applied to improve device manufacturing yields for large-scale RF integrated circuits.

Figure 7:
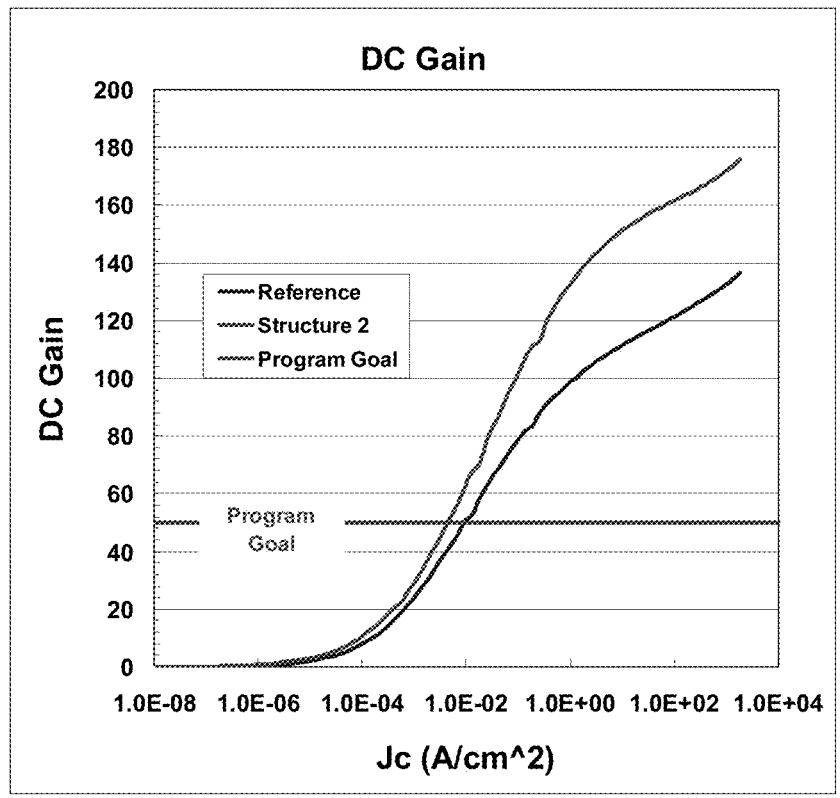

FIG. 7 shows the DC gain device results at 1 kA/cm². Compare an example reference structure that exhibits a gain of 136 with the oxide structure that exhibits a gain of 176. The reference structure is identical to the oxide structure except for the removal of the layers used in the oxidation step. Otherwise the reference structure is identical to the oxide structure. The DC gain of the oxidized device is 30% higher than that of the reference structure device.

The $BV_{CBO}$=18.5V for all structures, because it is determined by the thickness and doping of the collector, which is identical in all three structures.

Device Characterization—DC Gain Performance

Figure 8:
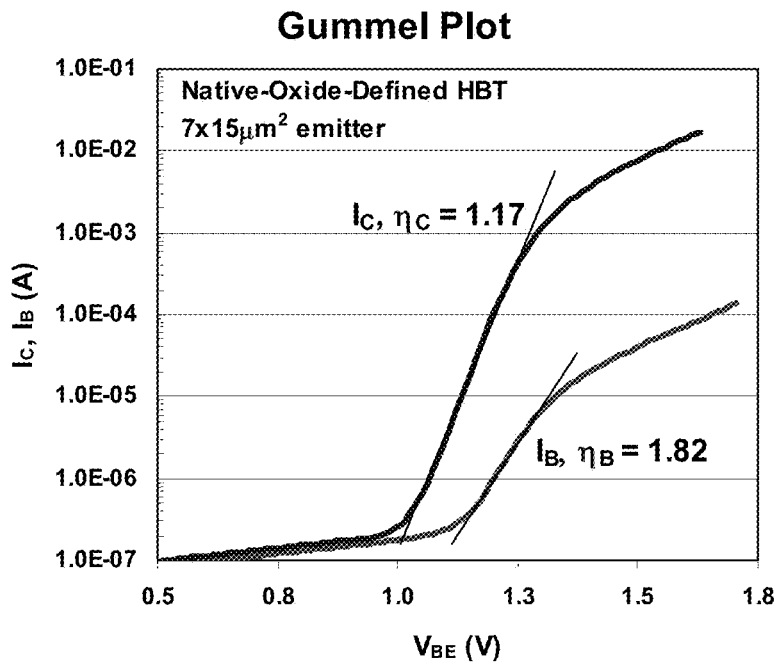

Oxide aperture HBTs can be measured for base and collector current characteristics and gain using Gummel plots. FIG. 8 shows the Gummel plot for a native-oxide-defined HBT with an emitter dimension of 7×15 µm². The ideality factors of the base and collector currents can be calculated to be 1.82 and 1.16, respectively.

Figure 9:
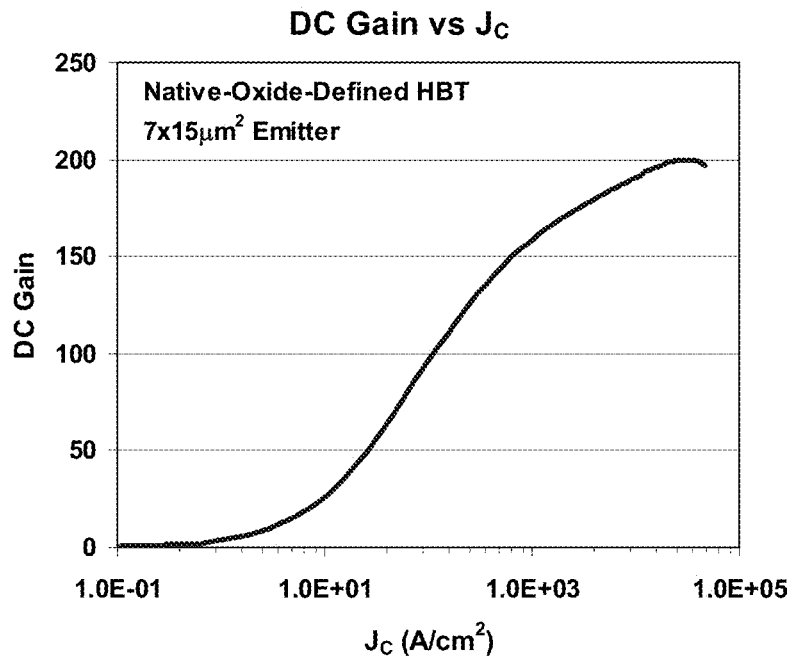

The DC gain versus collector current density for this device is shown in FIG. 9. The maximum gain for this device is 200.

Figure 10:
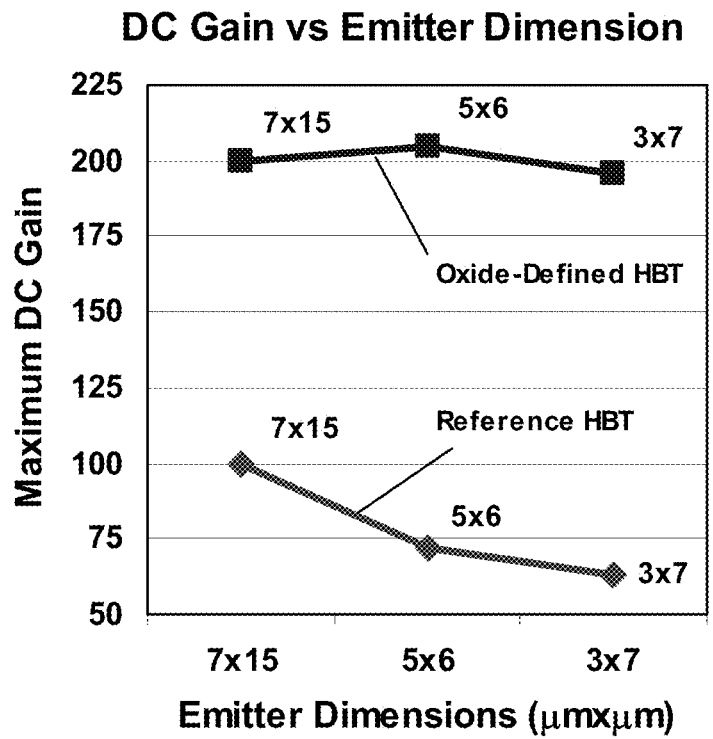

A measure of the effect of the oxide on device performance is behavior of gain as the emitter dimensions are decreased. FIG. 10 shows the maximum DC gain of the oxide-defined HBT and the Reference HBT as the emitter dimension is decreased from 7×15 to 3×7 µm². For example, the Reference structure has a 3×7 micron physical emitter dimension (width×length). The Oxide-Defined structure has a 3×7 micron physical emitter dimension (width×length) with a 0.75 micron deep lateral oxidation. This yields a 1.5×5.5 micron effective electrical emitter dimension (width×length) for the oxide device. The oxide aperture devices can be fabricated from the same process run, and as a result have a lateral oxide length of 0.75 µm. As can be seen in the figure, the DC gain of the Reference device is initially half that of the Oxide-Defined HBT, and decreases with decreasing emitter geometry. In stark contrast, the Oxide-Defined HBT gain remains constant at ~200 as the device shrinks. This is likely due to the fact that the oxide aperture reduces the effective emitter area and directs current away from the exposed emitter mesa surface, thereby reducing the surface recombination at the emitter mesa surface. In addition, the oxide likely limits the emitter crowding effects normally seen in HBTs.

$I_C$ vs $V_{CE}$ Characteristics

The general transistor characteristics of the oxide-defined HBTs can be studied. FIG. 11 compares the $I_C$ vs $V_{CE}$ characteristics for a 7×15 µm oxide and reference HBT. The oxide-defined and reference structures both exhibited large offset voltages, exceeding 0.5V. Because the same offset voltage can be measured in both the oxide and base structures, this voltage is likely not due to the Al tunnel barrier in the oxide structure. A design modification to the emitter-base junction can reduce the offset voltage, as will using a double hetero-structure HBT design. Material growth may relate to the emitter-base junction grade. FIG. 12 shows the offset voltage and turn-on resistance, $R_{on}$ (=$dI_C/dV_{CE}$) versus emitter area.

An indication of the quality of the oxide devices can be the DC gain performance as a function of emitter size. The reference structure exhibited a reduction in maximum current gain of approximately ½ for that of a large-area 75×75 µm emitter versus a 3×7 µm emitter. The DC gain of the oxide devices can show no decrease in gain as the emitter size is reduced. The superior DC gain performance of the oxide-defined HBTs at small emitter geometries is a strong indication of the efficacy of the oxide in confining the current to the center of the emitter mesa, thereby reducing the leakage currents normally encountered at small emitter dimensions.

RF

The frequency performance of the reference structure of $f_T$=50 GHz with a measured $f_{max}$=43 GHz on a 3×7 µm² emitter. This suggests the design of the collector thickness for achieving the desired speed.

The frequency response versus collector current density of several sizes of oxide-defined HBTs is shown in FIG. 13. The maximum $f_T$=36 GHz with a measured $f_{max}$=31 GHz on a 7×15 µm² emitter. The oxide HBTs did not achieve the targeted speed and exhibited a reduced frequency response with reduced emitter dimension. The trend observed in the oxide devices was opposite the usual trend, which is a speed increase for smaller emitter geometries. The likely cause of this cutoff frequency reduction is increased emitter resistance. This would be consistent with the results of FIG. 12, which show an increase in $R_{on}$ with reduced emitter area.

InGaP HBT

HBT Design

A drawing of the native oxide HBT concept as applied to the emitter-base junction is shown in FIG. 14, below.

Lateral Oxide Layer Design

The epitaxial structures can be designed with particular attention to the use of lateral AlGaAs oxidation in heterostructures. Specifically, in native-oxide HBT designs, the insertion of a high Al-composition AlGaAs (mole fraction, x>0.9) tunneling layer in the emitter structure can be applied without causing a significant increase in overall series resistance of the device. There may be an increase of only 10% in the emitter-base-collector series resistance due to the insertion of the AlGaAs tunnel barrier. This suggests that there is some design flexibility in the structure of the oxidation layer. The resulting device can exhibit an overall gain of nearly 3 times that of a reference structure without the oxidation layer. A trade-off may exist in the design of the oxidation layer between the oxidation rate and the tunneling rate. Specifically, as the Al composition is lowered, the tunneling can be increased and the oxidation rate can be reduced. In addition, as the thickness of the layer increases up to ~1000 Å the oxidation rate increases dramatically. As a result, the oxidation layer can be optimized for high-power performance. The emitter resistance increase due to the oxidation layer may be optimized to provide a ballast resistor to help prevent thermal runaway in high power devices.

Device Fabrication

Oxidation of AlGaAs

Oxidation of III-V semiconductors is more complex than that of Si because of the nature of the compounds being oxidized. Among the parameters for AlGaAs oxidation are:

Temperature.
$H_2O$ flow rate.
Al molar fraction.
Lateral oxidation layer thickness.

Oxidation of AlGaAs heterostructures can be sensitive to heterointerface and strain effects, and in particular the oxidation rate of AlGaAs decreases as the Al mole fraction is reduced. This allows selective oxidation in heterostructures in the lateral direction as well as oxidation termination layers to be designed into vertical oxidation structures. Because of the ability to grow complex heterostructure devices in AlGaAs, there are two separate dimensional degrees of freedom associated with III-V oxidation: vertical and lateral. These two types of oxidation allow an extraordinary degree of freedom in designing device structures.

Device Design

Epitaxial Wafer Design and Growth

Epitaxial wafer design structure is shown in FIGS. 70 and 70A. The structure is a InGaP emitter HBT, with an additional set of layers for native oxidation. Layer 6 provides a buffer layer between the oxidation layer and the InGaP emitter. Layers 7 and 9 are graded to allow for a gradual termination of the oxidation front as it proceeds laterally into the material. Layer 8 is the 500-Å-thick AlGaAs (x=0.6) oxidation layer. There can be several trade-offs involved in the choice of AlGaAs composition. The lateral oxidation rate increases with increasing Al mole fraction and layer thickness. The increased layer thickness increased the emitter resistance. Also, for AlGaAs compositions near the direct-indirect transition at x=0.45, the ionization energy of the donor species increases dramatically, causing a dramatic reduction in effective doping level. The doping levels of either x<0.35 or x>0.6 are suitable for the oxidation layer.

Mask Layout

Figure 15:
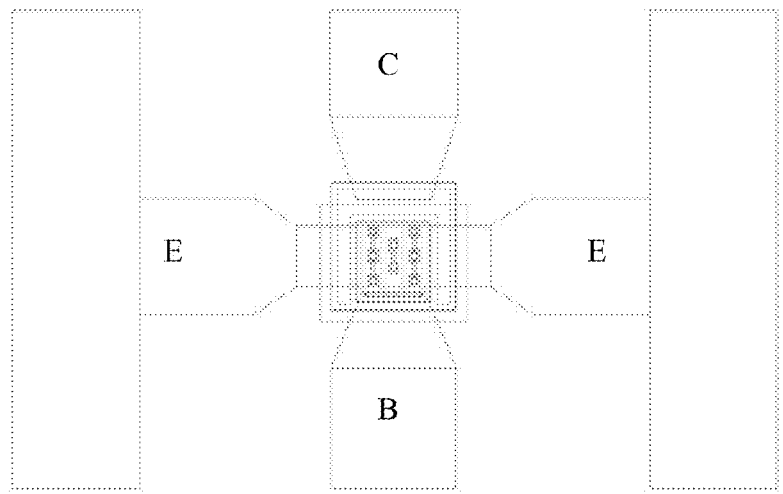

The mask layout for a native-oxide HBT process can use eight mask levels as shown in FIG. 15. The design can use structures with the native oxide to fabricate a series of segmented emitter fingers to test the thermal and electrical performance of the devices for optimal power amplifier performance.

The mask design features are indicated below:

Masks include structures for measuring specific contact resistances and sheet resistances for emitter, base and collector.

Segmented emitter design allows for more efficient heat dissipation.

HBTs contain 3 emitter fingers with groupings of two or three emitters on each. Emitters are staggered to prevent additive heating.

Segmented emitter areas vary from 96 to 176 $\mu m^2$. The smallest emitters measure 3×4 $\mu m^2$, while the largest measure 4×5.5 $\mu m^2$.

Both high-speed and DC devices were fabricated.

Wet-etched mesa design using BCB for planarization.

Thermal Simulations

Thermal device modeling can be carried out for individual HBTs. From these simulations, it appears that using oxide-defined apertures improves the thermal performance of oxide-defined HBTs compared with conventional HBTs, perhaps because there is a larger heat conduction path from the emitter to the substrate, which is attached to a heatsink. This work used a free thermal simulation package (Quickfield) to perform two dimensional models with a limited number of nodes. This model is somewhat similar to a cross-section through an infinitely long HBT. The result was then corrected for finite device length to estimate the temperature change in an actual HBT.

Figure 16:
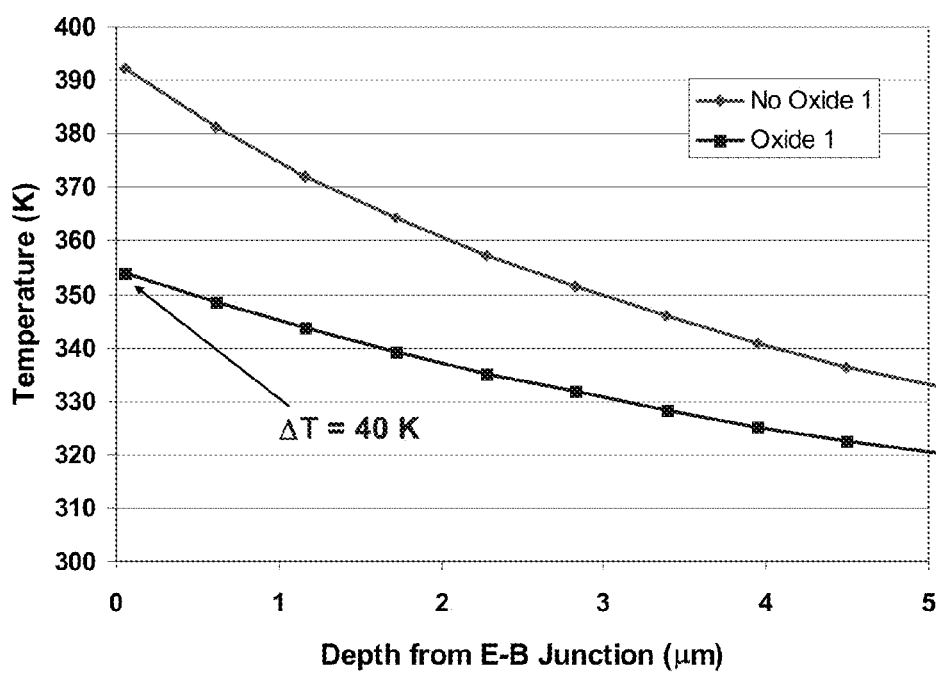

FIG. 16 shows the data from thermal simulations that compare the heating of a conventional HBT (no oxide) and an oxide-HBT. The data indicate that the junction temperature rise can be ~40% less in the oxidized HBT. In the simulation the oxide-HBT emitter area is twice that of the unoxidized sample.

Figure 17:
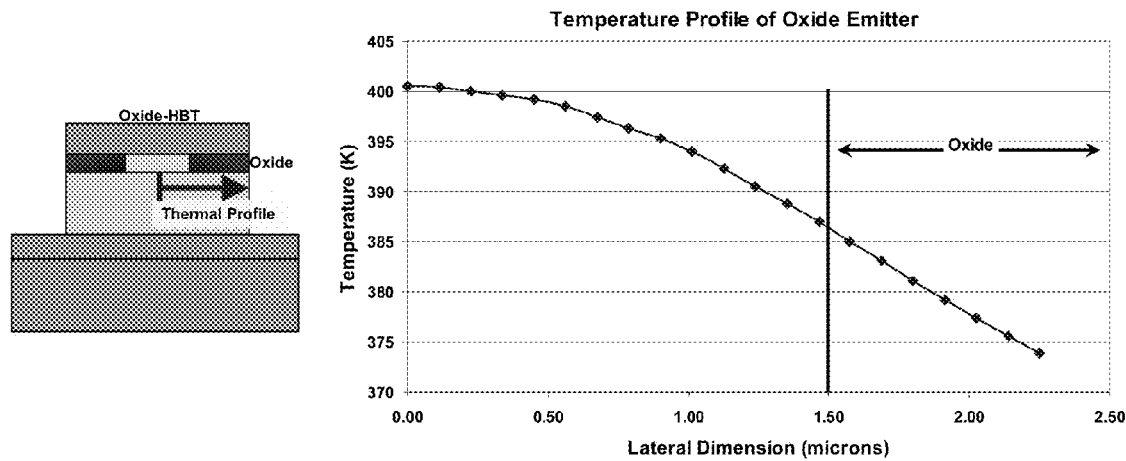

FIG. 17 shows how well the heat spreads in the emitter material blocked by the oxide. The oxide-HBT was simulated using a 2-D thermal simulator. The temperature profile was taken at the emitter-base junction from the center of the mesa to the edge. The vertical line indicates the position of the oxide relative to the mesa center (the mesa center is set as position 0 $\mu m$).

Figure 18:
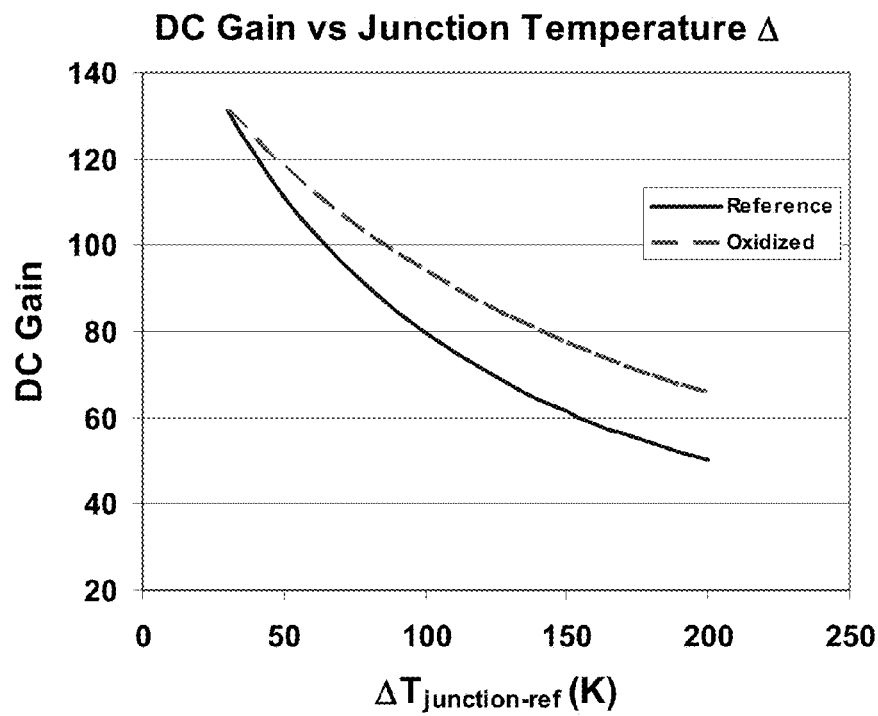

The effect of the temperature reduction on DC current gain in the oxide-HBT versus a conventional HBT can be calculated as shown in FIG. 18. The oxide-HBT exhibits a consistently higher gain than the conventional (non-oxide) HBT.

Device Fabrication

Oxidation

Figure 19:
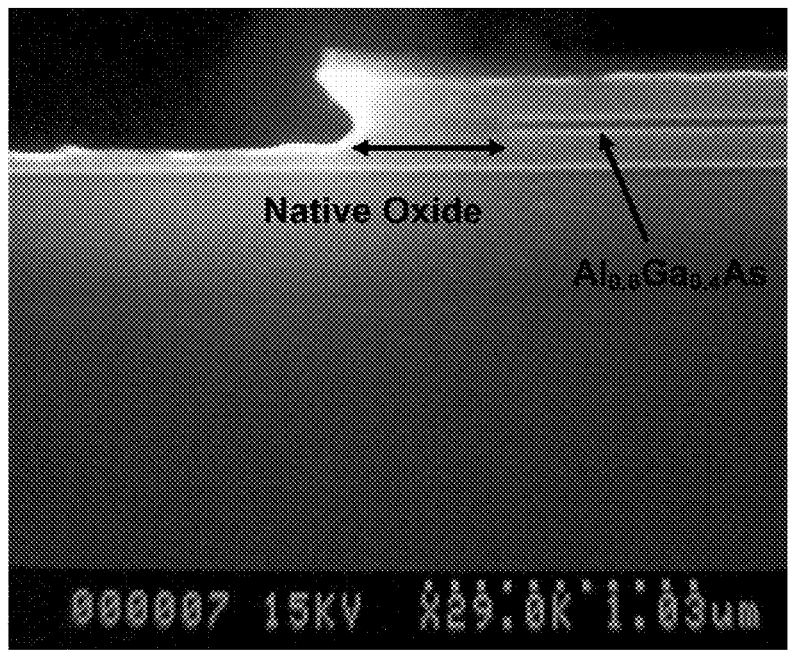

The oxidations can be performed in an oxidation furnace. The samples can be prepared by depositing a $SiN_x$ layer for surface passivation, followed by a 20 $\mu m$ stripe definition and wet etching using a 1:8:80 solution of $H_2SO_4$:$H_2O_2$:$H_2O$. The samples can be oxidized in an $H_2O$:$N_2$ ambient at temperatures in the range 475-525° C. The oxidation duration can range from 60 min to 180 min. FIG. 19 below shows an SEM cross section of an oxide-defined HBT after oxidation at 500° C. for 120 min. The extent of the oxide is 0.6 $\mu m$ form the etched emitter mesa edge. The oxidation proceeded too slowly at 475° C. for a practical oxide-defined HBT device structure. The oxidations at 525° C. showed material degradation at the InGaAs cap surface. This is a partial result of the lattice mismatched InGaAs cap used for low resistance contact purposes. The lattice-relaxed surface is more prone to degradation and oxidation at higher temperatures. This resulted in apparent free In at the oxide-semiconductor interface. A temperature of 500° C. can be selected for the device fabrication.

Device Characterization Results

Oxidized Material

Figure 20:
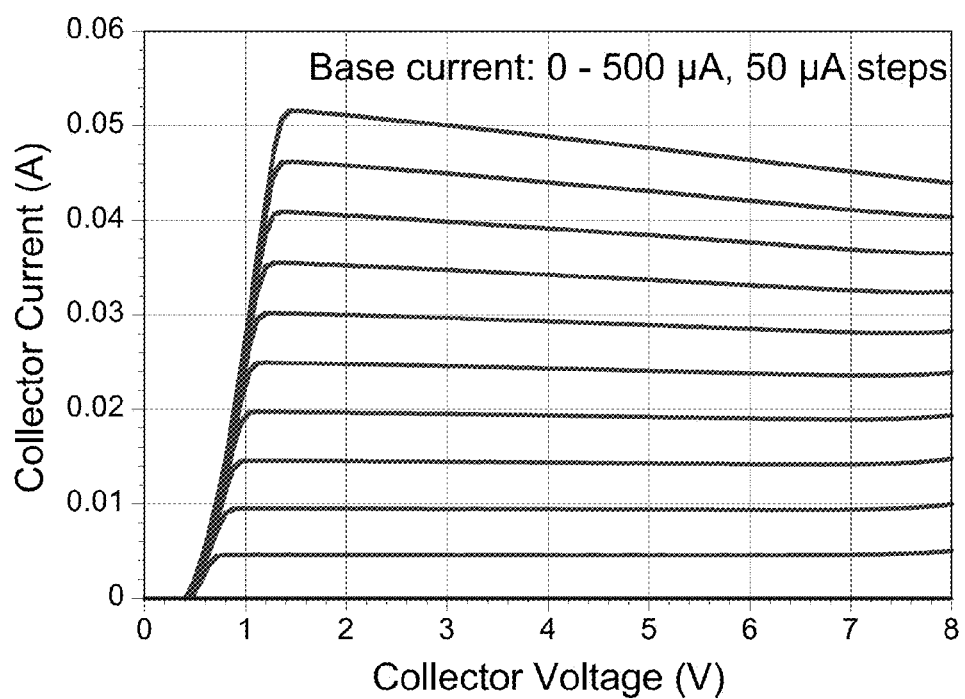
Figure 21:
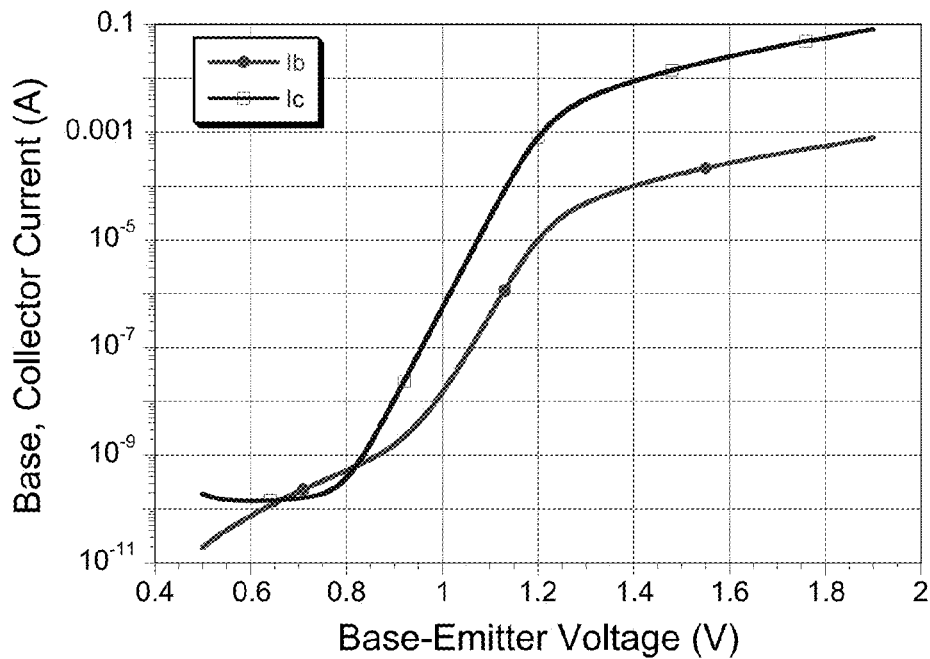

An oxide HBT device has data illustrated below. The sheet resistances and specific contact resistances of the emitter, and collector can be measured from the transmission line test patterns:

base: 492 ohm/sq., 6.98e-7 ohm-$cm^2$
emitter: 44 ohm/sq, 3.01e-6 ohm-$cm^2$
collector: 12 ohm/sq, 1.36e-6 ohm-$cm^2$ Collector current (IC) versus Collector Emitter voltage (VCE) characteristics are illustrated in FIG. 20 for a 40 $\mu m^2$ emitter oxide-defined HBT. The Gummel plot for this device is shown in FIG. 21 below. The ideality factors of the base-emitter and base collector junctions were:

Base-emitter ideality factor: 1.13
Collector-base ideality factor: 1.01

These data indicate good integrity at the junctions post oxidation (500° C., 150 min).

Figure 22:
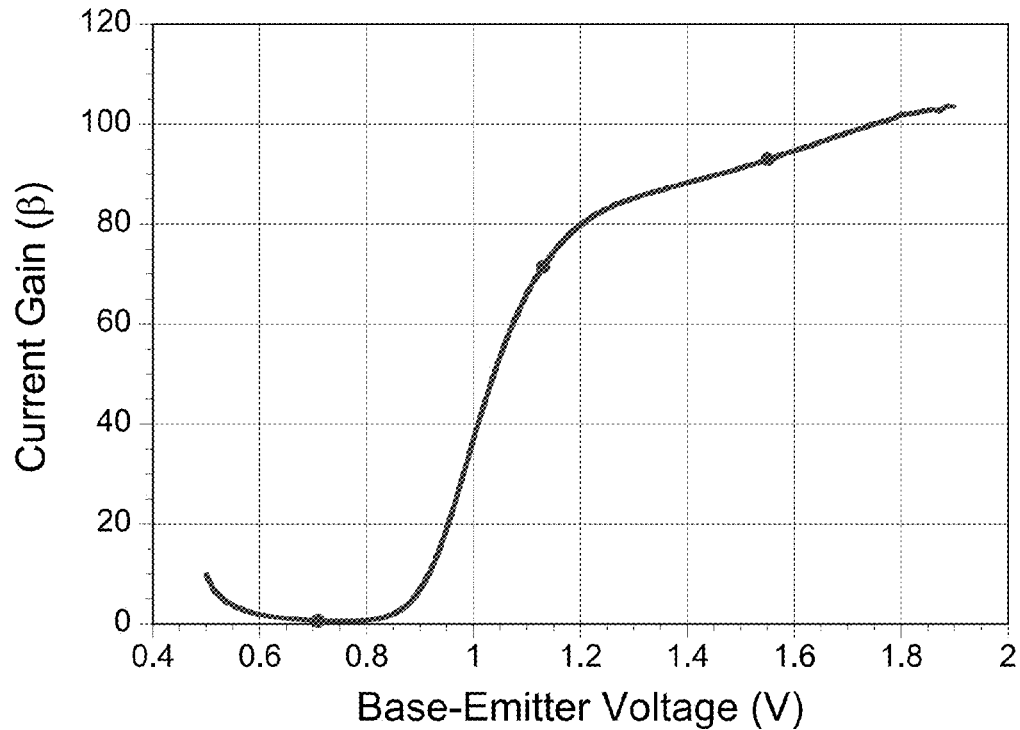

FIG. 22 shows the DC gain as a function of base-emitter voltage. The maximum DC gain for this example is β=103 before device heating causes rollover.

Figure 23:
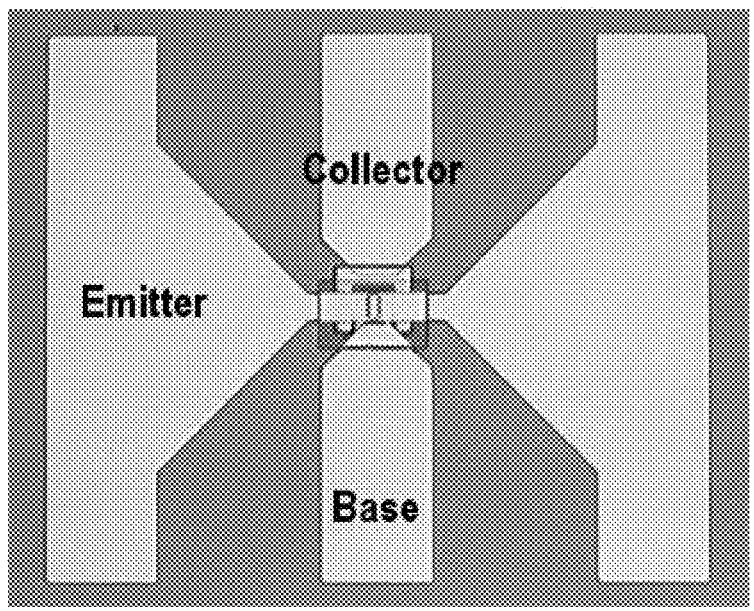
Figure 24:
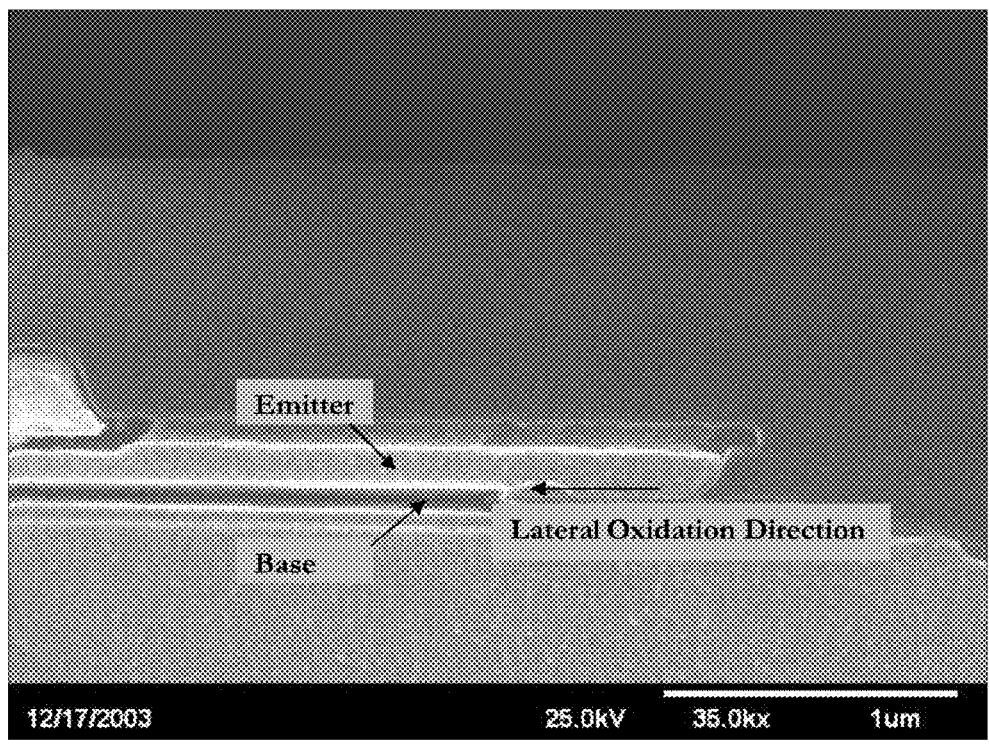
Figure 25:
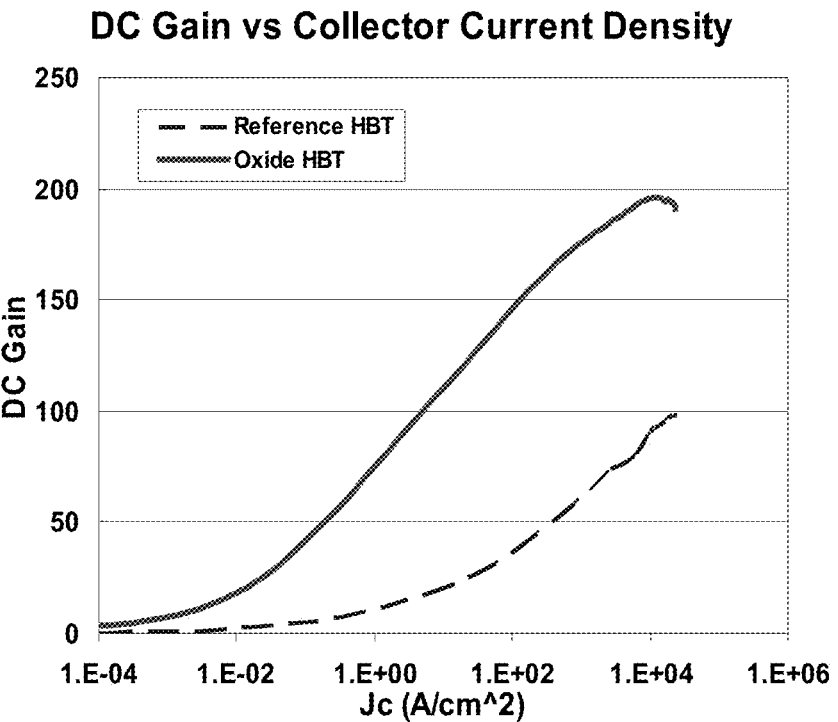
Figure 25:
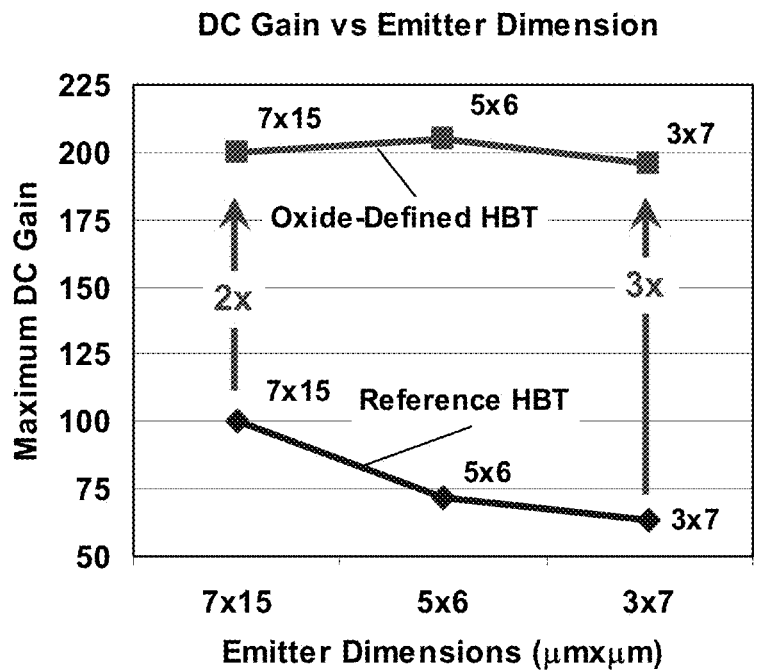

FIG. 23 shows a photograph (magnification 200×) of an oxide HBT device structure after fabrication. FIG. 24 shows a scanning electron microscope image of the application of lateral oxidation to the emitter mesa of an HBT. The resulting devices have show dramatically improved gain characteristics as a result of the current blocking provided by the oxide. The oxide prevents current flow at the etched surface of the semiconductor and as a result the gain characteristics are improved. FIG. 25 below shows the DC gain comparison between an oxide-defined HBT and a reference HBT. The two devices are substantially identical except for the laterally oxidized emitter aperture. The oxide HBT can be a gain that is approximately 2.8× that of the reference device at a current density of 1.3 kA/cm².

Segmented Oxide Emitter

High-power HBTs can use a multi-finger emitter structure to reduce the heating of the device from the high current density in the emitter-base junction. The oxide can be used in a simple, manufacturable method to extend this technique into a second dimension, segmenting the emitter along the length of each finger as shown in FIG. 26 below. This design can increase the power output and efficiency of the HBT in a simple and reliable manner by distributing the heating in 2-dimensions instead of the 1-dimensional spreading of conventional designs.

In the oxide-segmented emitter, the width of each emitter finger is varied along the length. The oxide layers can be such that the oxide will block the current flow in the narrow sections, limiting current flow and heating to the 2-dimensional grid of emitters. The emitter spacing and size can be optimized to reduce the heating effects of high current densities. FIG. 27 shows optical micrographs of an oxide-defined HBT (a) after oxidation at 500° C., 127 minutes, and (b) post emitter-base-collector metallization. The emitter 'dots' are 3×4 μm²; The legs between emitter apertures are 6 long and 1.5 μm wide. The lateral oxide extends ~0.85 μm from each side, eliminating the current flow through the connecting emitter legs.

and 28 shows optical micrographs of a completed oxide-defined RF HBTs of various emitter geometries. Emitter areas varied from 96 to 176 μm². The RF pad width is 75 μm.

Lateral Oxide Layer Design

The epitaxial structures can be designed with particular attention to the use of lateral AlGaAs oxidation in heterostructures. Specifically, in native-oxide HBT, the insertion of a high Al-composition AlGaAs (mole fraction, x>0.9) tunneling layer in the emitter structure can be applied without causing a significant increase in overall series resistance of the device. Data indicates an increase of 10% in the emitter-base-collector series resistance due to the insertion of the AlGaAs tunnel barrier. This suggests that there is some design flexibility in the structure of the oxidation layer. A trade-off may exist in the design of the oxidation layer between the oxidation rate and the tunneling rate. Specifically, as the Al composition is lowered, the tunneling in increased and the oxidation rate may be reduced. In addition, as the thickness of the layer increases up to ~1000 Å the oxidation rate increases dramatically. As a result, the oxidation layer can be optimized for high-power performance. The emitter resistance increase due to the oxidation layer may be optimized to provide a ballast resistor to help prevent thermal runaway in high power devices.

InP-Based, Oxide-Defined HBT

Two technologies that, when combined, can enable the practical manufacture of high-yield, high-speed InP-based ICs. These technologies are (1) the native-oxide defined AlGaAs HBT, and (2) the lateral oxidation of InAlAs. FIG. 29 shows the concept as applied to InP-based HBTs. This can use high-yield lithography (3 μm) and achieve submicron emitter geometries with next generation performance.

InP HBT Structure Design

Figure 30:
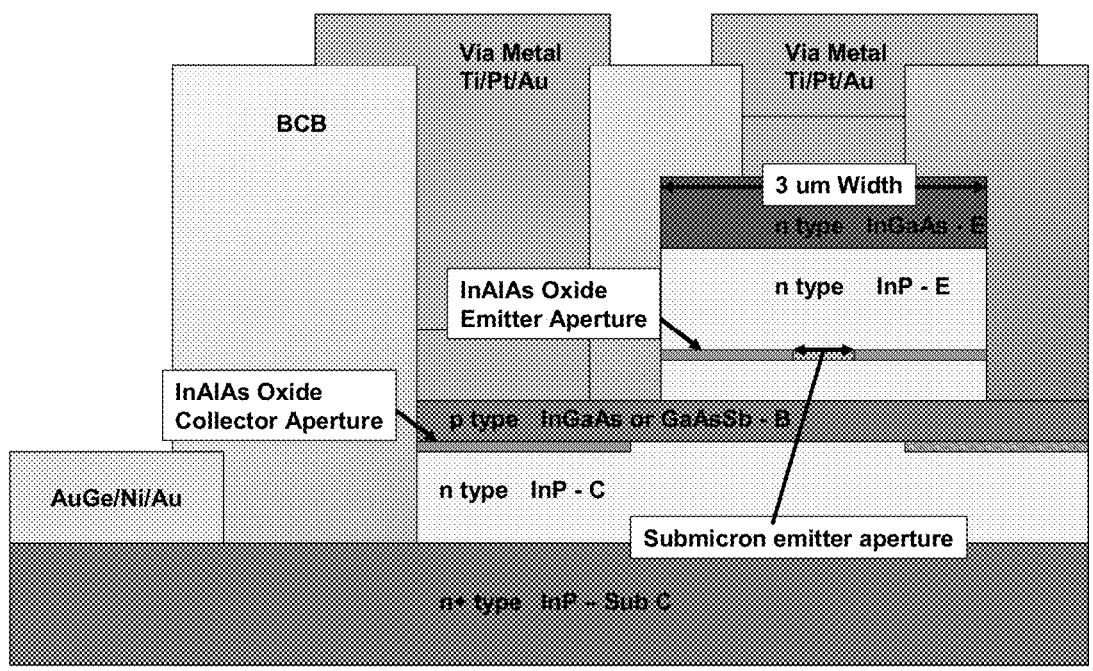

The designs to be considered are an initial structure with the lateral oxide aperture in the emitter layer and a GaAsSb base. The first devices can unoxidized to provide baseline performance which will then be compared to oxidized devices. A second structure can include the lateral oxide aperture in both the emitter and the collector with a GaAsSb base. The devices illustrate the merits of a double HBT structure and of a collector oxide aperture. One embodiment can be grown to have a lateral oxide aperture within the emitter with an InGaAs base. This structure provides an alternative for the GaAsSb materials, e.g., should the oxidation temperatures prove too high and lead to material degradation through Sb migration. FIG. 30 shows an embodiment with oxide apertures in both the emitter and the collector.

The oxide aperture layer for all three structures can be addressed with InAlAs. The approach to obtain increased integration scales can use photolithography for 3 μm or greater emitter widths and then achieve a sub-micron dimension by partially oxidizing the InAlAs layer. The resulting device can have next generation, submicron emitter performance.

Device Process Development

Figure 31:
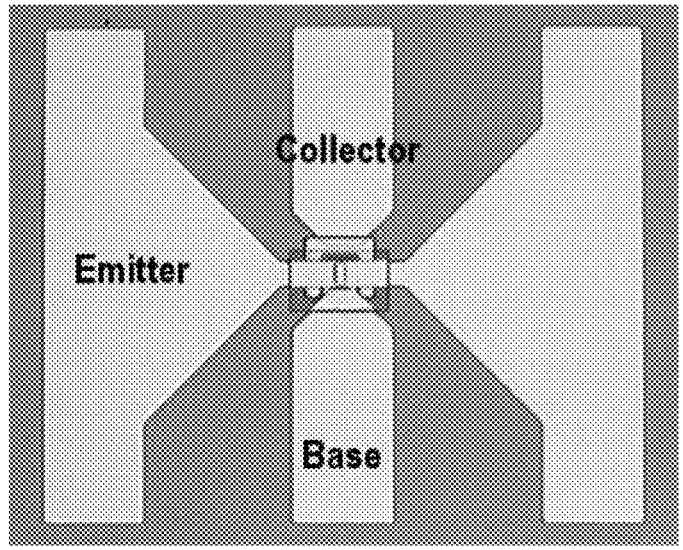
Figure 31:
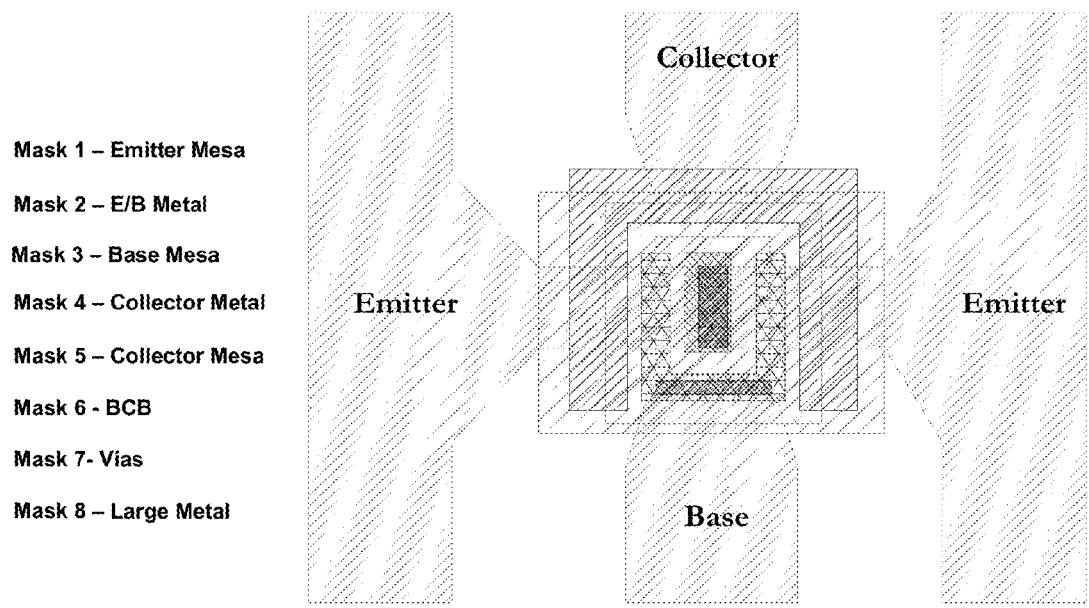

Most process steps for InP-based HBTs can be directly transposed from a GaAs HBT process. Applying these techniques to InAlAs/InP HBTs, using minor adjustments to the etchant (for the different materials) recipes. Once the oxide calibrations are completed, an InAlAs-oxide HBT can be developed. The devices can be fabricated using semiconductor process techniques. The process can begin by using photolithographic patterning and dry etching of $SiN_x$ followed by wet etching to define the mesas. A simple, low-cost photolithography approach can be used with a self-aligned base-mesa structure. FIG. 31 shows a design of a layout for a typical oxide-defined heterojunction bipolar transistor.

An example of an epitaxial layer structure is provided in FIG. 71. An example of a general process sequence for the structure is shown in FIG. 72.

Figure 32:
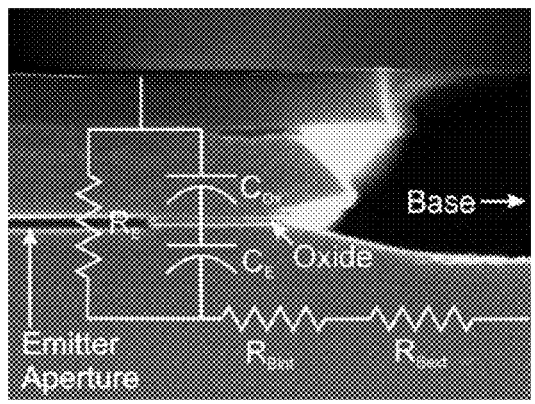
FIG. 32 illustrates an embodiment.

For submicron emitter widths, the emitter mesa should be etched with a dry etch to ensure minimal undercut. This processing can cause surface disordering and ion implant damage that adversely affects device performance and reliability. The reduction of the emitter width by means of an oxide aperture means the etching for the emitter mesa may be accomplished through wet etching techniques. Wet etching produces smoother surfaces than dry etch techniques. FIG. 32 shows a scanning electron microscope cross section of an oxide-defined HBT with possible capacitances and resistances shown.

Also consider measurement of emitter resistance for various emitter widths.

The emitter and base resistances can change after oxidation due to the geometry of the oxide aperture. The total resistance can reflect the resistances of the emitter and the base. Base resistance can be the extrinsic base resistance and the intrinsic base resistance. These refer to the area under the emitter aperture (intrinsic) and the exposed area to the base contact (extrinsic). By using a GaAsSb base, the resistance contribution from the base is minimized considerably. The capacitance can be ignored for DC measurements. If only the emitter resistance is considered in this case, can be obtained from Ohm's Law the following:

$$R_E = \frac{\rho l}{A_{ap}}$$

Figure 33:
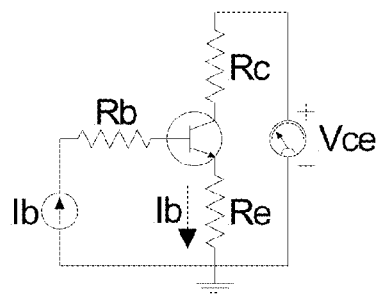
FIG. 33 illustrates an embodiment.

The emitter resistance, $R_E$ is inversely proportional to the aperture area, $A_{ap}$ The rest of the emitter area does not contribute to the current because of the oxide insulator. The emitter resistance can be determined from a floating collector voltage measurement. This can be performed for various emitter aperture widths and then compared with an unoxidized standard. FIG. 33 is an illustration of the circuit for this measurement.

Emitter resistance is an important quantity because it is a determining factor in the speed of a device. For an oxide-aperture HBT, the emitter resistance $R_E$ can increase as the size of the aperture decreases because of the current blocking provided by the oxide layer. This quantity can also be important when RF measurements are performed. Following is an equation for cut-off frequency, $f_T$ adjusted for a device with an oxide emitter aperture.

$$f_{T,x} = \frac{1}{2\pi}\left[\tau_{T,std} + \left(\frac{\eta V_T}{I_C} + \frac{R_B}{\beta_o} + R_E\right)C_{Ox}\right]^{-1}$$

One can see from the relationship that $R_E$ has a prominent influence on $f_T$. (where $T_{t,std}$ is the total transit delay time for a conventional HBT). As $R_E$ is increased (from smaller emitter apertures), $f_T$ decreases. The behavior of emitter resistance versus oxide aperture can be characterized and used to optimize the design of the RF devices.

FIGS. 70 and 70A. Epitaxial design for the oxide-aperture HBTs.

This design is a InP-based HBT structure having several noteworthy matters. The first is an InAlAs layer (Layer #8) that allows for reduction of the emitter dimension through lateral oxidation. This layer is sandwiched between two InAlGaAs graded layers (Layers #7 and #9). The graded layers serve to buffer the InAlAs from the InGaAs cap during oxidation. Another important difference is the use of a GaAsSb base. The type-II band offset of the InP/GaAsSb/InP helps reduce the base/collector barrier. Additionally, base electrons are actually launched into the collector with substantial kinetic energy. This not only can result in a preservation of current gain under conditions of high collector currents, but also can preserve high $f_t$ well into saturation. This can allow the device to be used very efficiently, with dynamic operation over the full range of currents and voltages accessible to the device. The ability to preserve $f_t$ over the full range of collector voltages and currents permits low distortion to be achieved without either the use of excess collector voltage or large input power back-offs.

Oxidation Calibrations

Figure 34:
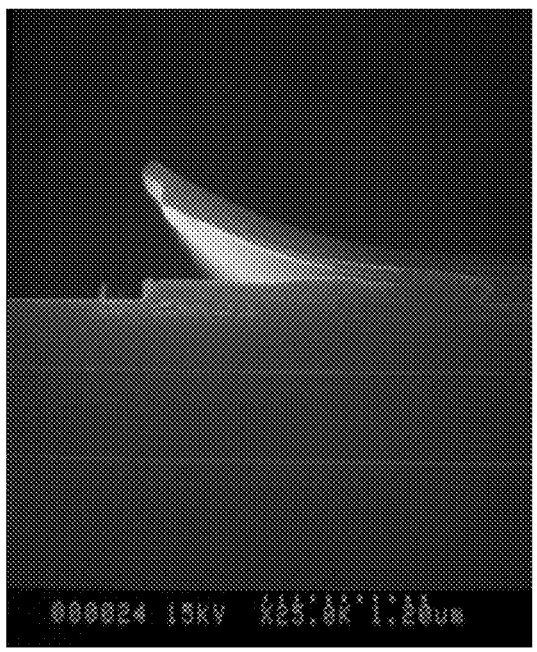
Figure 34:
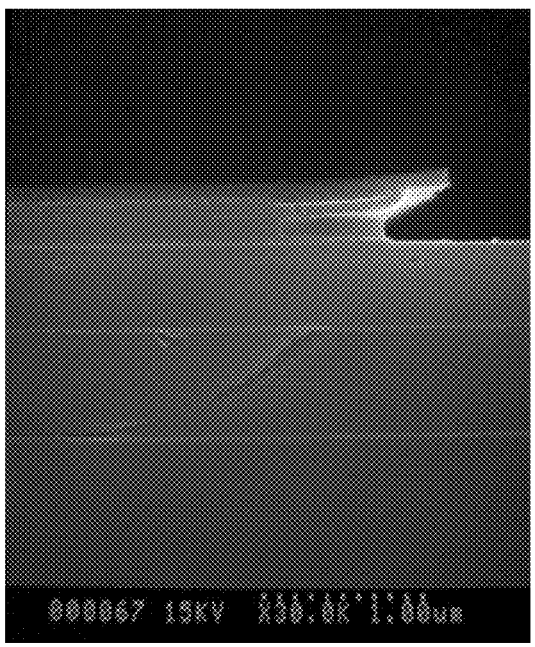

For a target emitter width of 2 μm, the oxide depth had to exceed 5000 Å. Initially, oxidation temperatures between 485° C. and 500° C. were attempted. Typically, greater lateral oxidation depths can be obtained with higher oxidation temperatures and times. For these oxidations, however, elevated temperatures either self terminated the oxidation at very shallow depths or caused delamination of the cap layer as the InAlGaAs graded layer was completely oxidized. Because of this, oxidations at even lower temperatures were attempted to find a balance between oxidation rate and graded-layer oxidation. FIG. 34 (a) shows what can occur when the oxidation is performed at too high a temperature; the InAlGaAs layer is oxidized along with the InAlAs layer, allowing the InGaAs cap to delaminate. FIG. 34 (b) illustrates the an oxidation performed at 450° C. that did not consume the graded layer and therefore did not suffer delamination. Other oxidation parameters can be explored: flow rate through the furnace and the addition of oxygen during the oxidation, etc.

Mask Design and Process Steps

RF scale devices were built into the mask set to obtain scaling rules from the oxide aperture. Device sizes used were from 2×3 μm² to 7×15 μm².

An illustratave process for the InP-based HBT is summarized below. The process uses eight mask steps including selective and non-selective wet etches, oxidation and BCB planarization.

Mask I—Emitter Mesa
1. Deposit 1200 Å of $SiN_x$.
2. Lithographically define emitter mesa.
3. Etch exposed $SiN_x$.
4. Wet etch exposed cap layer down to emitter.
5. Oxidize emitter aperture.

Mask II—Emitter/Base Metal
6. Etch down to Base material.
7. Pattern Mask II using reverse lithography.
8. Etch remaining $SiN_x$ over emitter.
9. Deposit Ti/Au over emitter and base.

Mask III—Base Mesa
10. Define Mask III using positive lithography.
11. Wet etch down to Sub-collector layer.

Mask IV—Sub-Collector Metal
12. Define Mask IV using reverse lithography.
13. Deposit AuGe/Ni/Au onto sub-collector.

Mask V—Isolation Mesa
14. Define mesa with positive photolithography.
15. Etch through Sub-collector for isolation from other devices.

Mask VI—BCB Mesa
16. Coat sample with Cyclotene dielectric (BCB). Perform hard cure at 250° C.
17. Pattern Mask V with positive photolithography.
18. Dry etch BCB using $CF_4/O_2$ gas mixture.
19. Remove photoresist.

Mask VII—BCB Vias
20. Define BCB vias over the Base and Emitter contacts using reverse lithography.
21. Dry etch exposed BCB.
22. Remove photoresist.

Mask VIII—Overlay Metals
23. Define overlay metal contacts using reverse lithography.
24. Deposit Ti/Au b e-beam evaporation.
25. Sinter contacts at 190° C., 60 sec.

Figure 35:
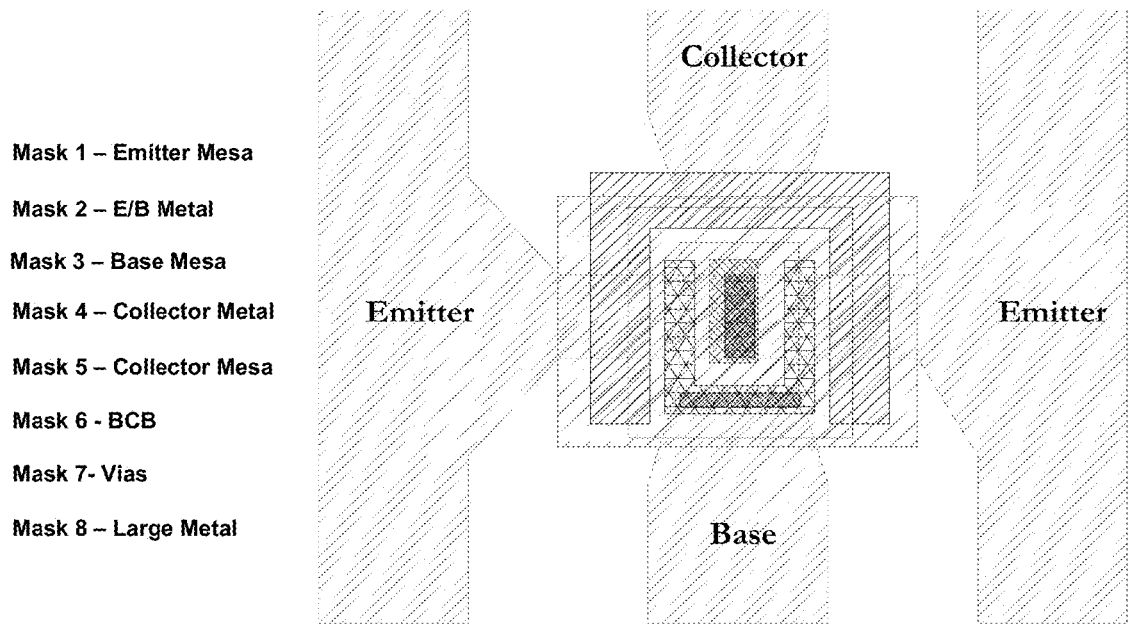
Figure 35:
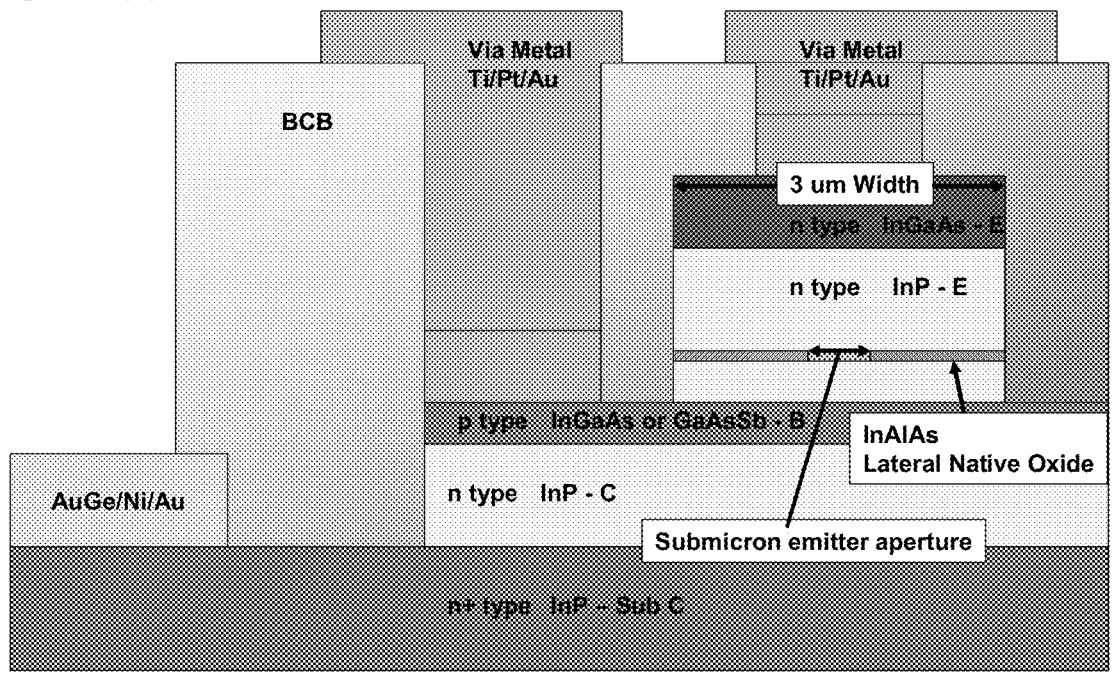

A diagram of the combined mask levels and a cross-section are shown in FIG. 35 below.

Wet Etch Calibration

The emitter-base-collector material choice of InP/GaAsSb/InP made the calibration of wet etches fairly simple. Typically, a dilute sulfuric peroxide solution, 1:8:80 $H_2SO_4$:$H_2O_2$:$H_2O$ is used for the etching of GaAs, InGaAs and InAlAs. These materials are in the first couple of layers immediately above the emitter. This layer, however, has InP which is resistant to 1:8:80 $H_2SO_4$. This makes a convenient etch stop for the oxidation step in the process. The InP layers can then be etched in a concentrated hydrochloric solution, 3:1 $HCl:H_2O$. The GaAsSb base is then etched with the 1:8:80 $H_2SO_4$ solution. This makes processing the devices very simple as every important target layer is preceded by a selective etch.

BCB Development

Spin-on dielectrics are useful where planarization of devices is utilized for metal overlay. For the HBTs, probing the emitter and base contacts directly would pose size constraints. An overlay metal contact is patterned over the emitter and is connected to a larger offset probing pad. Because of the device design, this would seem to short the emitter to the base. The solution is to coat the entire device with an insulating dielectric and etch via contacts to the device pads prior to overlay metal deposition. The spin on dielectric Cyclotene 3022-35 (BCB) can be used for this purpose to create a low-stress film when cured and etches isotropically with $CF_4$/$O_2$ plasma. Isotropic etching helps minimize metal contact breakage by creating smooth edges for gradual transitions for large step heights. The etch study data is shown in FIG. 36.

This BCB etch can be adapted for two different mask steps. For Mask VI, the photoresist can be patterned positively and the BCB is field-etched. This etch is different from that for Mask VII. Mask VII patterns emitter and base contact vias with reverse photolithography for the subsequent overlay metal. The vias are then etched as small trenches through the top of the BCB mesa.

Thermal Modeling

Software can be used to construct large, detailed 3-D models of the heat distribution in oxide HBTs and other devices. The software can be such as TAS (Thermal Analysis System) version 10.0, which is supplied by Ansys.

Modeling

Model Setup

Substrate sizes can illustrate transistors on a 300 µm thick substrate with edges less than 150 µm away from the edge of the transistor, the temperature in the transistor depending on the substrate width.

Transistor Structure

The transistor structure shown in FIG. 37 and FIG. 73 was used in all the simulations. In this case, the transistor dot has an emitter radius of 3 µm. The width of the oxide region is 1 µm, i.e., it extends from radius 2 µm to radius 3 µm. The radius of the base and collector are 5.5 µm, and the radius of the subcollector is 16.5 µm.

The structure can include four main sections. On top there is an emitter stack, which having the emitter, on top of which is the AlGaAs oxidation layer sandwiched between two graded regions. On the top of the emitter region there is heavily doped contact layer. Under the emitter is the base/collector section. The diameter of this section is wider than that of the emitter section to allow space for the deposition of metal contacts. Under the base/collector section is the subcollector section. Again, the diameter of this section is wider than that of the base/collector to allow space for the deposition of metal contacts. Underlying the subcollector is the substrate section which is 300 µm thick and which extends laterally at least 150 µm from the edge of the transistor.

If one were to assume that heat was generated in the emitter immediately under the unoxidized area of the InGaP layer. This is probably a reasonably good initial assumption; in practice more heat is generated towards exterior edge of the aperture defined by the oxide region because of current crowding. To model this more accurately, one can use a package that can simulate charge transfer. In this set of models the discussion herein used the bottom of the substrate as a heat sink at 25° C.

Thermal conductivities of the semiconductor materials were obtained from publicly available references. The thermal conductivity of the aluminum oxide material was estimated. The thermal conductivity is very likely much less than that of alumina because the material formed as a result of the oxidation process is much less dense than that of commercially available alumina. In the model discussed herein, a thermal conductivity of quartz was used.

Single Dot Modeling

The first round of simulations studied the temperature distribution in a single transistor dot of the type shown in FIG. 37. In this case, the emitter diameter was 2.5 µm and the oxide width was 0.5 µm. The heat load was chosen to increase the maximum temperature of the transistor approximately 150° C. above the temperature of the heat sink. In the structure depicted above, this corresponds to 0.1 W/µm$^{-3}$. At this stage, the model is linear, i.e., the temperature dependence of the semiconductors has not been included, so the simulated temperature increase can be directly proportional to the heat load.

Results of this simulation are shown in FIG. 38 and FIG. 39. FIG. 39 is a close up of the emitter section from which it can be seen that the maximum temperature is just above the heat source in the center of the emitter layer. Also evident from the FIG. 39 are abrupt changes in the temperature contours corresponding to large changes in thermal conductivity, e.g., at the bottom of the emitter and at the top of the oxide layer.

Dependence of Peak Transistor Temperature on Oxide Width

The next round of simulations compared the temperature distributions in single dots with different oxide widths. A dot with zero oxide corresponds to a conventional non-oxide transistor dot. Cross sections through a non-oxide transistor and an oxide transistor with a 1.5 µm wide oxide region are shown in FIG. 40.

A set of dots with oxide widths in the range 0 µm to 2 µm was modeled. In order to make a clear comparison between the results, the diameter of the unoxidized aperture was kept constant, as was the heat load. Summary results are shown in FIG. 41, from which it can be seen that the maximum temperature decreases with increasing oxide width. This is as expected because increasing the oxide width decreases the thermal resistance to the heat sink and reduces the emitter temperature. It is also evident that the curve of maximum temperature vs. oxide width levels off for oxide widths much greater than 1.5 µm. In other words, there is little thermal benefit in making the oxide any wider than 2 µm. The maximum temperature in the conventional dot is approximately 10° C. higher than the maximum temperature in the dot with 2 µm wide oxide. This temperature difference is smaller than that predicted by the initial 2D models but the difference is large enough to result in significantly better transistor performance and anticipated reliability.

Temperature Distribution Across the Emitter

With regard to the simulations discussed in the previous section, one can also obtain the temperature distribution across the emitter aperture defined by the oxide region. The temperature distribution is important because it can affect defect propagation and carrier mobility, hence device reliability and device speed. Estimating the temperature at the edge of the emitter aperture is particularly important because this is where the current density is expected to be highest.

Results are shown in FIG. 42. A dot with zero oxide width corresponds to a conventional non-oxide transistor dot. The uneven distribution of points arises from the fact that the model would only calculate temperatures at the nodes. From the Figure it is evident that there is a difference of approximately 35° C. between the temperatures at the center and edge of the emitter.

Temperature Distribution in a 1-D Array of Dots

As an intermediate step towards a model of a transistor, which will involve a 2-D array of dots, there can be modeled a 1-D array of dots. This can illustrate how the peak temperature of the dot depended on the distance to adjacent dots. The significance of this is that if the temperature difference between dots in a segmented emitter structure is too large, there is the possibility of current collapse in which a large fraction of the current passes through one dot, leading to failure of the transistor. Thus, consideration is given to the minimum spacing of dots to prevent current collapse. In this work one can simulate a 1×5 array of dots with varying spacing between adjacent dots.

The unit dot used in this simulation is shown in FIG. 43. The emitter section is 5.5 µm in diameter, i.e., a 2.5 µm diameter unoxidized region with a 1.5 µm wide oxide region. The diameter of the base/collector region is 9 µm, and the subcollector is a 10 µm×15 µm rectangle. These dimensions estimate of the dimensions that would be used in a real transistor.

The unit shown in FIG. 43 is used when simulating a 1×5 array of dots on 10 µm centers. When increasing the center to center spacing between dots, the resulting space is filled by substrate with a subcollector on top, i.e., the subcollector mesas of all the dots are contiguous, which would be the case in a real transistor. An example of an array of dots on 16 µm centers is shown in FIG. 44 and the resulting thermal simulation is shown in FIG. 45. It is clear from the latter figure that the temperatures of the central three dots are higher than those of the two dots on the edges of the array. Simulations of this type were performed for 1×5 arrays of dots with center-to-center spacings of 10 µm, 12 µm, 16 µm, and 20 µm. The same thermal power was used in each of the dots in the array as was used in the single dot simulations described above.

The temperatures in the emitter dots can be more accurately compared by determining and plotting the simulated temperature at corresponding points of each dot in the array. This was done for the edge of the emitter aperture and results are plotted in FIG. 46.

From FIG. 46 it can be seen that the maximum temperature of the center dot decreases as the center-to-center separation increases. This is as expected because of the reduced heating effect that each dot has on its neighbors as the separation increases. The temperature at the aperture edge of the central dot reduces from 127° C. for 10 µm center-to-center spacings to 115° C. for 20 µm center-to-center spacings. It can also be seen that the temperature variation across the array is reduced as the center-to-center separation increases: for 10 µm center-to-center spacings, the temperature variation between center and edge dots is 7° C., whereas for 20 µm center-to-center spacings, the corresponding difference is only 3.5° C.

Thermal Shunts

The round of simulations in progress as this report was written was to examine the effect on dot temperature distribution of a thermal shunt on top of emitters. The thermal shunt is a continuous gold strip that connects to the contact on top of all the emitter structures in the 1×5 array. The expected effect is to reduce the temperature difference between elements of the array. This part of the modeling has only just started, but preliminary results for a 1×5 array of dots with 10 µm center-to center spacing indicates that the shunt is working as expected.

3.2 Oxidation Calibrations

Initial oxidation studies were performed on a 35% AlGaAs calibration wafer, VW032. The structure included a 2000 Å thick 35% AlGaAs oxidation layer capped with a graded 35%-0% AlGaAs layer followed by a strained, lattice-relaxed InGaAs cap. A passivating layer of $SiN_x$ was deposited on the wafer and then patterned with stripes. FIG. 47 shows the SEM cross section of a typical oxidation.

FIG. 47 shows the oxidation consuming the lattice-relaxed InGaAs cap by 'running' along the $SiN_x$—InGaAs interface. In order to reduce this effect, the oxidation temperature was lowered for subsequent oxidations, as discussed below.

HBT Structure Oxidation Calibration

Oxidation calibrations were then performed on the HBT device structure (VW033). This wafer differs from VW032 in that the 35% AlGaAs layer is only 1000 Å. Reducing the thickness of a layer can reduce the rate of the lateral oxidation, suggestive of further calibrations. Using the data from VW032 as a starting point, oxidations were first performed at 510° C. and 520° C. FIG. 48 is an example of a typical spread oxidations performed at 510° C. While the oxidation of the HBT structure at elevated temperatures produced deep lateral oxides, it was observed that the InGaAs cap also appeared to be oxidizing, as seen in FIG. 49. The following factors were adjusted to reduce or eliminate this effect:

1. Oxidation temperature.
2. Oxidation time.
3. Bubbler flow.
4. Inclusion of a GaAs cap piece.

Lowering the oxidation temperature below 500° C., reducing the bubbler flow, and eliminating the GaAs cap piece, allow the oxidation of the AlGaAs layer to proceed without affecting the InGaAs cap, as seen in FIG. 49*b*. Further studies are being performed to determine the maximum achievable oxide depth for a given set of oxidation conditions.

Shown in FIG. 50 is one embodiment. A heterojunction bipolar transistor comprising a plurality of layers formed on a substrate (100) with an emitter (110) comprising one or more physically separate regions, with each region comprising one or more compound semiconductor layers (not shown), including at least one layer (111) comprising an aluminum-bearing binary or alloy with any combination of arsenic or phosphorus or nitrogen, with at least part of the aluminum-bearing layer or layers (111) converted to a current blocking oxide layer or layers (112), and an electrical contact (113); a base (120) comprising one or more physically separate regions adjacent to the emitter region or regions (110), with each base region (120) comprising one or more semiconductor layers (not shown), and an electrical contact (121); a collector (130) comprising one or more physically separate regions adjacent to the base region or regions (120) and in closer proximity to the substrate (100) than the emitter region or regions (120), with each collector region (130) comprising one or more semiconductor layers (not shown), and an electrical contact (131).

Shown in FIG. 51 is another embodiment. A heterojunction bipolar transistor comprising a plurality of layers formed on a substrate (200) with an emitter (210) comprising one or more physically separate regions, with each region comprising one (211) or more (212) compound semiconductor layers, including at least one layer (211) comprising an aluminum-bearing binary or alloy with any combination of arsenic or phosphorus or nitrogen, with at least part of the aluminum-bearing layer or layers (211) converted to a current blocking oxide layer or layers (213), and an electrical contact (214); a base (220) comprising one or more physically separate regions adjacent to the emitter region or regions (210), with each base region (220) comprising one or more semiconductor layers (not shown), and an electrical contact (221); a collector (230) comprising one or more physically separate regions adjacent to the base region or regions (220) and in closer proximity to the substrate (200) than the emitter region or regions (210), with each collector region (230) comprising one or more semiconductor layers (not shown), and an electrical contact (231). Further, the aluminum-bearing layer or layers (211) in the emitter (210) can be comprised of $(Al_xGa_{1-x})_yIn_{1-y}As$, or $(Al_xGa_{1-x})_yIn_{1-y}P$, or $(Al_xGa_{1-x})_yIn_{1-y}N$ with aluminum composition x between 0 and 1, and composition y between 0 and 1. Optional adjacent layers (212) comprising $(Al_{x'}Ga_{1-x'})_{y'}In_{1-y'}As$ or $(Al_{x'}Ga_{1-x'})_{y'}In_{1-y'}P$ or $(Al_{x'}Ga_{1-x'})_{y'}In_{1-y'}N$ and with $x'<x$ and $0 \leq y' \leq 1$ may have graded or stepped aluminum composition x'.

Shown in FIG. 52 is a third embodiment. A heterojunction bipolar transistor comprising a plurality of layers formed on a substrate (300) with an emitter (310) comprising one or more physically separate regions, with each region comprising one or more compound semiconductor layers (not shown), and an electrical contact (311); a base (320) comprising one or more physically separate regions adjacent to the emitter region or regions (310), with each base region (320) comprising one or more semiconductor layers including at least one layer (321) comprising an aluminum-bearing binary or alloy with any combination of arsenic or phosphorus or nitrogen, with at least part of the aluminum-bearing layer or layers (321) converted to a current blocking oxide layer or layers (322), and an electrical contact (323); a collector (330) comprising one or more physically separate regions adjacent to the base region or regions (320), with each collector region (330) comprising one or more semiconductor layers (not shown), and an electrical contact (331).

Shown in FIG. 53 is a fourth embodiment. A heterojunction bipolar transistor comprising a plurality of layers formed on a substrate (400) with an emitter (410) comprising one or more physically separate regions, with each region comprising one or more semiconductor layers (not shown), and an electrical contact (411); a base (420) comprising one or more physically separate regions adjacent to the emitter region or regions (410), with each base region (420) comprising one (421) or more (422) compound semiconductor layers, including at least one layer (421) comprising an aluminum-bearing binary or alloy with any combination of arsenic or phosphorus or nitrogen, with at least part of the aluminum-bearing layer or layers (421) converted to a current blocking oxide layer or layers (423), and an electrical contact (424); a collector (430) comprising one or more physically separate regions adjacent to the base region or regions (420), with each collector region (430) comprising one or more semiconductor layers (not shown), and an electrical contact (431). Further, the aluminum-bearing layer or layers (421) in the base (420) can be comprised of (AlxGa1−x)yIn1−yAs, or (AlxGa1−x)yIn1−yP or (AlxGa1−x)yIn1−yN with aluminum composition x between 0 and 1, and composition y between 0 and 1. Optional adjacent layers (422) comprising (Alx'Ga1−x')y'In1−y'As or (Alx'Ga1−x')y'In1−y'P or (Alx'Ga1−x')y'In1−y'N and with x'<x and 0≤y'≤1 may have graded or stepped aluminum composition x'.

Shown in FIG. 54 is a fifth embodiment. A heterojunction bipolar transistor comprising a plurality of layers formed on a substrate (500) with an emitter (510) comprising one or more physically separate regions, with each region comprising one or more semiconductor layers (not shown), and an electrical contact (511); a base (520) comprising one or more physically separate regions adjacent to the emitter region or regions (510), with each base region (520) comprising one or more semiconductor layers (not shown), and an electrical contact (521); a collector (530) comprising one or more physically separate regions adjacent to the base region or regions (520), with each collector region (530) comprising one or more compound semiconductor layers, including at least one layer (531) comprising an aluminum-bearing binary or alloy with any combination of arsenic or phosphorus or nitrogen, with at least part of the aluminum-bearing layer or layers (531) converted to a current blocking oxide layer or layers (532), and an electrical contact (533).

Shown in FIG. 55 is a sixth embodiment. A heterojunction bipolar transistor comprising a plurality of layers formed on a substrate (600) with an emitter (610) comprising one or more physically separate regions, with each region comprising one or more semiconductor layers (not shown), and an electrical contact (611); a base (620) comprising one or more physically separate regions adjacent to the emitter region or regions (610), with each base region (620) comprising one or more semiconductor layers (not shown), and an electrical contact (621); a collector (630) comprising one or more physically separate regions adjacent to the base region or regions (620), with each collector region (630) comprising one (631) or more (632) compound semiconductor layers, including at least one layer (631) comprising an aluminum-bearing binary or alloy with any combination of arsenic or phosphorus or nitrogen, with at least part of the aluminum-bearing layer or layers (631) converted to a current blocking oxide layer or layers (633), and an electrical contact (634). Further, the aluminum-bearing layer or layers (631) in the collector (630) can be comprised of (AlxGa1−x)yIn1−yAs, or (AlxGa1−x)yIn1−yP, or (AlxGa1−x)yIn1−yN with aluminum composition x between 0 and 1, and composition y between 0 and 1. Optional adjacent layers (632) comprising (Alx'Ga1−x')y'In1−y'As or (Alx'Ga1−x')y'In1−y'P or (Alx'Ga1−x')y'In1−y'N and with x'<x and 0≤y'≤1 may have graded or stepped aluminum composition x'.

Shown in FIG. 56 is a seventh embodiment. A heterojunction bipolar transistor comprising a plurality of layers formed on a substrate (700) with an emitter (710) comprising one or more physically separate regions, with each region comprising one or more compound semiconductor layers, including at least one layer (711) comprising an aluminum-bearing binary or alloy with any combination of arsenic or phosphorus or nitrogen, with at least part of the aluminum-bearing layer or layers (711) converted to a current blocking oxide layer or layers (712), and an electrical contact (713); a base (720) comprising one or more physically separate regions adjacent to the emitter region or regions (710), with each base region (720) comprising one or more semiconductor layers (not shown), and an electrical contact (721); a collector (730) comprising one or more physically separate regions adjacent to the base region or regions (720), with each collector region (730) comprising one or more compound semiconductor layers, including at least one layer (731) comprising an aluminum-bearing binary or alloy with any combination of arsenic or phosphorus or nitrogen, with at least part of the aluminum-bearing layer or layers (731) converted to a current blocking oxide layer or layers (732), and an electrical contact (733).

Shown in FIG. 57 is an eight embodiment. A heterojunction bipolar transistor comprising a plurality of layers formed on a substrate (800) with an emitter (810) comprising one or more physically separate regions, with each region comprising one (811) or more (812) compound semiconductor layers, including at least one layer (811) comprising an aluminum-bearing binary or alloy with any combination or arsenic or phosphorus or nitrogen, with at least part of the aluminum-bearing layer or layers (811) converted to a current blocking oxide layer or layers (813), and an electrical contact (814); a base (820) comprising one or more physically separate regions adjacent to the emitter region or regions (810), with each base region (820) comprising one or more semiconductor layers (not shown), and an electrical contact (821); a collector (830) comprising one or more physically separate regions adjacent to the base region or regions (820), with each collector region (830) comprising one (831) or more (832) compound semiconductor layers, including at least one layer (831) comprising an aluminum-bearing binary or alloy with any combination of arsenic or phosphorus or nitrogen, with at least part of the aluminum-bearing layer or layers (831) converted to a current blocking oxide layer or layers (833), and an electrical contact (834). Further, the aluminum-bearing layer or layers (811) in the emitter (810) and the aluminum-bearing layer or layers (831) in the collector (830) can be comprised of (AlxGa1−x)yIn1−yAs, or (AlxGa1−x)yIn1−yP, or (AlxGa1−x)yIn1−yN with aluminum composition x between 0 and 1, and composition y between 0 and 1. Optional adjacent layers (812) and (832) comprising (Alx'Ga1−x')y'In1−y'As or (Alx'Ga1−x')y'In1−y'P or (Alx'Ga1−x')y'In1−y'N and with x'<x and 0≤y'≤1 may have graded or stepped aluminum composition x'.

Shown in FIG. 58 is a ninth embodiment. A heterojunction bipolar transistor comprising a plurality of layers formed on a substrate (900) with an emitter (910) comprising one or more physically separate regions, with each region comprising one or more compound semiconductor layers (not shown), including at least one layer (911) comprising an aluminum-bearing binary or alloy with any combination of arsenic or phosphorus or nitrogen, with at least part of the aluminum-bearing layer or layers (911) converted to a current blocking oxide layer or layers (912), and an electrical contact (913); a base (920) comprising one or more physically separate regions adjacent to the emitter region or regions (910), with each base region (920) comprising one or more semiconductor layers including at least one layer (921) comprising an aluminum-bearing binary or alloy with any combination of arsenic or phosphorus or nitrogen, with at least part of the aluminum-bearing layer or layers (921) converted to a current blocking oxide layer or layers (922), and an electrical contact (923); a collector (930) comprising one or more physically separate regions adjacent to the base region or regions (920), with each collector region (930) comprising one or more semiconductor layers (not shown), and an electrical contact (931).

Shown in FIG. 59 is a tenth embodiment. A heterojunction bipolar transistor comprising a plurality of layers formed on a substrate (1000) with an emitter (1010) comprising one or more physically separate regions, with each region comprising one (1011) or more (1012) compound semiconductor layers, including at least one layer (1011) comprising an aluminum-bearing binary or alloy with any combination of arsenic or phosphorus or nitrogen, with at least part of the aluminum-bearing layer or layers (1011) converted to a current blocking oxide layer or layers (1013), and an electrical contact (1014); a base (1020) comprising one or more physically separate regions adjacent to the emitter region or regions (1010), with each base region (1020) comprising one (1021) or more (1022) semiconductor layers including at least one layer (1021) comprising an aluminum-bearing binary or alloy with any combination of arsenic or phosphorus or nitrogen, with at least part of the aluminum-bearing layer or layers (1021) converted to a current blocking oxide layer or layers (1023), and an electrical contact (1024); a collector (1030) comprising one or more physically separate regions adjacent to the base region or regions (1020), with each collector region (1030) comprising one or more semiconductor layers (not shown), and an electrical contact (1031). Further, the aluminum-bearing layer or layers (1011) in the emitter (1010) and the aluminum-bearing layer or layers (1031) in the base (1030) can be comprised of (AlxGa1−x)yIn1−yAs, or (AlxGa1−x)yIn1−yP, or (AlxGa1−x)yIn1−yN with aluminum composition x between 0 and 1, and composition y between 0 and 1. Optional adjacent layers (1022) and (1012) comprising (Alx'Ga1−x')y'In1−y'As or (Alx'Ga1−x')y'In1−y'P or (Alx'Ga1−x')y'In1−y'N and with x'<x and 0≤y'≤1 may have graded or stepped aluminum composition x'.

Shown in FIG. 60 is an eleventh embodiment. A heterojunction bipolar transistor comprising a plurality of layers formed on a substrate (1100) with an emitter (1110) comprising one or more physically separate regions, with each region comprising one or more compound semiconductor layers (not shown), and an electrical contact (1111); a base (1120) comprising one or more physically separate regions adjacent to the emitter region or regions (1110), with each base region (1120) comprising one or more semiconductor layers including at least one layer (1121) comprising an aluminum-bearing binary or alloy with any combination of arsenic or phosphorus or nitrogen, with at least part of the aluminum-bearing layer or layers (1121) converted to a current blocking oxide layer or layers (1122), and an electrical contact (1123); a collector (1130) comprising one or more physically separate regions adjacent to the base region or regions (1120), with each collector region (1130) comprising one or more compound semiconductor layers, including at least one layer (1131) comprising an aluminum-bearing binary or alloy with any combination of arsenic or phosphorus or nitrogen, with at least part of the aluminum-bearing layer or layers (1131) converted to a current blocking oxide layer or layers (1132), and an electrical contact (1133).

Shown in FIG. 61 is a twelfth embodiment. A heterojunction bipolar transistor comprising a plurality of layers formed on a substrate (1200) with an emitter (1210) comprising one or more physically separate regions, with each region comprising one or more compound semiconductor layers (not shown), and an electrical contact (1211); a base (1220) comprising one or more physically separate regions adjacent to the emitter region or regions (1210), with each base region (1220) comprising one (1221) or more (1222) semiconductor layers including at least one layer (1221) comprising an aluminum-bearing binary or alloy with any combination of arsenic or phosphorus or nitrogen, with at least part of the aluminum-bearing layer or layers (1221) converted to a current blocking oxide layer or layers (1223), and an electrical contact (1224); a collector (1230) comprising one or more physically separate regions adjacent to the base region or regions (1220), with each collector region (1230) comprising one (1231) or more (1232) compound semiconductor layers, including at least one layer (1231) comprising an aluminum-bearing binary or alloy with any combination of arsenic or phosphorus or nitrogen, with at least part of the aluminum-bearing layer or layers (1231) converted to a current blocking oxide layer or layers (1233), and an electrical contact (1234). Further, the aluminum-bearing layer or layers (1221) in the base (1220) and the aluminum-bearing layer or layers (1231) in the collector (1230) can be comprised of (AlxGa1−x)yIn1−yAs, or (AlxGa1−x)yIn1−yP, or (AlxGa1−x)yIn1−yN with aluminum composition x between 0 and 1, and composition y between 0 and 1. Optional adjacent layers (1222) and (1232) comprising (Alx'Ga1−x')y'In1−y'As or (Alx'Ga1−x')y'In1−y'P or (Alx'Ga1−x')y'In1−y'N and with x'<x and 0≤y'≤1 may have graded or stepped aluminum composition x'.

Shown in FIG. 62 is another embodiment. A heterojunction bipolar transistor comprising a plurality of layers formed on a GaAs substrate (1300) with an emitter (1310) comprising one or more physically separate regions, with each region comprising a layer (1311) of InGaP, typically 500 Å thick, followed by a layer (1312) of InAlGaP, typically 100 Å-500 Å thick, followed by a layer (1313) comprising either AlGaAs or AlInP, typically 500 Å-1000 Å thick, followed by a layer (1314) of InAlGaP, typically 100 Å-500 Å thick, with aluminum compositions of layers (1311), (1312), (1313), and (1314) chosen so that the strain-thickness combination is below the level of lattice relaxation, with at least part of layer (1313) converted to a current blocking oxide layer (1315), and an electrical contact (1316); a base (1320) comprising one or more physically separate regions adjacent to the emitter region or regions (1310), with each base region (1320) comprising one or more semiconductor layers (not shown), and an electrical contact (1321); a collector (1330) comprising one or more physically separate regions adjacent to the base region or regions (1320) and in closer proximity to the substrate (1300) than the emitter region or regions (1310), with each collector region (1330) comprising a lightly doped layer n<~1×1017 cm-3 semiconductor layer (1331), a heavily doped n≥~5×1018 cm-3 subcollector semiconductor layer (1332), and an electrical contact (1333).

Shown in FIG. 63 is yet another embodiment. A heterojunction bipolar transistor comprising a plurality of layers formed on a GaAs substrate (1400) with an emitter (1410) comprising one or more physically separate regions, with each region comprising one or more semiconductor layers (not shown), and an electrical contact (1411); a base (1420) comprising one or more physically separate regions adjacent to the emitter region or regions (1410), with each base region (1420) comprising one or more physically separate regions, with each region comprising a layer (1421) of GaAs, typically 500 Å thick, followed by a layer (1424) of InAlGaP, typically 100 Å-500 Å thick, followed by a layer (1423) comprising either AlGaAs or AlInP, typically 500 Å-1000 Å thick, followed by a layer (14224) of InAlGaP, typically 100 Å-500 Å thick, with aluminum compositions of layers (1421), (1422), (1423), and (1424) chosen so that the strain-thickness combination is below the level of lattice relaxation, with at least part of layer (1423) converted to a current blocking oxide layer (1425), and an electrical contact (1426); a collector (1430) comprising one or more physically separate regions adjacent to the base region or regions (1420), with each collector region (1430) comprising a lightly doped layer n<~1×1017 cm-3 semiconductor layer (1431), a heavily doped n≥~5×1018 cm-3 subcollector (1432), and an electrical contact (1433).

Shown in FIG. 64 is yet another embodiment. A heterojunction bipolar transistor comprising a plurality of layers formed on a substrate (1500) with an emitter (1510) comprising one or more physically separate regions, with each region comprising one or more semiconductor layers (not shown), and an electrical contact (1511); a base (1520) comprising one or more physically separate regions adjacent to the emitter region or regions (1510), with each base region (1520) comprising one or more semiconductor layers (not shown), and an electrical contact (1521); a collector (1530) comprising one or more physically separate regions, with each region comprising a lightly doped n<~1×1017 cm-3 semiconductor layer (1531), and a heavily doped n≥~5×1018 cm-3 subcollector (1532) comprising a layer (1533) of GaAs, typically 500 Å thick, followed by a layer (1534) of InAlGaP, typically 100 Å-500 Å thick, followed by a layer (1535) comprising either AlGaAs or AlInP, typically 500 Å-1000 Å thick, followed by a layer (1536) of InAlGaP, typically 100 Å-500 Å thick, with aluminum compositions of layers (1533), (1534), (1535), and (1536) chosen so that the strain-thickness combination is below the level of lattice relaxation, with at least part of layer (1535) converted to a current blocking oxide layer (1537), and an electrical contact (1538).

Shown in FIG. 65 is yet another embodiment. A heterojunction bipolar transistor comprising a plurality of layers formed on a GaAs substrate (1600) with an emitter (1610) comprising one or more physically separate regions, with each region comprising a layer (1611) of InGaP, typically 500 Å thick, followed by a layer (1612) of InAlGaP, typically 100 Å-500 Å thick, followed by a layer (1613) comprising either AlGaAs or AlInP, typically 500 Å-1000 Å thick, followed by a layer (1614) of InAlGaP, typically 100 Å-500 Å thick, with aluminum compositions of layers (1611), (1612), (1613), and (1614) chosen so that the strain-thickness combination is below the level of lattice relaxation, with at least part of layer (1613) converted to a current blocking oxide layer (1615), and an electrical contact (1616); a base (1620) comprising one or more physically separate regions adjacent to the emitter region or regions (1610), with each base region (1620) comprising one or more semiconductor layers (not shown), and an electrical contact (1621); a collector (1630) comprising one or more physically separate regions, with each region comprising a lightly doped n<~1×1017 cm-3 semiconductor layer (1631), and a heavily doped n≥~5×1018 cm-3 subcollector (1632) comprising a layer (1633) of GaAs, typically 500 Å thick, followed by a layer (1634) of InAlGaP, typically 100 Å-500 Å thick, followed by a layer (1635) comprising either AlGaAs or AlInP, typically 500 Å-1000 Å thick, followed by a layer (1636) of InAlGaP, typically 100 Å-500 Å thick, with aluminum compositions of layers (1633), (1634), (1635), and (1636) chosen so that the strain-thickness combination is below the level of lattice relaxation, with at least part of layer (1635) converted to a current blocking oxide layer (1637), and an electrical contact (1638).

Shown in FIG. 66 is yet another embodiment. A heterojunction bipolar transistor comprising a plurality of layers formed on a GaAs substrate (1700) with an emitter (1710) comprising one or more physically separate regions, with each region comprising a layer (1711) of InGaP, typically 500 Å thick, followed by a layer (1712) of InAlGaP, typically 100 Å-500 Å thick, followed by a layer (1713) comprising either AlGaAs or AlInP, typically 500 Å-1000 Å thick, followed by a layer (1714) of InAlGaP, typically 100 Å-500 Å thick, with aluminum compositions of layers (1711), (1712), (1713), and (1714) chosen so that the strain-thickness combination is below the level of lattice relaxation, with at least part of layer (1713) converted to a current blocking oxide layer (1715), and an electrical contact (1716); a base (1720) comprising one or more physically separate regions, with each region comprising a layer (1721) of GaAs, typically 500 Å thick, followed by a layer (1722) of InAlGaP, typically 100 Å-500 Å thick, followed by a layer (1723) comprising either AlGaAs or AlInP, typically 500 Å-1000 Å thick, followed by a layer (1724) of InAlGaP, typically 100 Å-500 Å thick, with aluminum compositions of layers (1721), (1722), (1723), and (1724) chosen so that the strain-thickness combination is below the level of lattice relaxation, and a layer of GaAs (1727) heavily p-doped, with at least part of layer (1723) converted to a current blocking oxide layer (1725), and an electrical contact (1726); a collector (1730) comprising one or more physically separate regions adjacent to the base region or regions (1720), with each collector region (1730) comprising a lightly doped layer n<~1×1017 cm-3 semiconductor layer (1731), a heavily doped n≥~5×1018 cm-3 subcollector (1732), and an electrical contact (1733).

Shown in FIG. 67 is yet another embodiment. A heterojunction bipolar transistor comprising a plurality of layers formed on a GaAs substrate (1800) with an emitter (1810) comprising one or more physically separate regions, with each region comprising one or more semiconductor layers (not shown), and an electrical contact (1811); a base (1820) comprising one or more physically separate regions, with each region comprising a layer (1821) of GaAs, typically 500 Å thick, followed by a layer (1822) of InAlGaP, typically 100 Å-500 Å thick, followed by a layer (1823) comprising either AlGaAs or AlInP, typically 500 Å-1000 Å thick, followed by a layer (1824) of InAlGaP, typically 100 Å-500 Å thick, with aluminum compositions of layers (1821), (1822), (1823), and (1824) chosen so that the strain-thickness combination is below the level of lattice relaxation, with at least part of layer (1823) converted to a current blocking oxide layer (1825), a layer of GaAs (1827) heavily doped, and an electrical contact (1826); a collector (1830) comprising one or more physically separate regions, with each region comprising a lightly doped n<~1×1017 cm-3 semiconductor layer (1831), and a heavily doped n≥~5×1018 cm-3 subcollector (1832) comprising a layer (1833) of GaAs, typically 500 Å thick, followed by a layer (1834) of InAlGaP, typically 100 Å-500 Å thick, followed by a layer (1835) comprising either AlGaAs or AlInP, typically 500 Å-1000 Å thick, followed by a layer (1836) of InAlGaP, typically 100 Å-500 Å thick, with aluminum compositions of layers (1833), (1834), (1835), and (1836) chosen so that the strain-thickness combination is below the level of lattice relaxation, with at least part of layer (1835) converted to a current blocking oxide layer (1837), and an electrical contact (1838).

Shown in FIG. 74 is yet another embodiment. A heterojunction bipolar transistor comprising a plurality of layers formed on a substrate (1900) with an emitter (1910) comprising one or more physically separate regions, with each region comprising one (1911) or more (1912) compound semiconductor layers, including at least one layer (1911) comprising an aluminum-bearing binary or alloy with any combination or arsenic or phosphorus or nitrogen, with at least part of the aluminum-bearing layer or layers (1911) converted to a current blocking oxide layer or layers (1913), and an electrical contact (1914); a base (1920) comprising one or more physically separate regions adjacent to the emitter region or regions (1910), with each base region (1920) comprising one (1920) or more (1922) compound semiconductor layers, including at least one layer (1924) comprising an aluminum-bearing binary or alloy with any combination of arsenic or phosphorus or nitrogen, with at least part of the aluminum-bearing layer or layers (1924 and 1922) converted to a current blocking oxide layer or layers (1923), and an electrical contact (1921); a collector (1930) comprising one or more physically separate regions adjacent to the base region or regions (1920), with each collector region (1930) comprising one (1931) or more (1932) compound semiconductor layers, including at least one layer (1931) comprising an aluminum-bearing binary or alloy with any combination of arsenic or phosphorus or nitrogen, with at least part of the aluminum-bearing layer or layers (1931) converted to a current blocking oxide layer or layers (1933), and an electrical contact (1934). Further, the aluminum-bearing layer or layers (1911) in the emitter (1910) and the aluminum-bearing layer or layers (1931) in the collector (1930) can be comprised of $(Al_xGa_{1-x})_yIn_{1-y}As$, or $(Al_xGa_{1-x})_yIn_{1-y}P$, or $(Al_xGa_{1-x})_yIn_{1-y}N$ with aluminum composition x between 0 and 1, and composition y between 0 and 1. Optional adjacent layers (1912), (1932) and (1922) comprising $(Al_{x'}Ga_{1-x'})_{y'}In_{1-y'}As$ or $(Al_{x'}Ga_{1-x'})_{y'}In_{1-y'}P$ or $(Al_{x'}Ga_{1-x'})_{y'}In_{1-y'}N$ and with $x'<x$ and $0 \leq y' \leq 1$ may have graded or stepped aluminum composition $x'$.

Shown in FIG. 75 is an eight embodiment. A heterojunction bipolar transistor comprising a plurality of layers formed on a substrate (2000) with an collector (2010) comprising one or more physically separate regions, with each region comprising one (2011) or more (2012) compound semiconductor layers, including at least one layer (2011) comprising an aluminum-bearing binary or alloy with any combination or arsenic or phosphorus or nitrogen, with at least part of the aluminum-bearing layer or layers (2011) converted to a current blocking oxide layer or layers (2013), and an electrical contact (2014); a base (2020) comprising one or more physically separate regions adjacent to the collector region or regions (2010), with each base region (2020) comprising one or more semiconductor layers (not shown), and an electrical contact (2021); an emitter (2030) comprising one or more physically separate regions adjacent to the base region or regions (2020), with each emitter region (2030) comprising one (2031) or more (2032) compound semiconductor layers, including at least one layer (2031) comprising an aluminum-bearing binary or alloy with any combination of arsenic or phosphorus or nitrogen, with at least part of the aluminum-bearing layer or layers (2031) converted to a current blocking oxide layer or layers (2033), and an electrical contact (2034). Further, the aluminum-bearing layer or layers (2011) in the collector (2010) and the aluminum-bearing layer or layers (2011) in the emitter (2010) can be comprised of $(Al_xGa_{1-x})_yIn_{1-y}As$, or $(Al_xGa_{1-x})_yIn_{1-y}P$, or $(Al_xGa_{1-x})_yIn_{1-y}N$ with aluminum composition x between 0 and 1, and composition y between 0 and 1. Optional adjacent layers (2012) and (2032) comprising $(Al_{x'}Ga_{1-x'})_{y'}In_{1-y'}As$ or $(Al_{x'}Ga_{1-x'})_{y'}In_{1-y'}P$ or $(Al_{x'}Ga_{1-x'})_{y'}In_{1-y'}N$ and with $x'<x$ and $0 \leq y' \leq 1$ may have graded or stepped aluminum composition $x'$.

Note that the foregoing is a prophetic teaching and although only a few exemplary embodiments have been described in detail herein, those skilled in the art will readily appreciate from this teaching that many modifications are possible, based on exemplary embodiments and without materially departing from the novel teachings and advantages herein. Accordingly, all such modifications are intended to be included within the scope of the defined claims. In the claims or disclosure, means-plus-function (if and when used) is intended to cover structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment fastening wooden parts, a nail and a screw may be equivalent structures.

What is claimed:

1. A method of using a heterojunction bipolar transistor, the method comprising:
   using a heterojunction bipolar transistor having an emitter, base, and collector with at least one current blocking native oxide layer or layers disposed within or between a layer or layers of at least the emitter, the base, or the collector, the native oxide blocking layer or layers comprising a native oxide of a compound which includes aluminum, arsenic (As) or phosphorous (P), and nitrogen (N); and
   providing power to the heterojunction bipolar transistor to provide in operational circuitry within an RF communications system, radar system, amplifier, or wireless device or system, wherein the native oxide blocking layer or layers comprises $(Al_xGa_{1-x})_yIn_{1-y}P$ with aluminum composition x between 0 and 1, and composition y between 0 and 1, with optional adjacent layers of $(Al_{x'}Ga_{1x'})_yIn_{1-y'}P$ with $x'<x$ and $0 \leq y' \leq 1$.

2. The method of claim 1, wherein the heterojunction bipolar transistor is mounted on a circuit board, and the providing power to the heterojunction bipolar transistor comprises providing power to the heterojunction bipolar transistor on the circuit board of the operational circuitry.

3. The method of claim 1, wherein the heterojunction bipolar transistor is in an integrated circuit, and the providing power to the heterojunction bipolar transistor comprises providing power to the heterojunction bipolar transistor in the integrated circuit of the operational circuitry.

4. The method of claim 1, wherein the heterojunction bipolar transistor is mounted on a circuit board, and the providing power to the heterojunction bipolar transistor comprises providing power to the heterojunction bipolar transistor on the circuit board of the operational circuitry in the RF communications system.

5. The method of claim 1, wherein the heterojunction bipolar transistor is in an integrated circuit, and the providing power to the heterojunction bipolar transistor comprises providing power to the heterojunction bipolar transistor in the integrated circuit of the operational circuitry in the RF communications system.

6. The method of claim 1, wherein the heterojunction bipolar transistor is mounted on a circuit board, and the providing power to the heterojunction bipolar transistor comprises providing power to the heterojunction bipolar transistor on the circuit board of the operational circuitry in the RF radar system.

7. The method of claim 1, wherein the heterojunction bipolar transistor is in an integrated circuit, and the providing power to the heterojunction bipolar transistor comprises providing power to the heterojunction bipolar transistor in the integrated circuit of the operational circuitry in the RF radar system.

8. The method of claim 1, wherein the heterojunction bipolar transistor is mounted on a circuit board, and the providing power to the heterojunction bipolar transistor comprises providing power to the heterojunction bipolar transistor on the circuit board of the operational circuitry in the RF amplifier.

9. The method of claim 1, wherein the heterojunction bipolar transistor is in an integrated circuit, and the providing power to the heterojunction bipolar transistor comprises providing power to the heterojunction bipolar transistor in the integrated circuit of the operational circuitry in the RF amplifier.

10. The method of claim 1, wherein the heterojunction bipolar transistor is mounted on a circuit board, and the providing power to the heterojunction bipolar transistor comprises providing power to the heterojunction bipolar transistor on the circuit board of the operational circuitry in the RF wireless device or system.

11. The method of claim 1, wherein the heterojunction bipolar transistor is in an integrated circuit, and the providing power to the heterojunction bipolar transistor comprises providing power to the heterojunction bipolar transistor in the integrated circuit of the operational circuitry in the RF wireless device or system.

* * * * *